United States Patent
Jo et al.

(10) Patent No.: US 12,075,572 B2
(45) Date of Patent: Aug. 27, 2024

(54) DISPLAY DEVICE

(71) Applicant: LG ELECTRONICS INC., Seoul (KR)

(72) Inventors: Nayoung Jo, Seoul (KR); Hanseok Hwangbo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 203 days.

(21) Appl. No.: 17/764,958

(22) PCT Filed: Sep. 30, 2019

(86) PCT No.: PCT/KR2019/012777
§ 371 (c)(1),
(2) Date: Mar. 29, 2022

(87) PCT Pub. No.: WO2021/066213
PCT Pub. Date: Apr. 8, 2021

(65) Prior Publication Data
US 2022/0369477 A1 Nov. 17, 2022

(51) Int. Cl.
*H05K 5/02* (2006.01)
*H05K 5/00* (2006.01)
*H05K 7/14* (2006.01)

(52) U.S. Cl.
CPC ......... *H05K 5/0018* (2022.08); *H05K 5/0217* (2013.01); *H05K 7/1427* (2013.01)

(58) Field of Classification Search
CPC .. H05K 5/0017; H05K 5/0018; H05K 5/0217; H05K 7/1427

(Continued)

(56) References Cited

U.S. PATENT DOCUMENTS

| 10,410,549 B1 | 9/2019 | Kim et al. |
| 2018/0074545 A1 | 3/2018 | McBroom |

(Continued)

FOREIGN PATENT DOCUMENTS

| KR | 1020050099415 | 10/2005 |
| KR | 1020180027318 | 3/2018 |

(Continued)

OTHER PUBLICATIONS

PCT International Application No. PCT/KR2019/012777, International Search Report dated Jun. 30, 2020, 4 pages.

(Continued)

*Primary Examiner* — Hung S. Bui
(74) *Attorney, Agent, or Firm* — LEE, HONG, DEGERMAN, KANG & WAIMEY

(57) ABSTRACT

A display device according to an embodiment of the present invention comprises: a housing; a roller installed inside the housing; a display unit wound around the roller; a link having a first arm rotatably mounted to the display unit and a second arm rotatably connected to the first arm and rotatably mounted to the housing; a lead screw installed inside the housing; a slider that moves over the lead screw according to the rotation of the lead screw; a rod having one side connected to the slider and the other side connected to the second arm; an upper bar coupled to the upper side of the display unit; a first lock magnet located below the upper bar; and a second lock magnet corresponding to the first lock magnet and located above the bottom surface of the housing.

14 Claims, 75 Drawing Sheets

(58) Field of Classification Search
USPC .......................................................... 361/752
See application file for complete search history.

(56) References Cited

U.S. PATENT DOCUMENTS

| | | | |
|---|---|---|---|
| 2018/0160554 A1* | 6/2018 | Kang | H05K 5/0017 |
| 2019/0098774 A1* | 3/2019 | Park | G09F 9/301 |
| 2019/0150300 A1* | 5/2019 | Kim | H05K 5/0217 |
| | | | 361/807 |
| 2020/0035133 A1* | 1/2020 | Pyo | F16M 13/02 |

FOREIGN PATENT DOCUMENTS

| | | |
|---|---|---|
| KR | 1020180047758 | 5/2018 |
| KR | 101891096 | 8/2018 |
| KR | 101935132 | 1/2019 |

OTHER PUBLICATIONS

European Patent Office Application Serial No. 19947569.0, Search Report dated May 31, 2023, 11 pages.

* cited by examiner

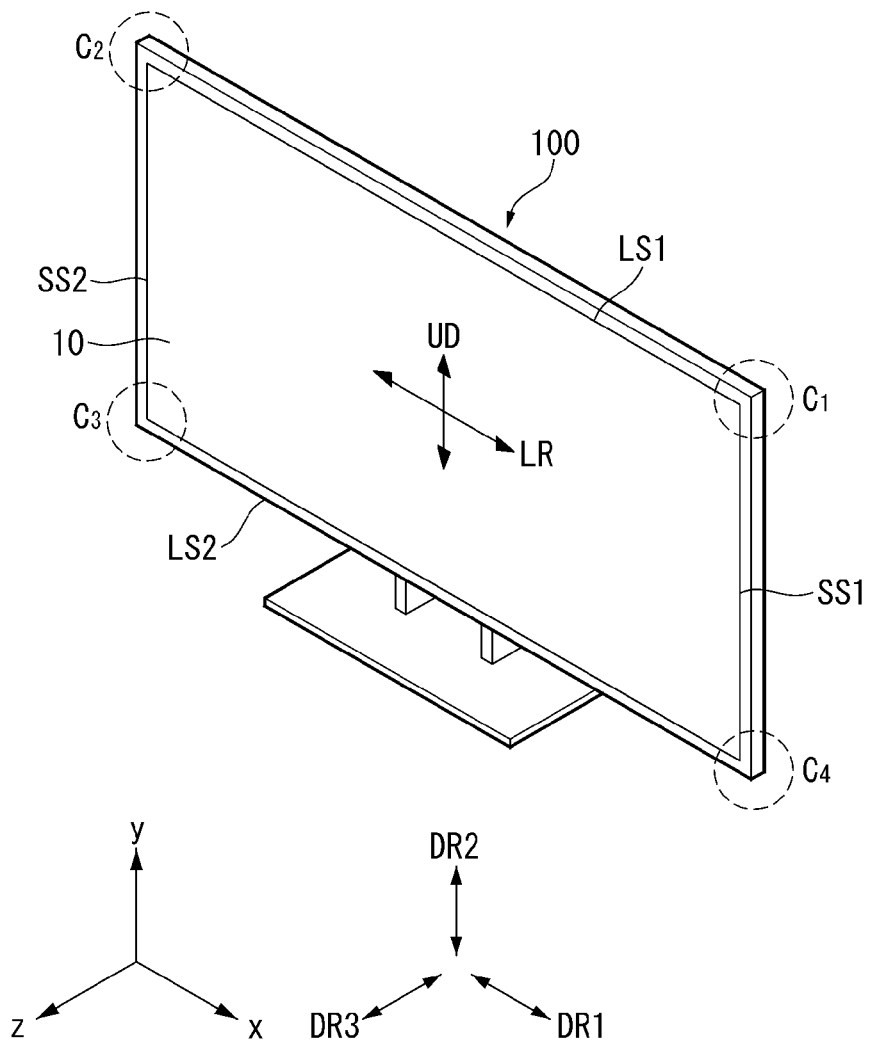
[FIG. 1]

[FIG. 2]
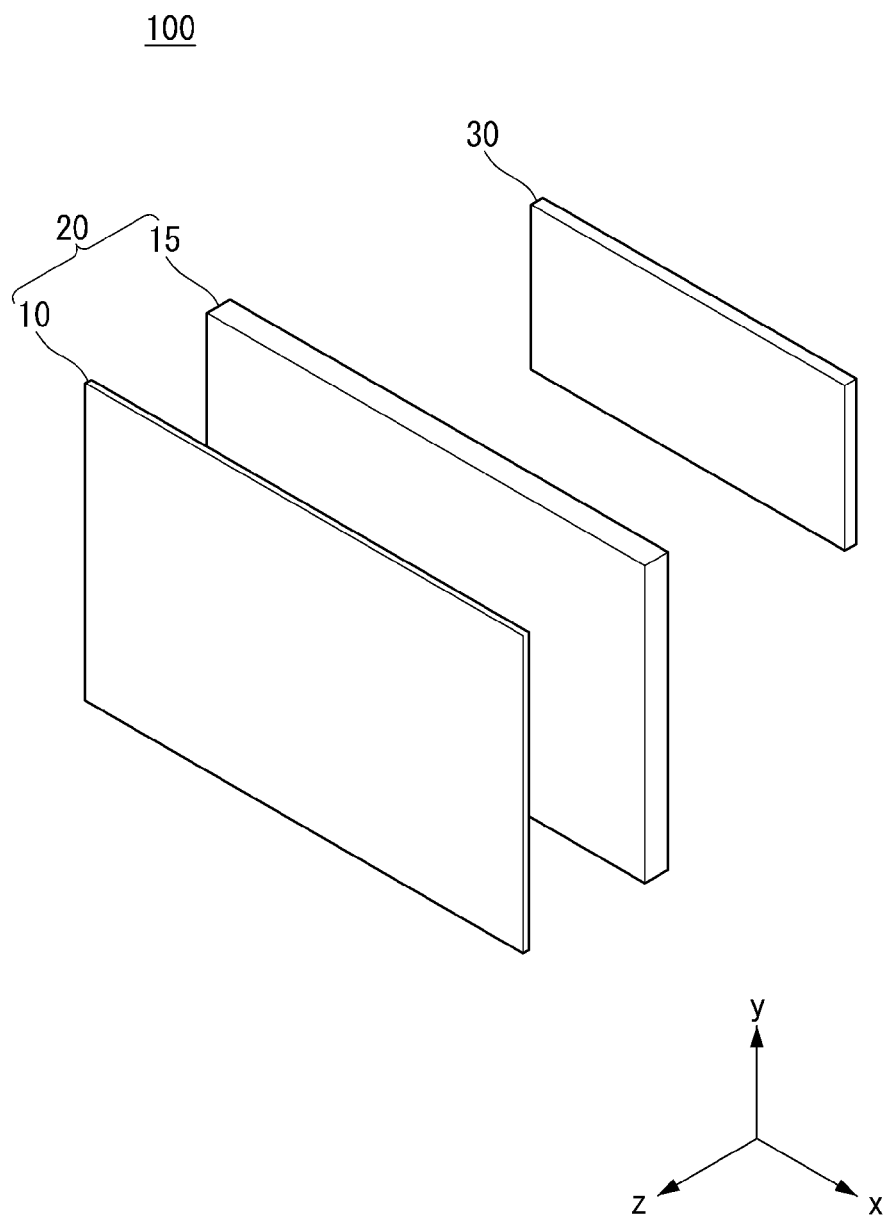

[FIG. 3]
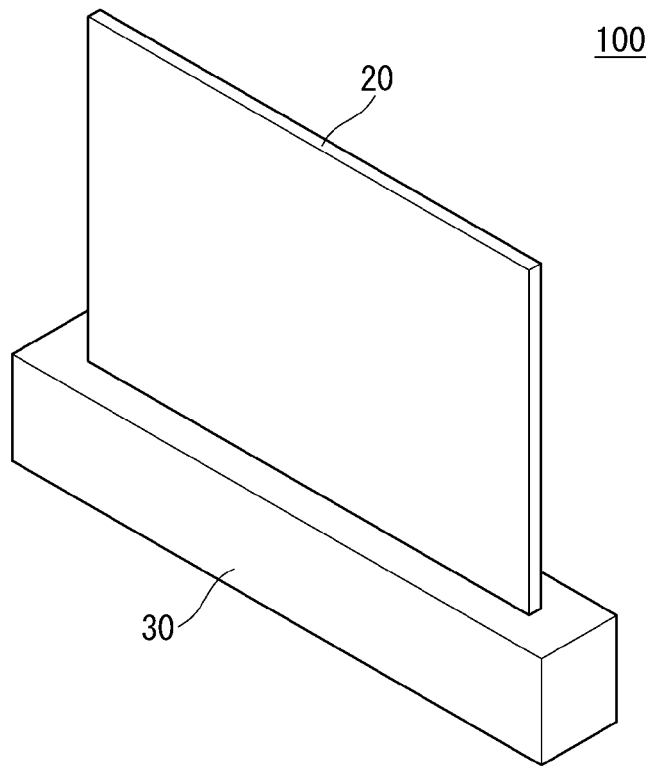
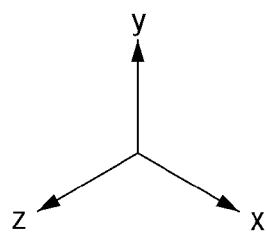

[FIG. 4]
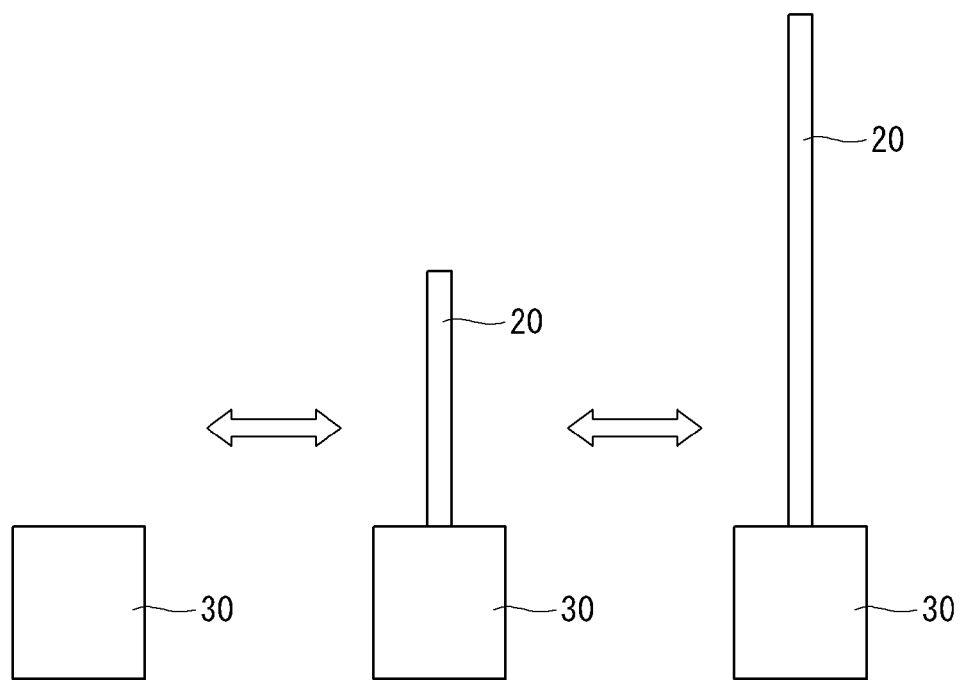

[FIG. 5]
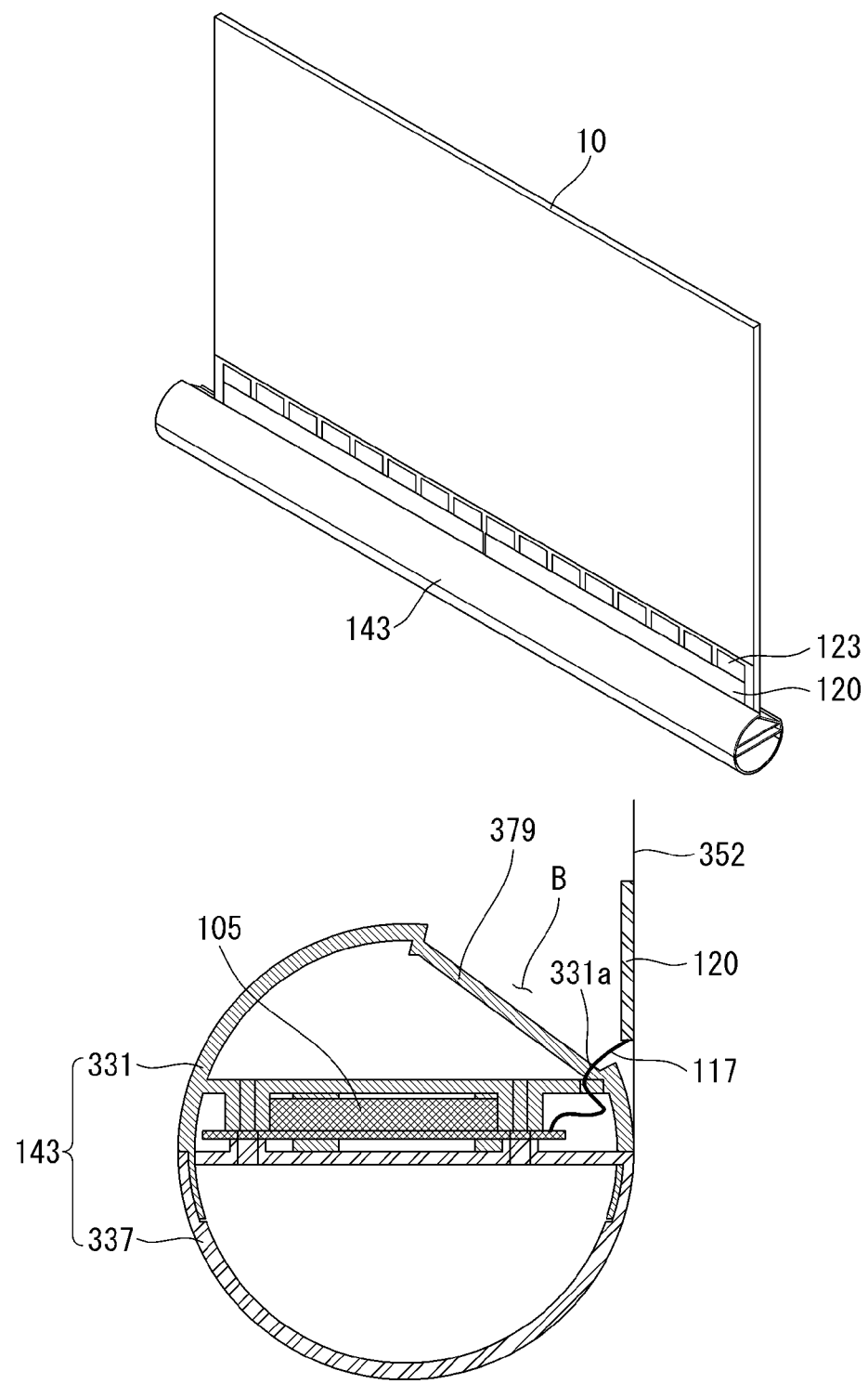

[FIG. 6]
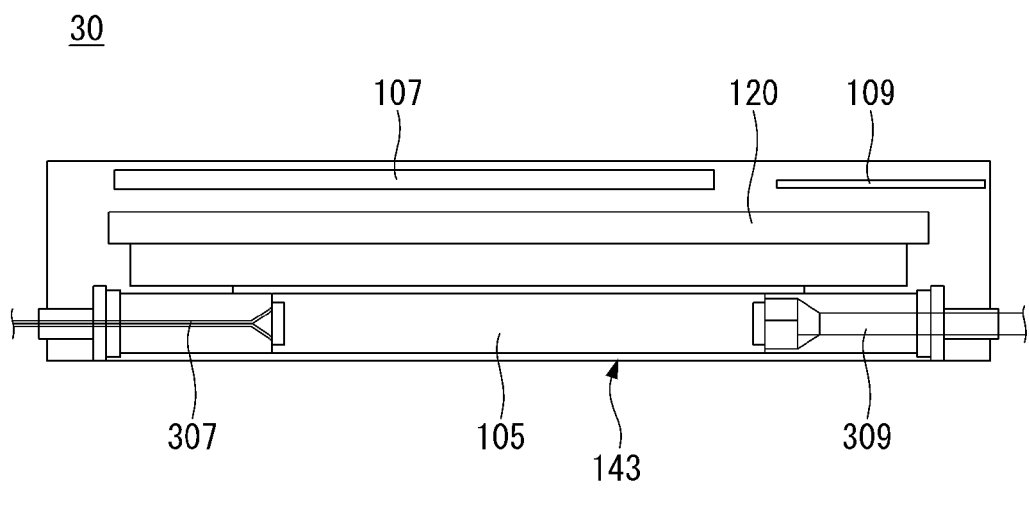
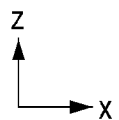

[FIG. 7]
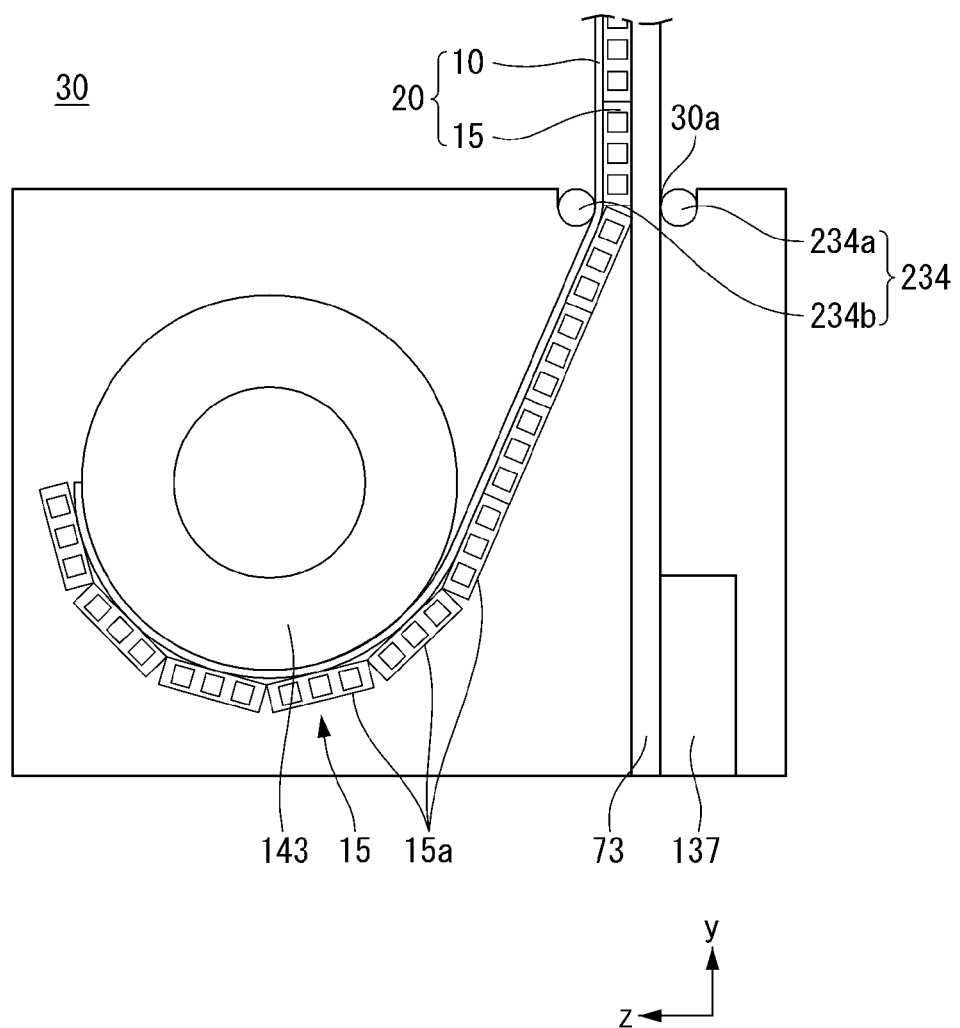

[FIG. 8]
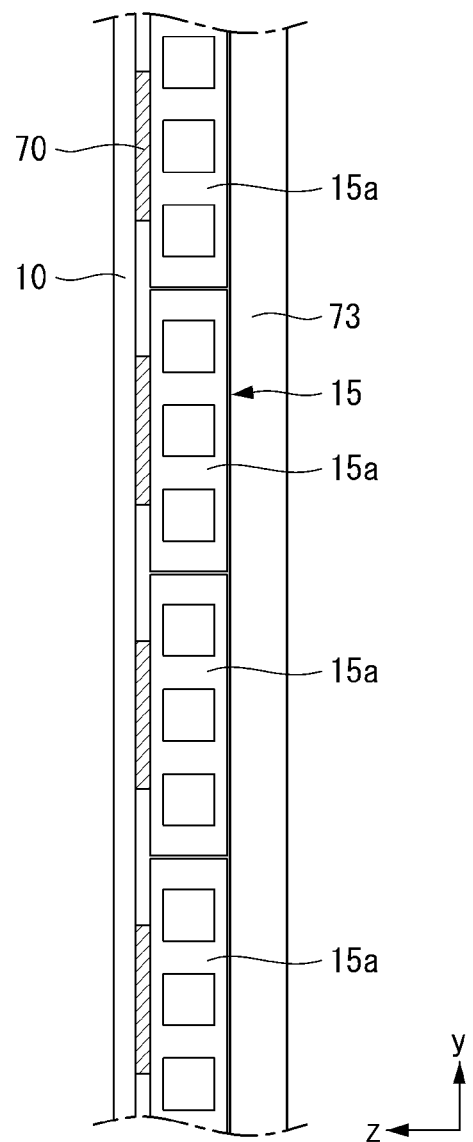

[FIG. 9a]
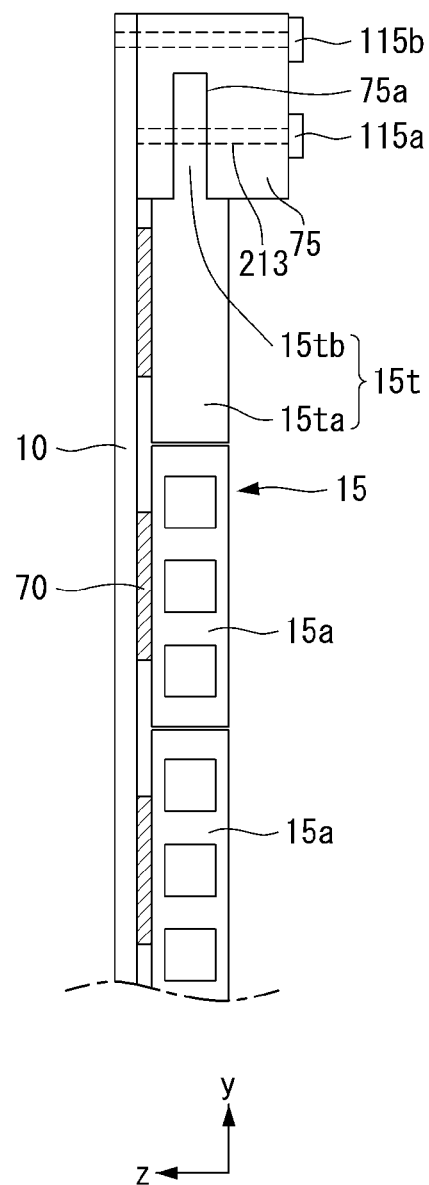

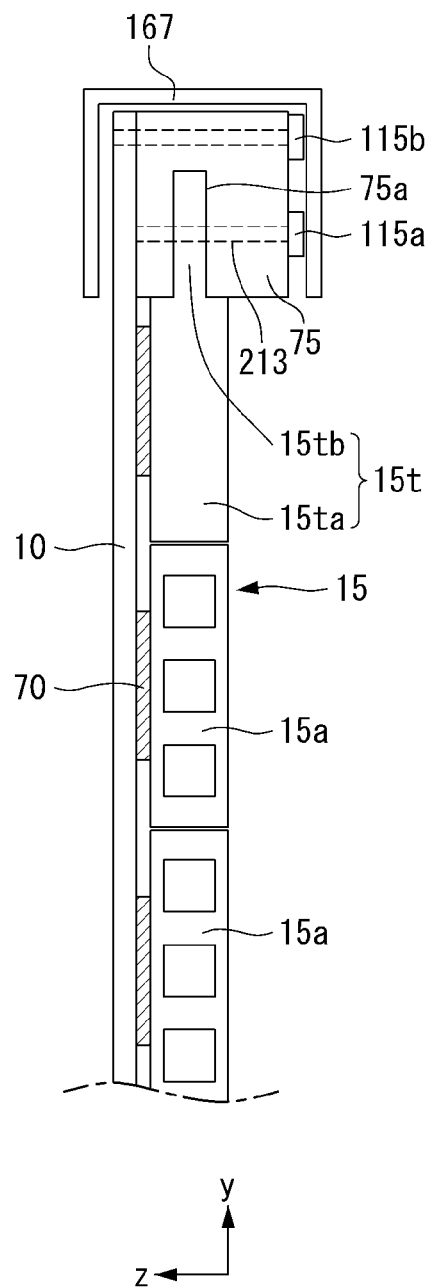
[FIG. 9b]

[FIG. 10a]
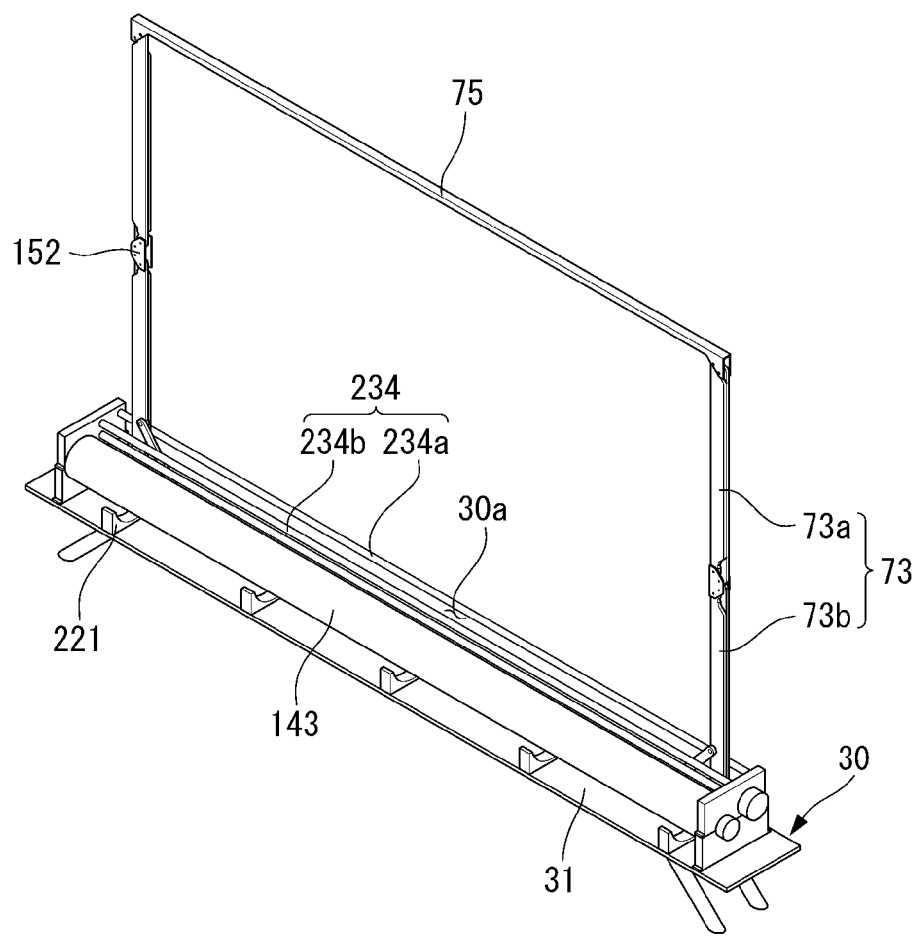

[FIG. 10b]
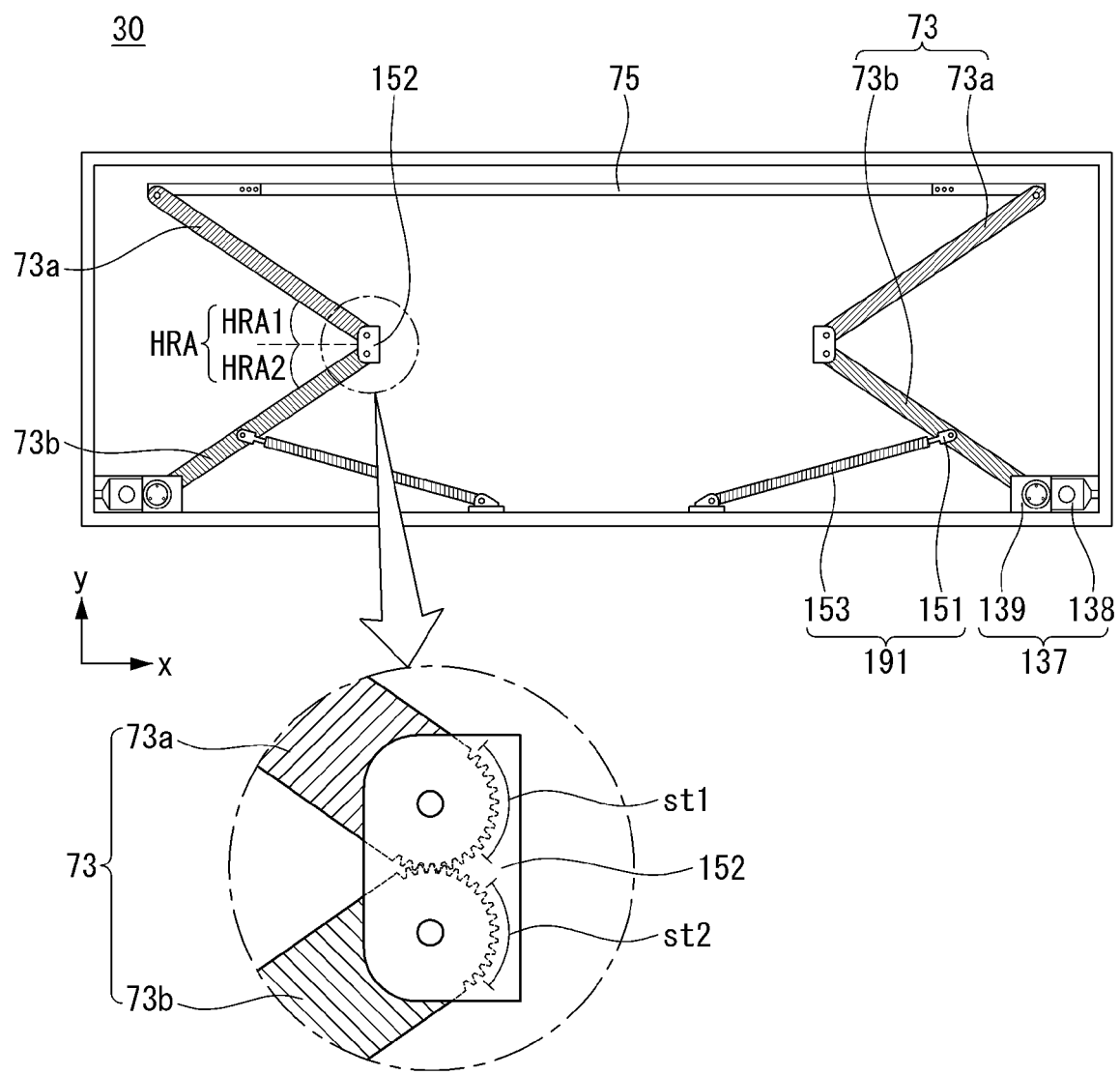

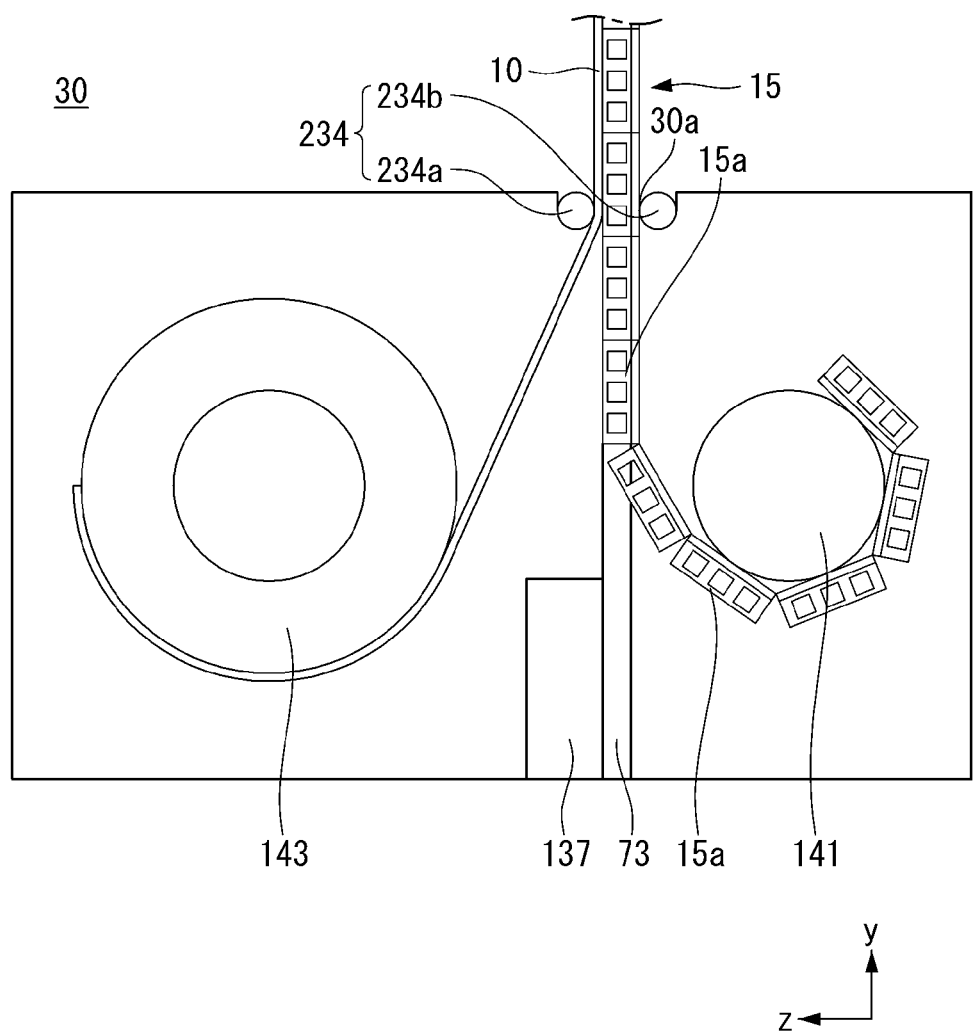
[FIG. 11]

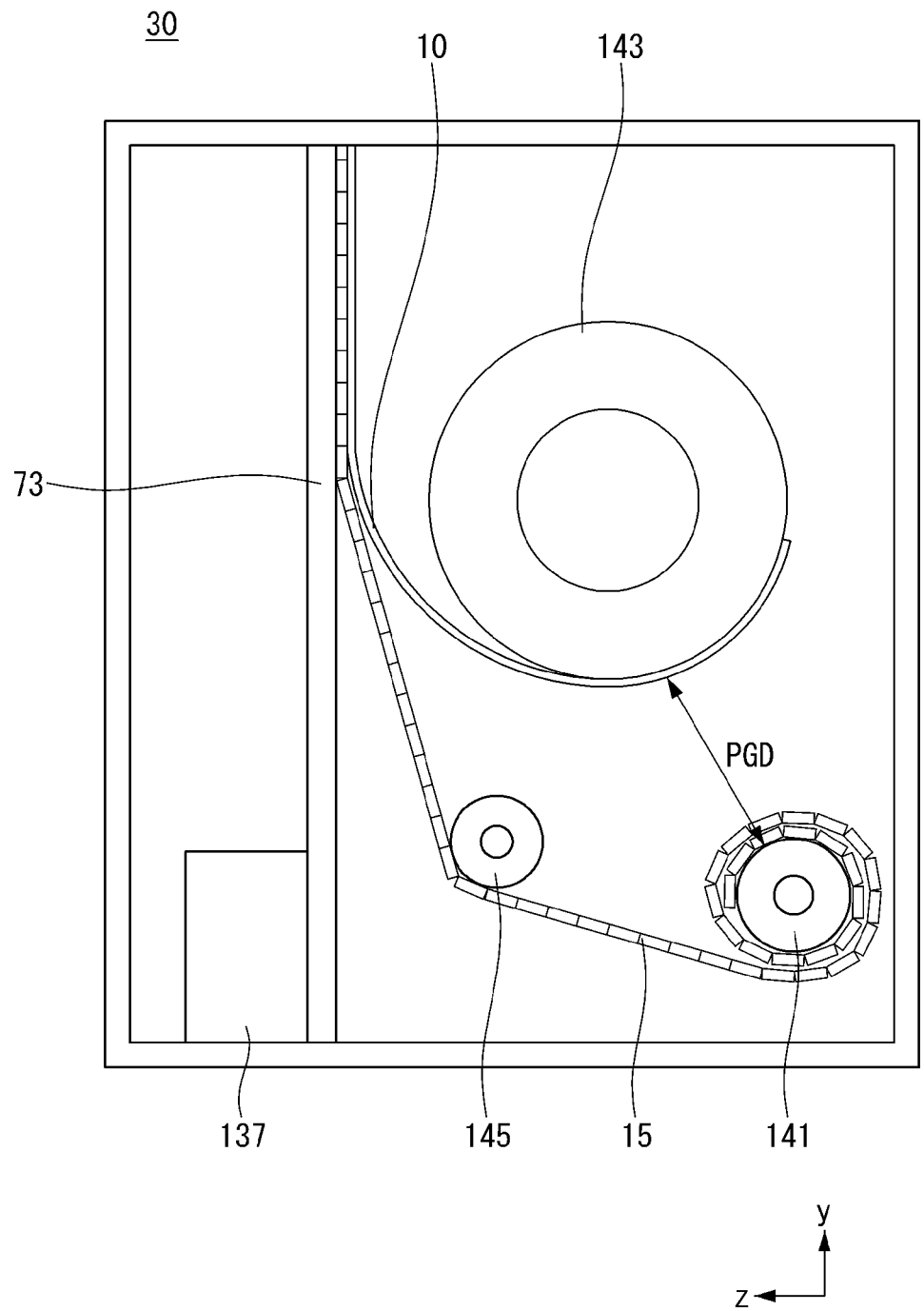
[FIG. 12]

[FIG. 13]
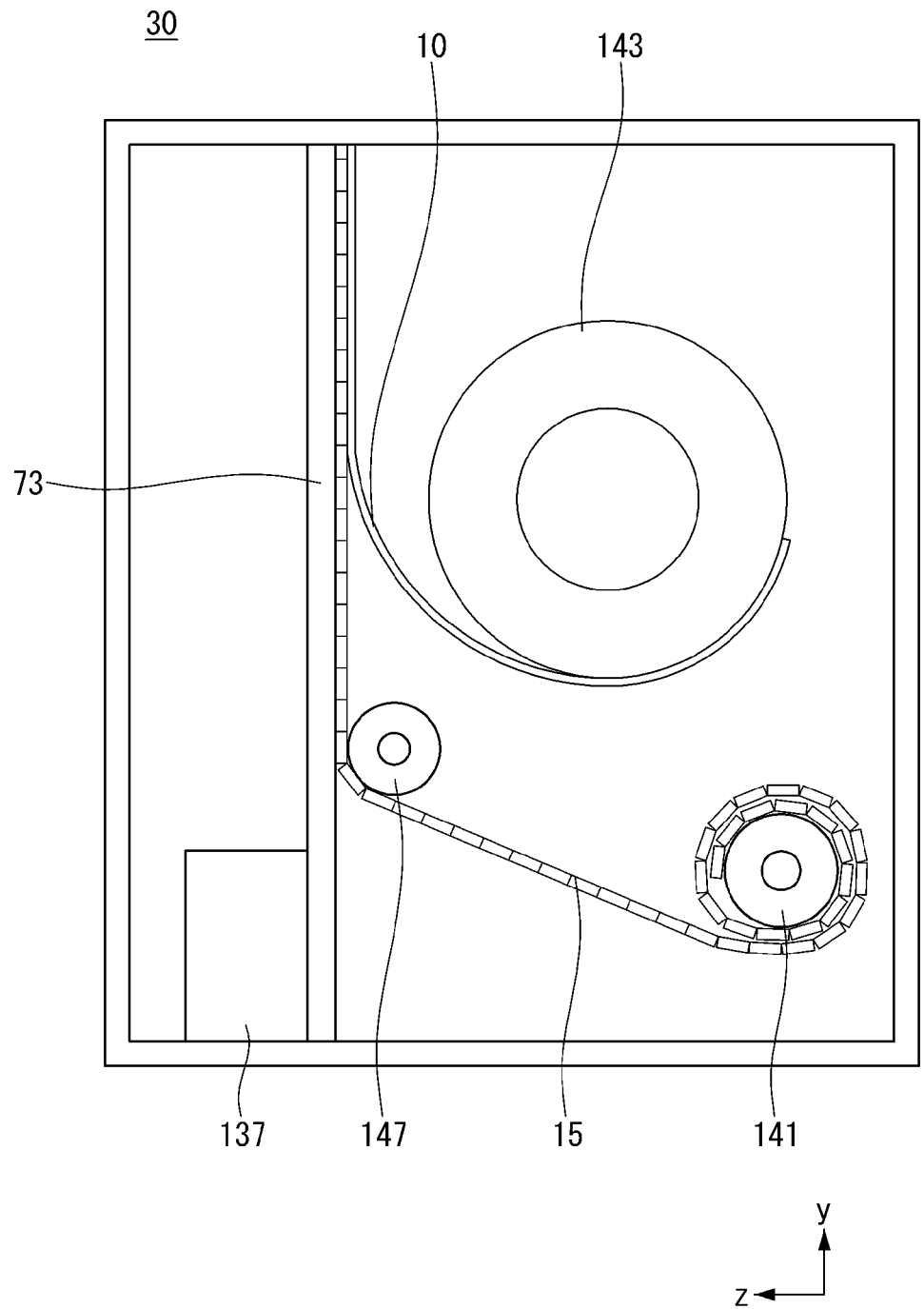

[FIG. 14]
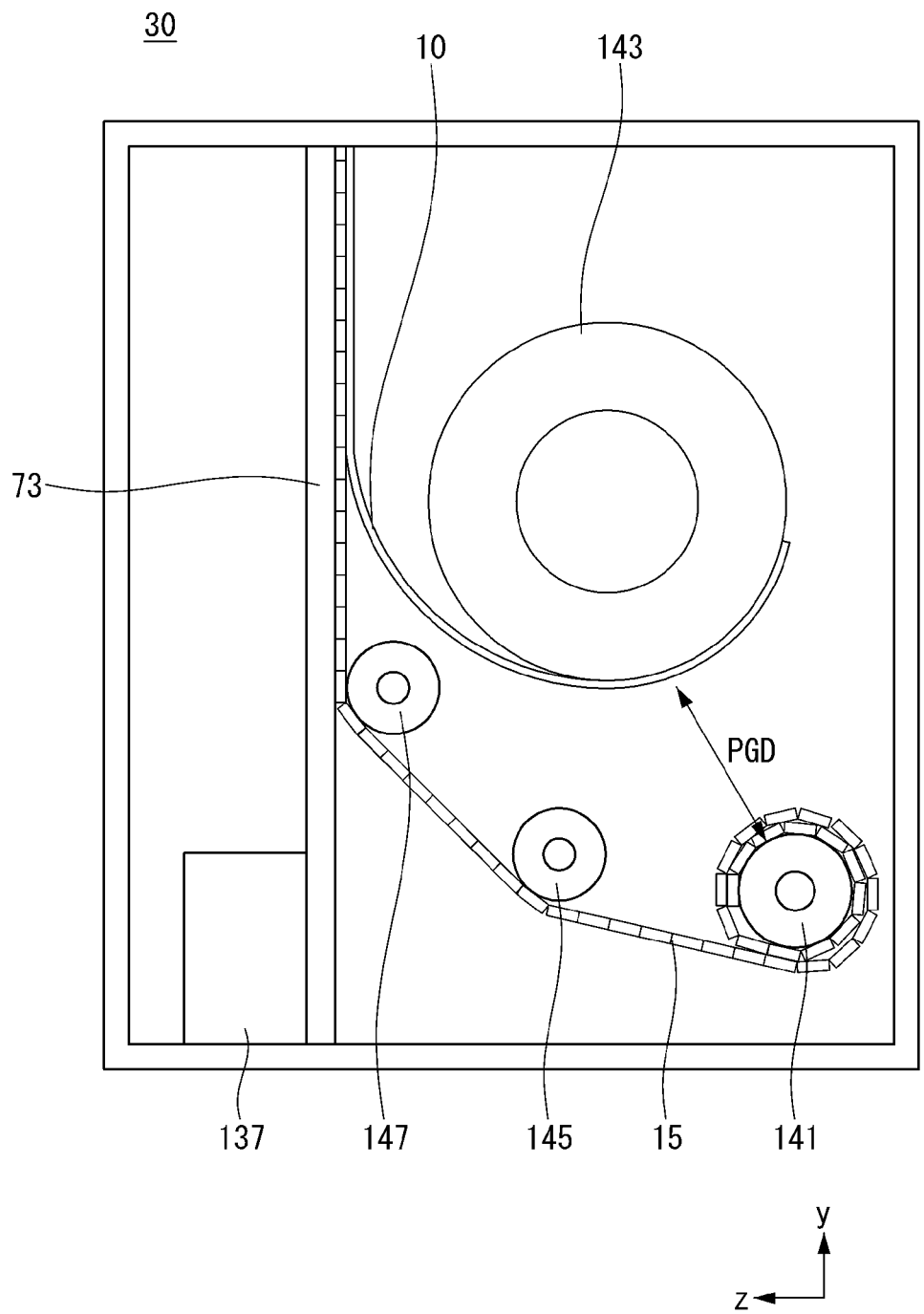

[FIG. 15]
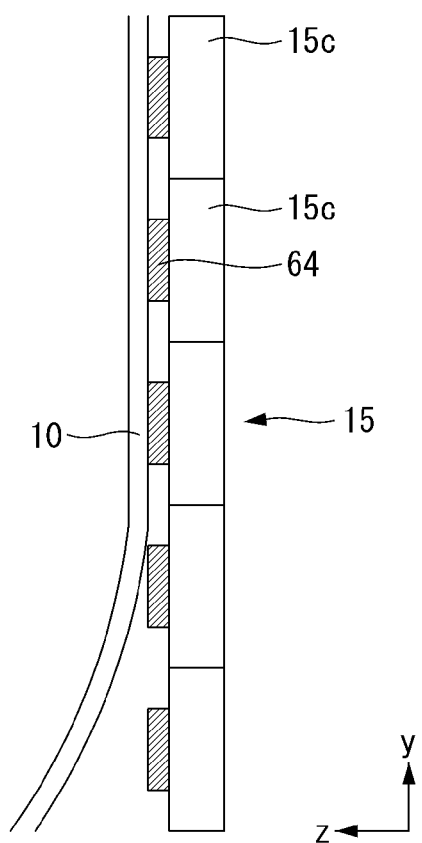

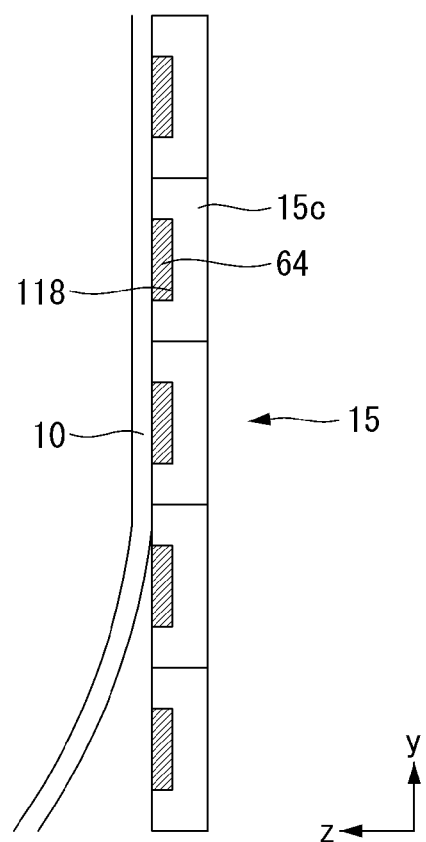
[FIG. 16]

[FIG. 17a]
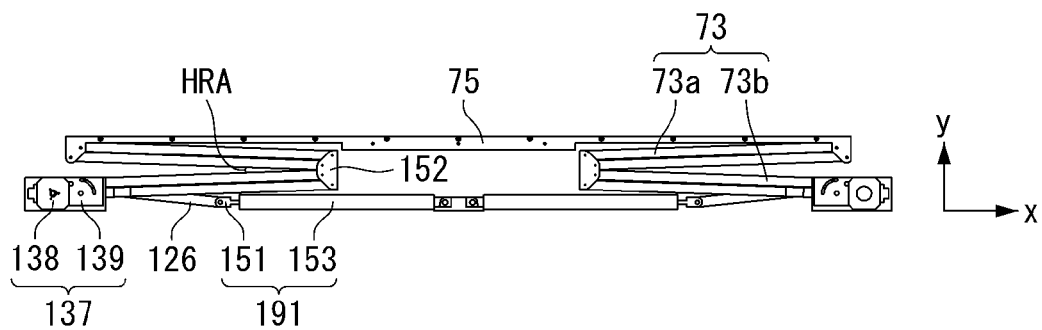
[FIG. 17b]
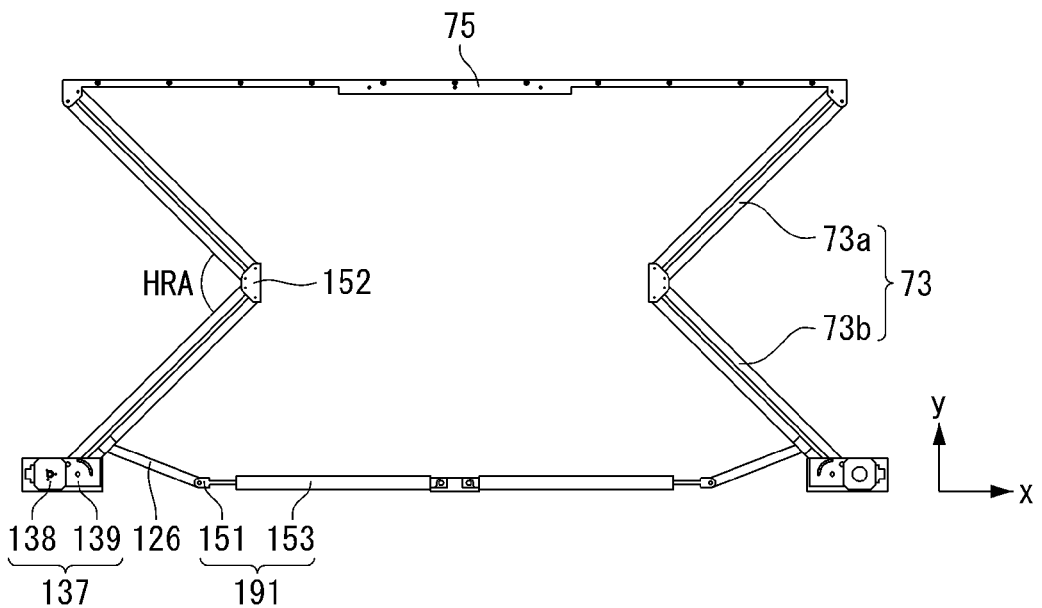

[FIG. 17c]
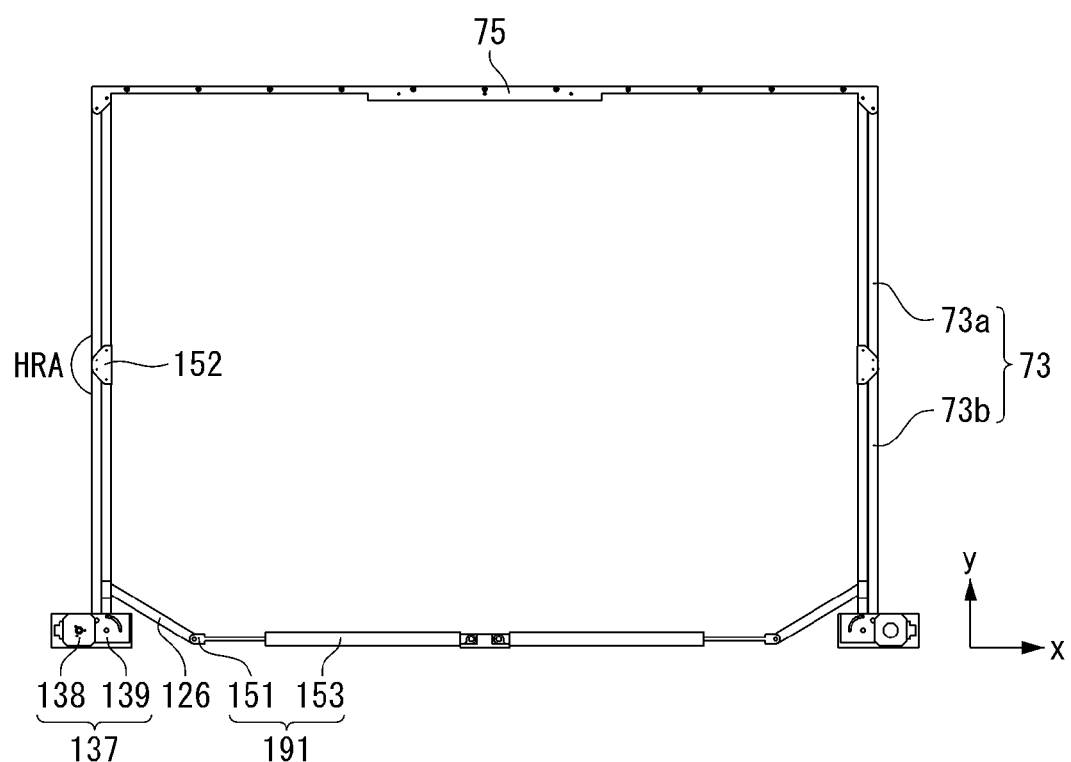

[FIG. 17d]
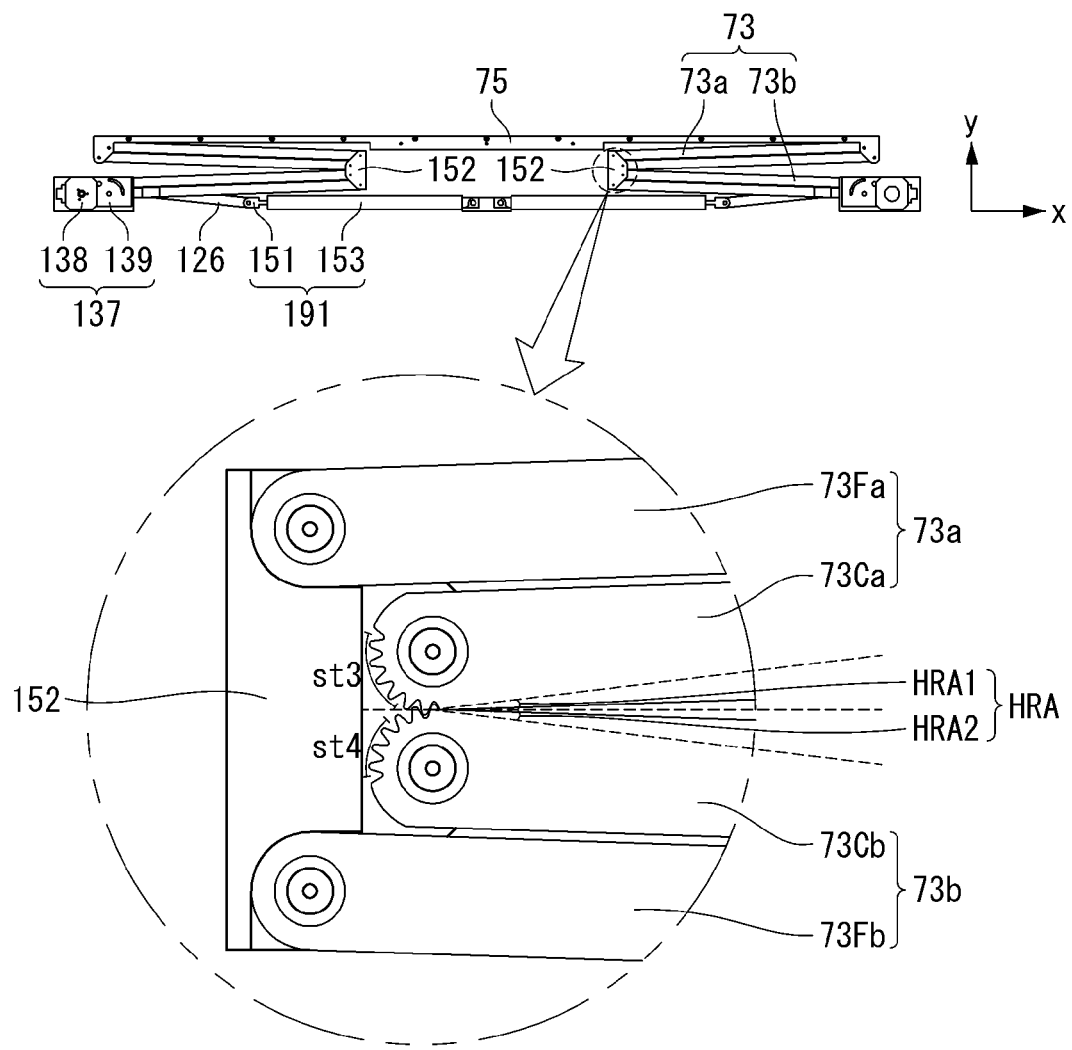

[FIG. 17e]
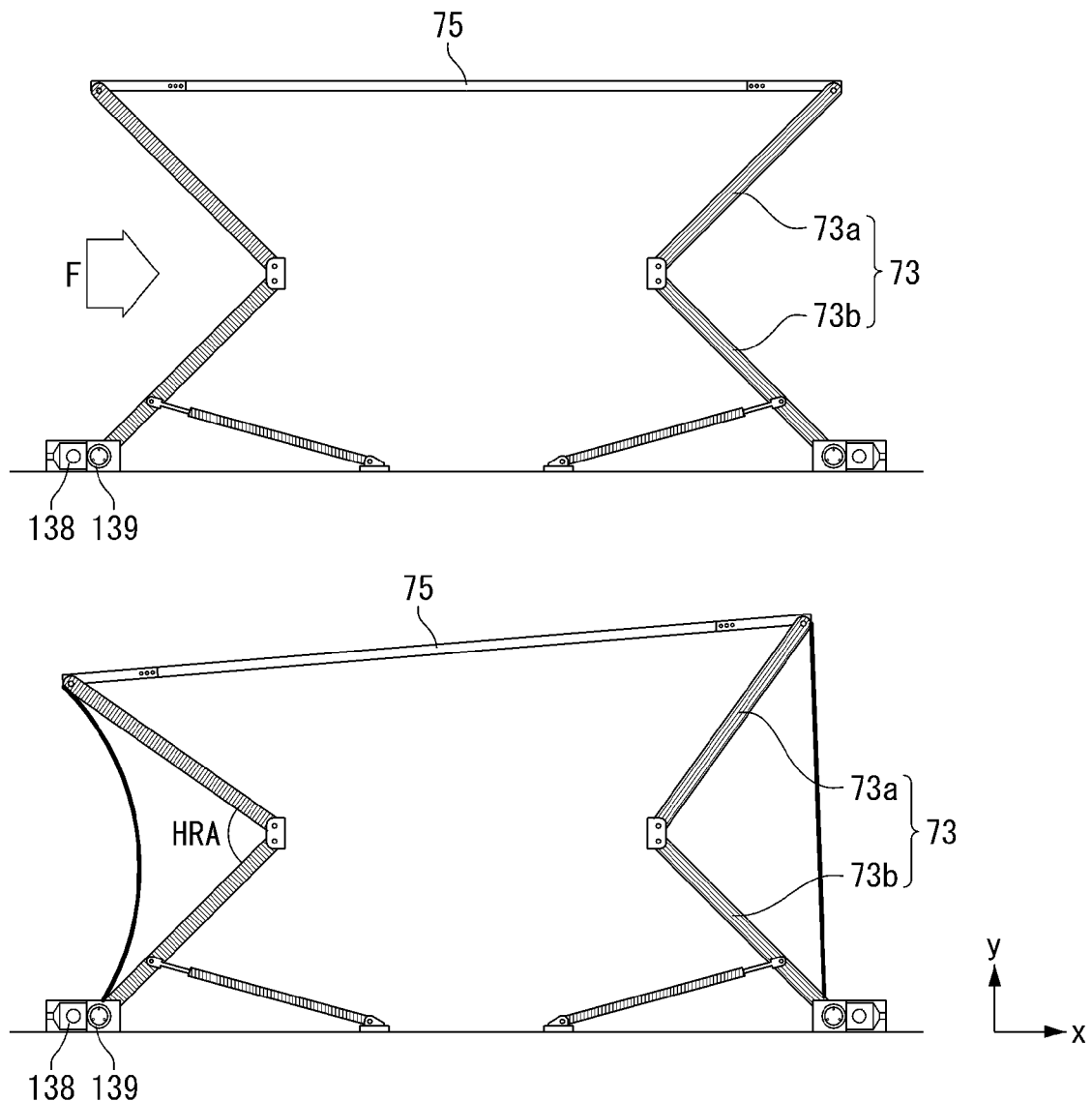

[FIG. 17f]
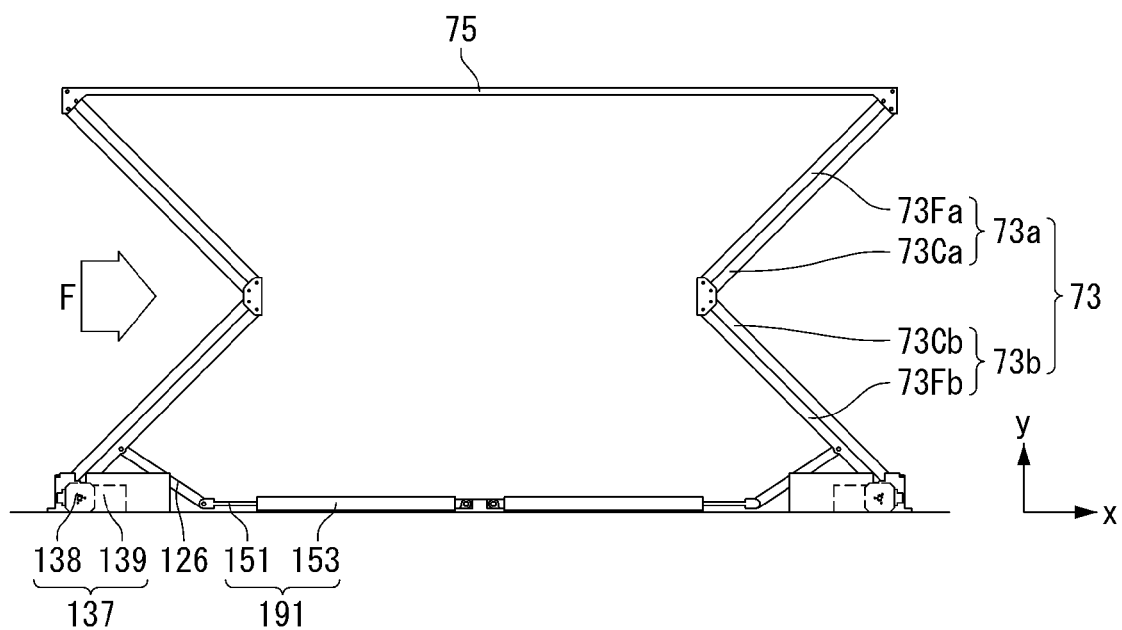

【FIG. 17g】
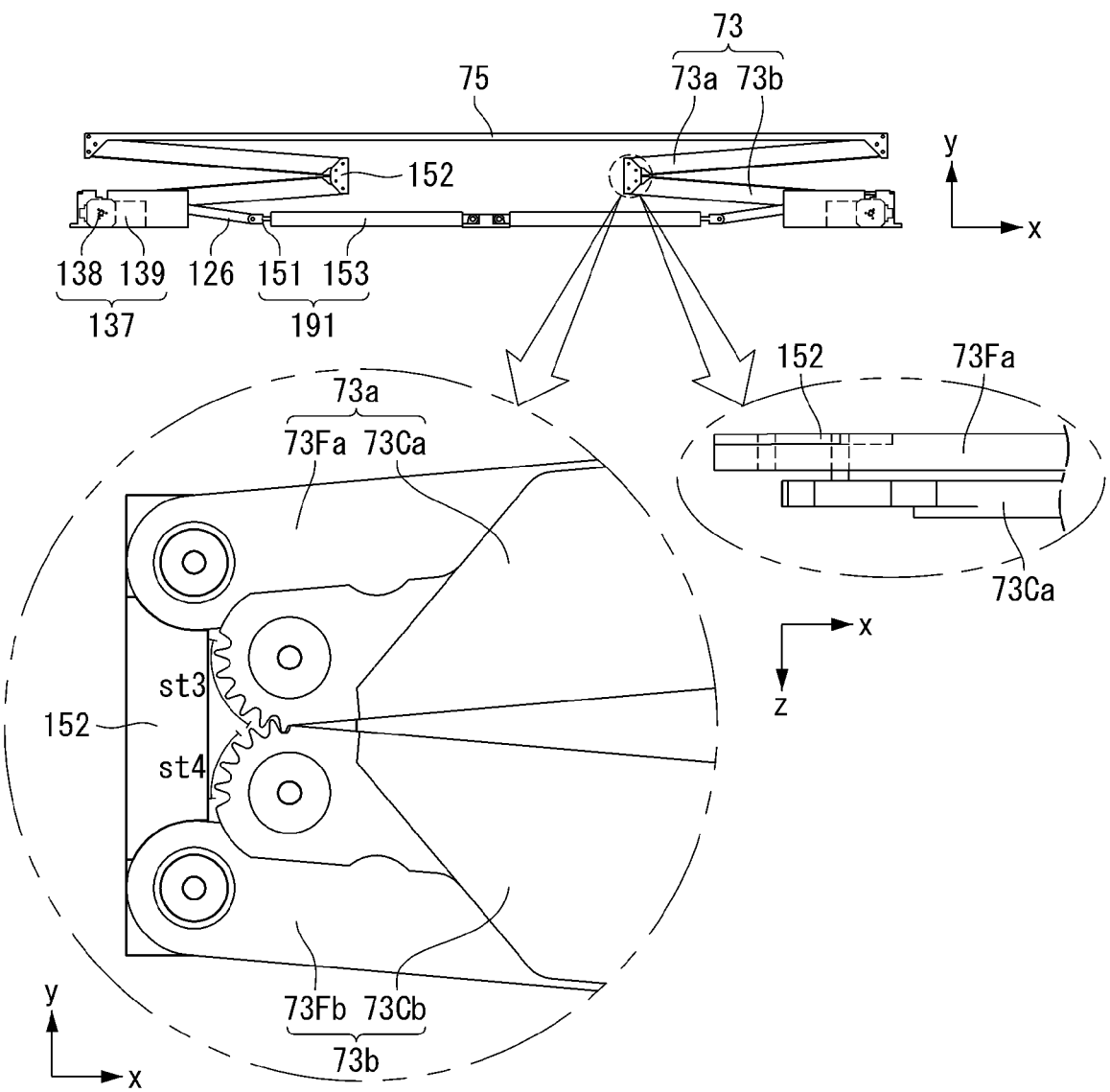

[FIG. 17h]
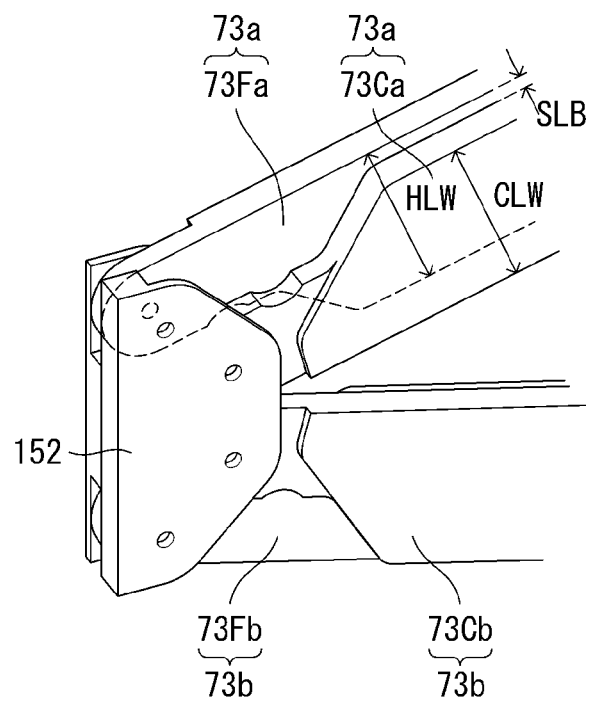

[FIG. 17i]
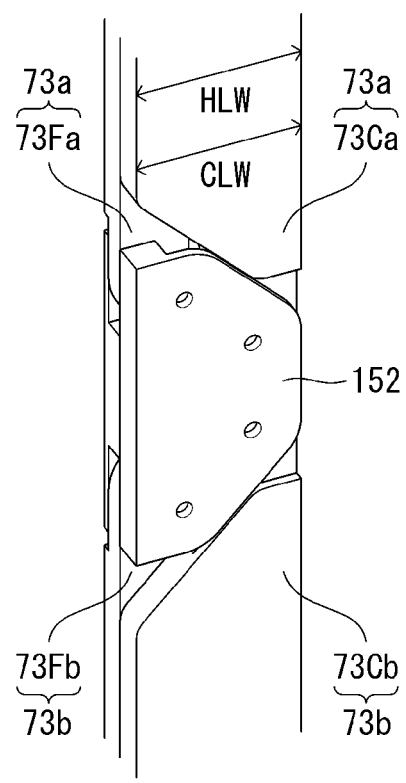

[FIG. 17j]
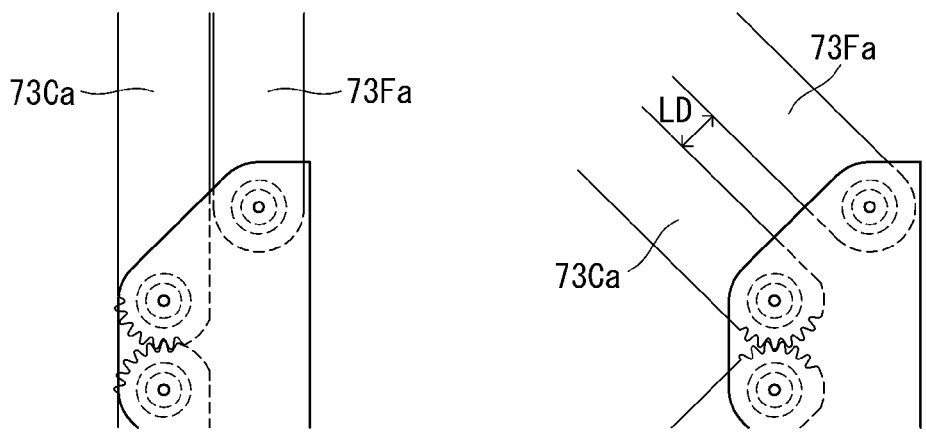
[FIG. 17k]
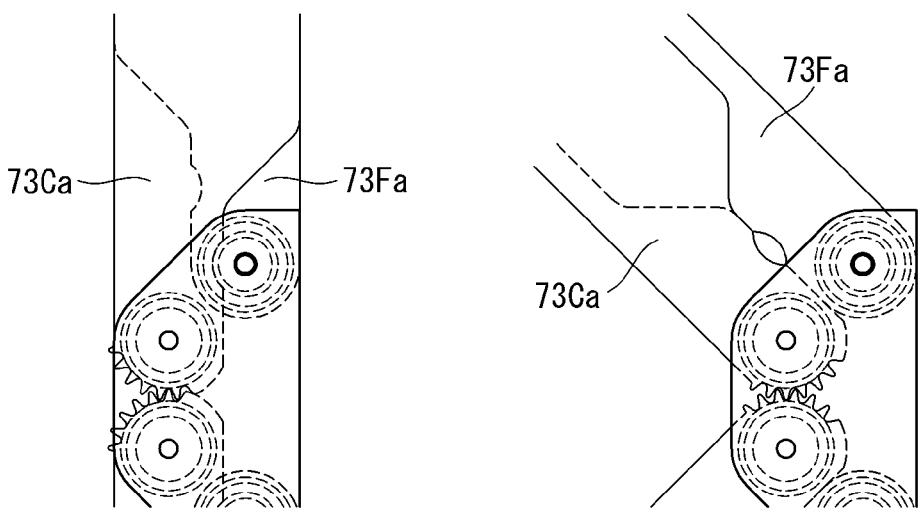

[FIG. 18]
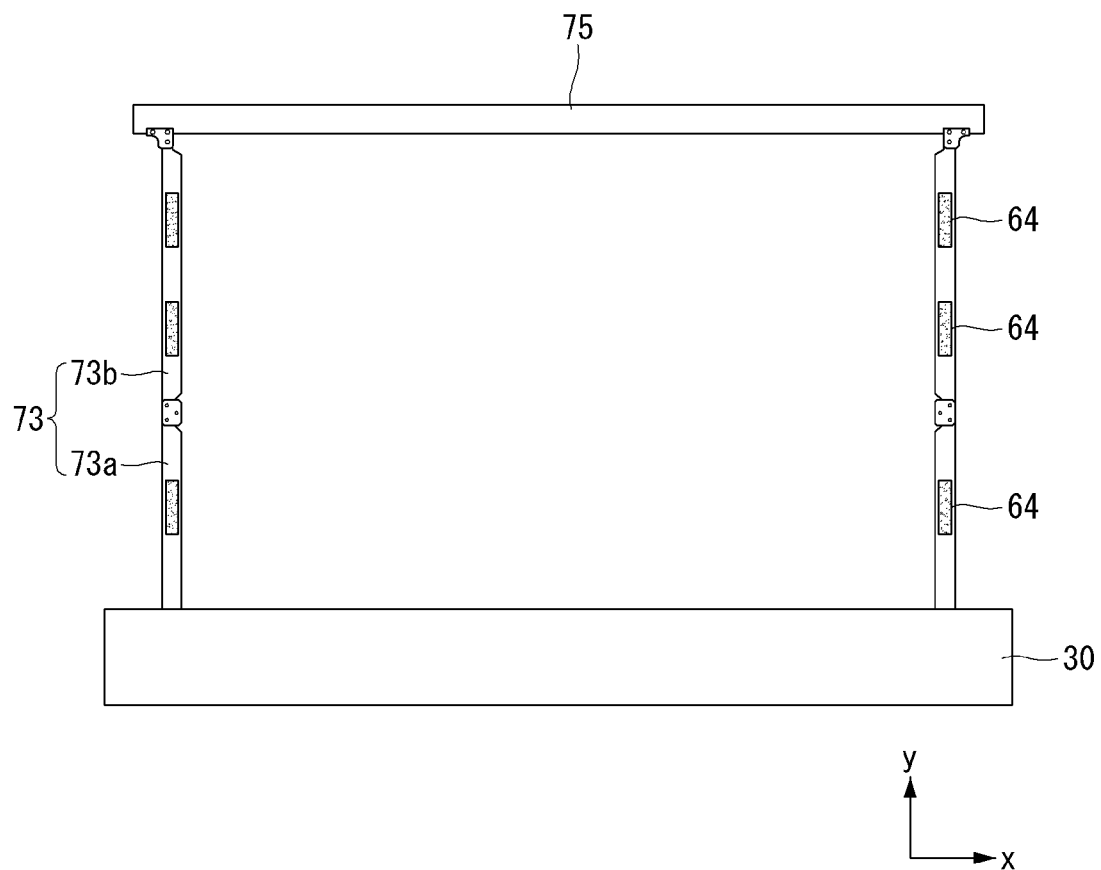

[FIG. 19]
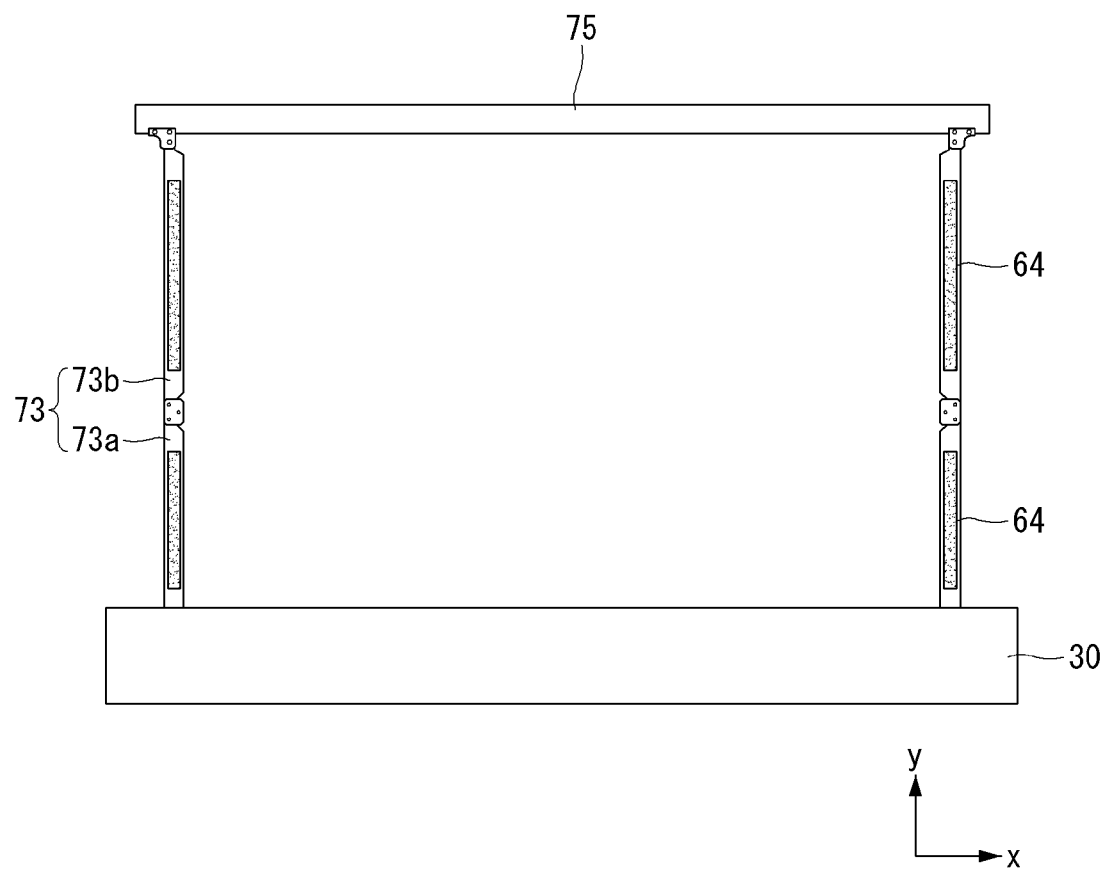

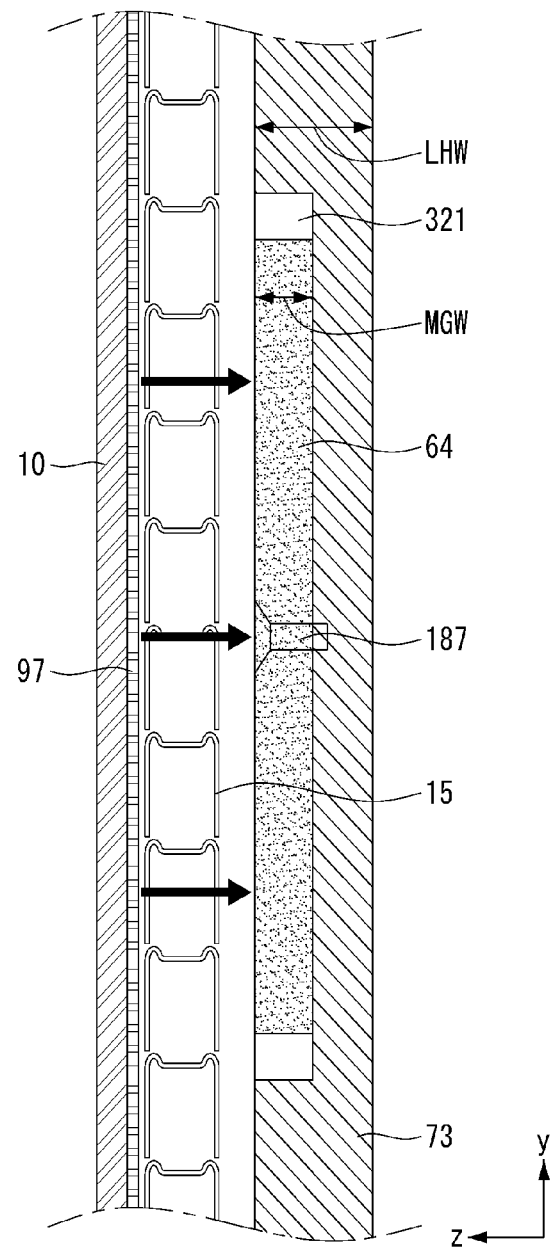
[FIG. 20]

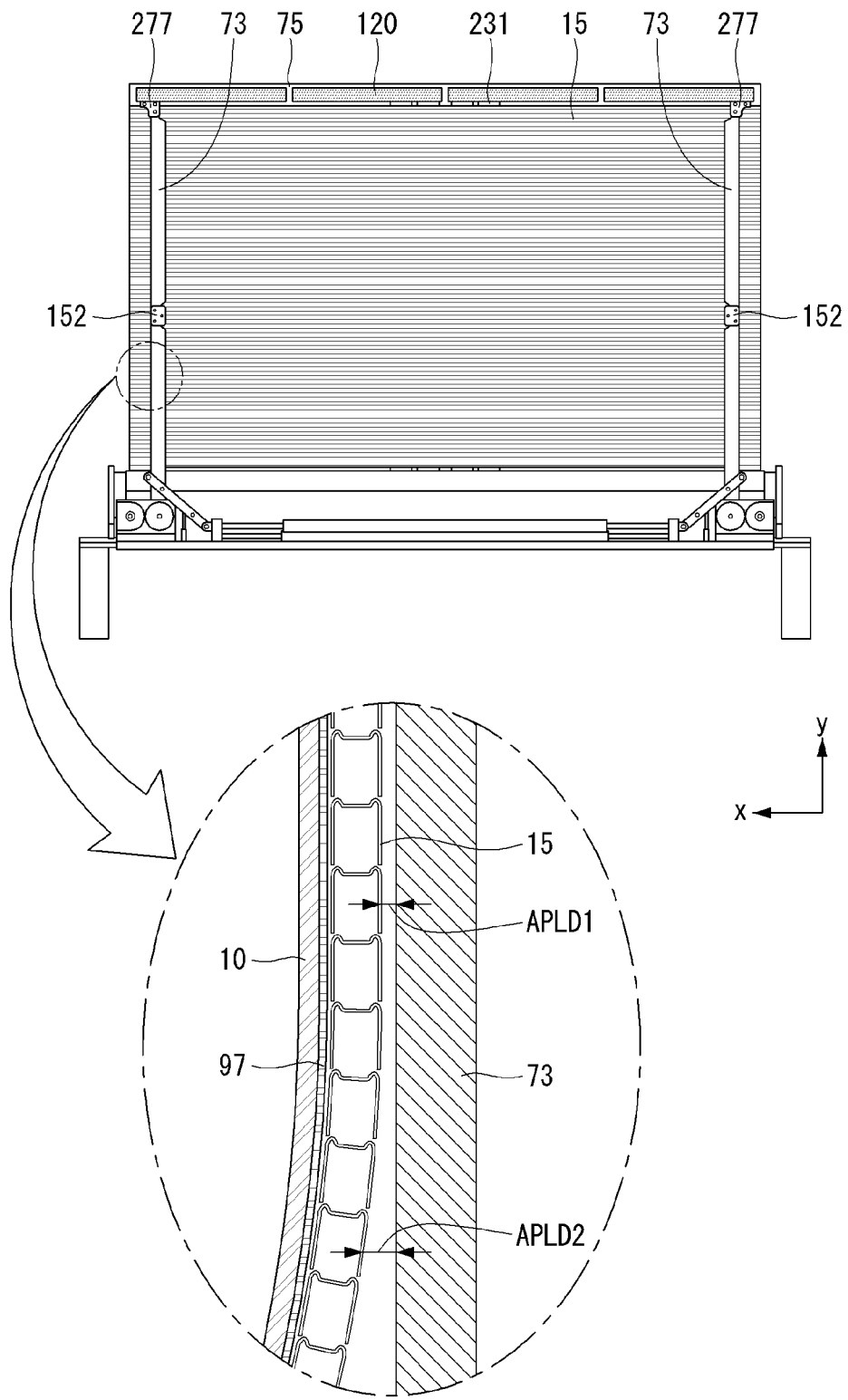
[FIG. 21]

【FIG. 22】
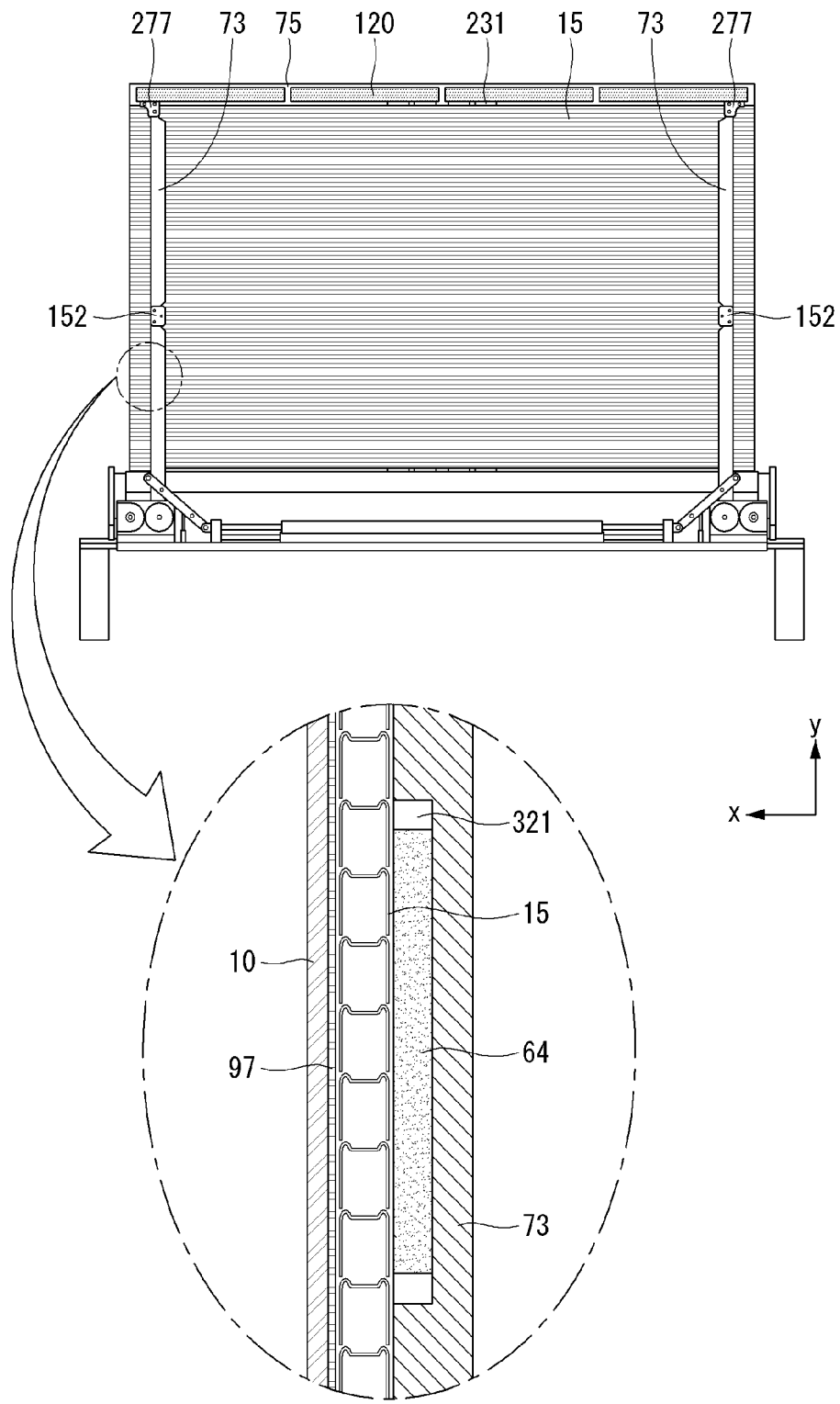

[FIG. 23a]
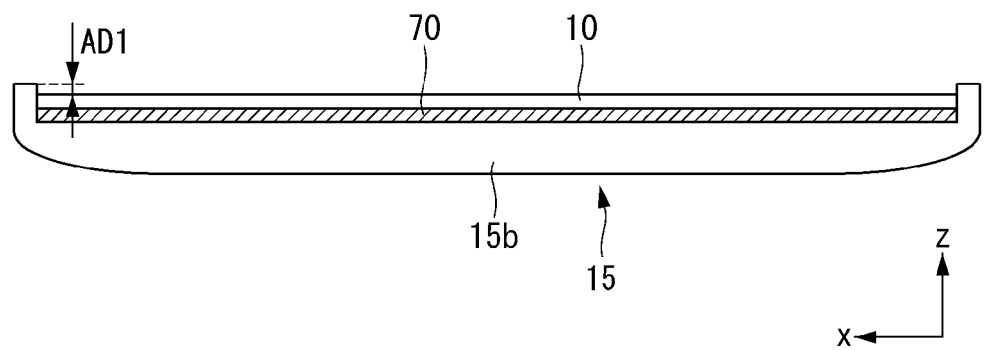
[FIG. 23b]
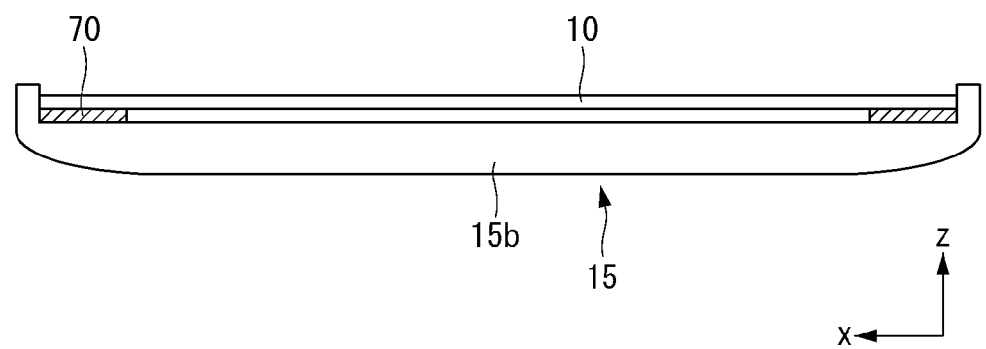

[FIG. 24]
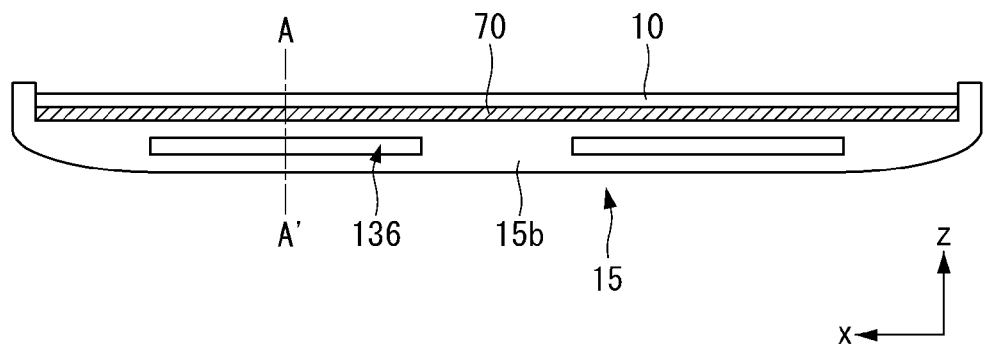
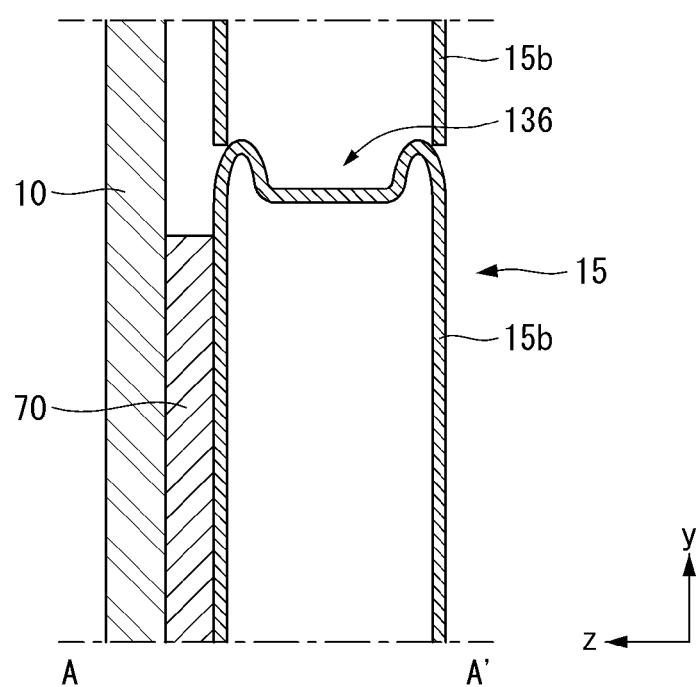

[FIG. 25]
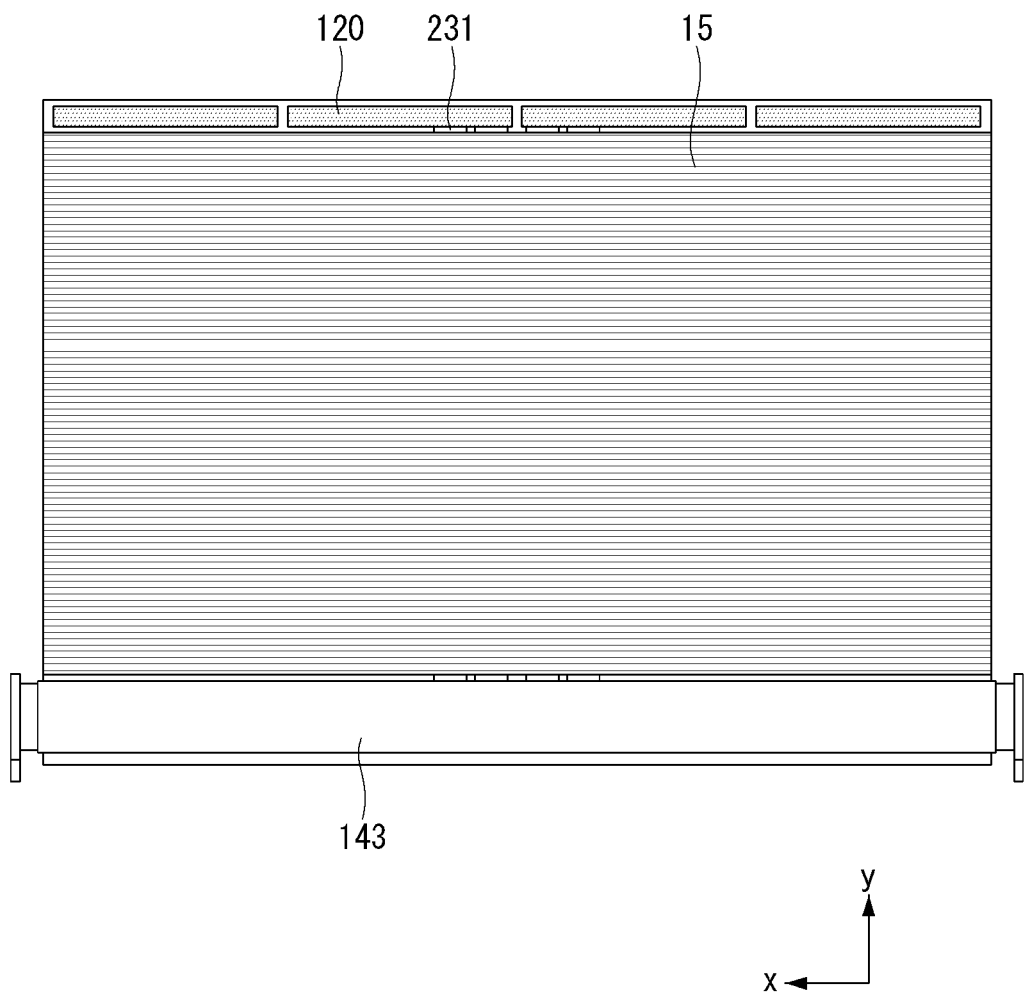

[FIG. 26]
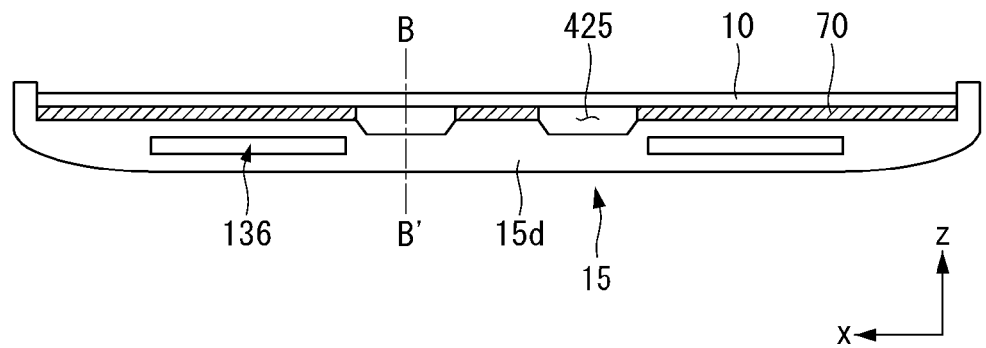
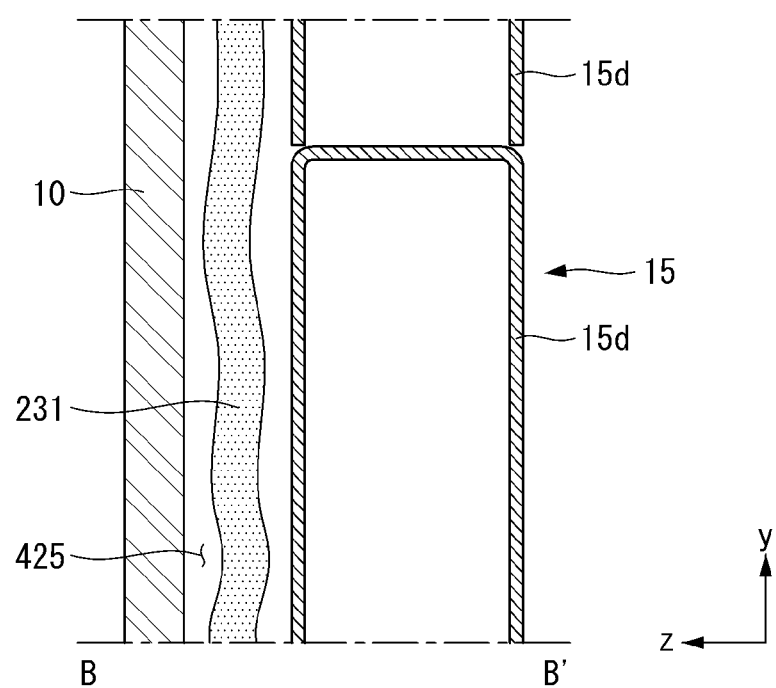

[FIG. 27]
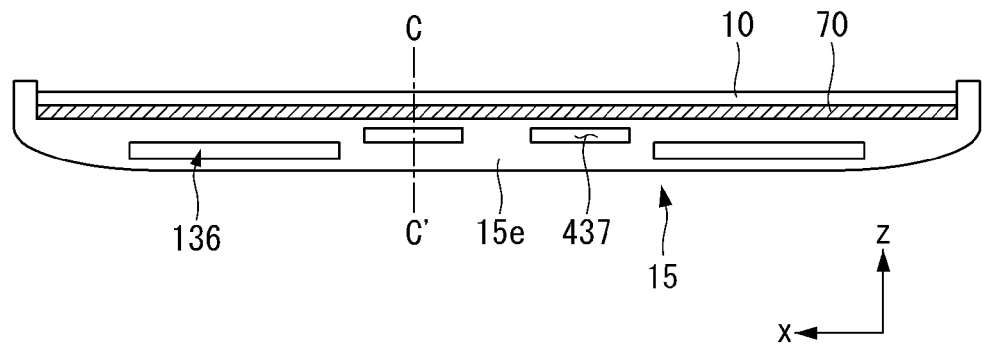
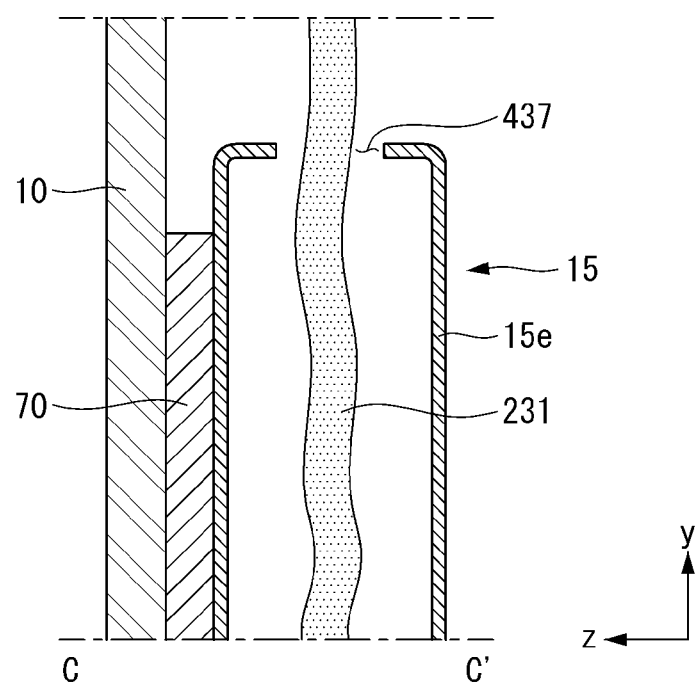

[FIG. 28]
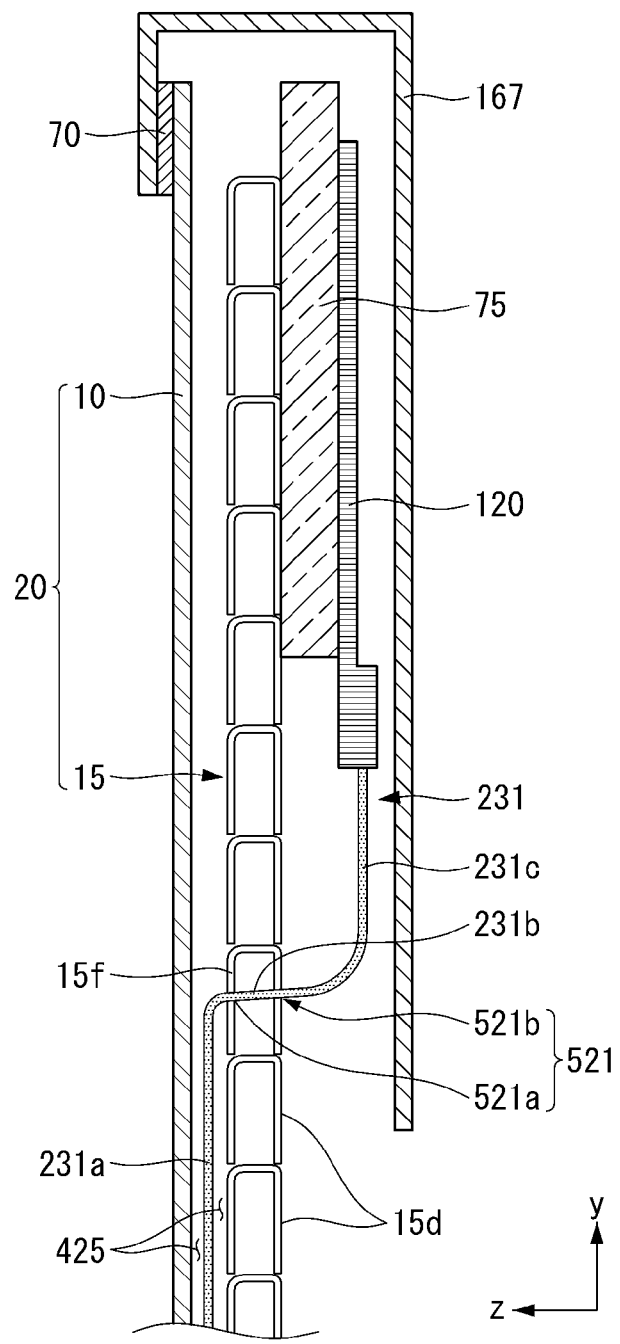

[FIG. 29]
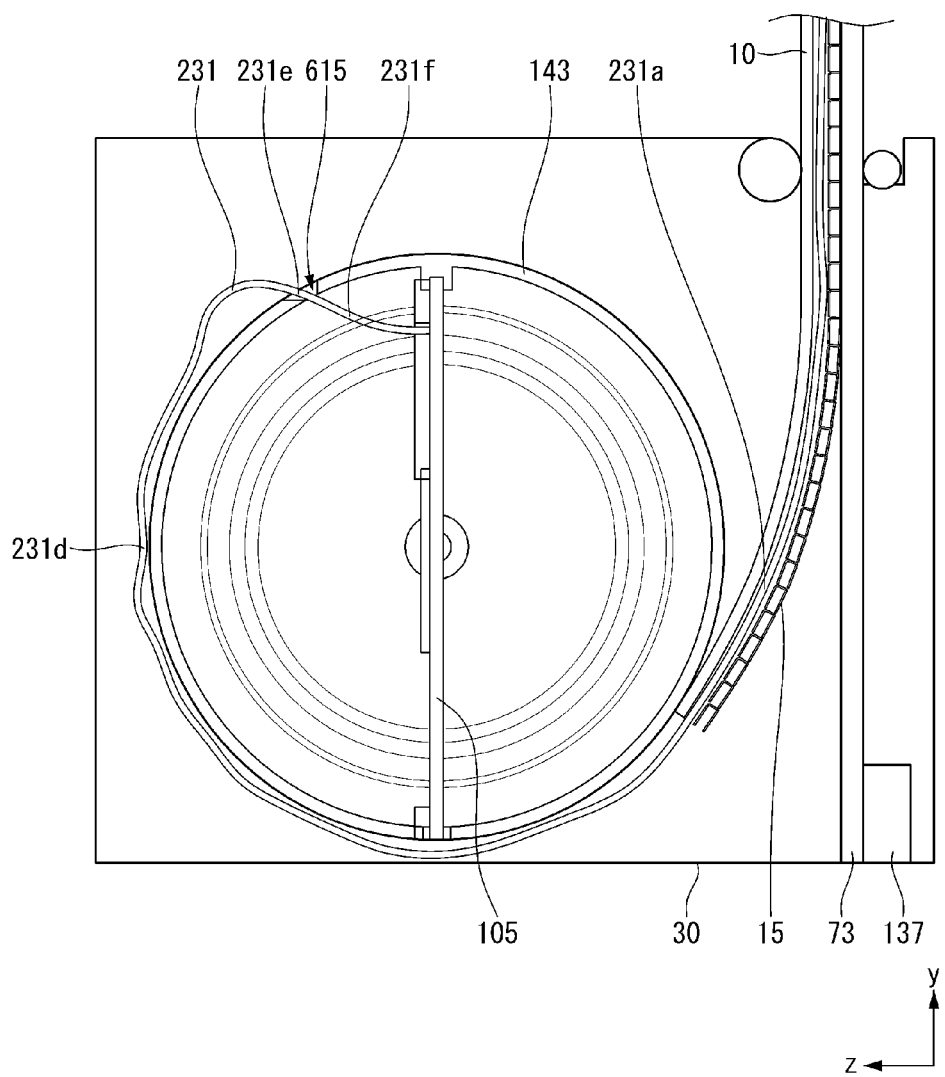

[FIG. 30]
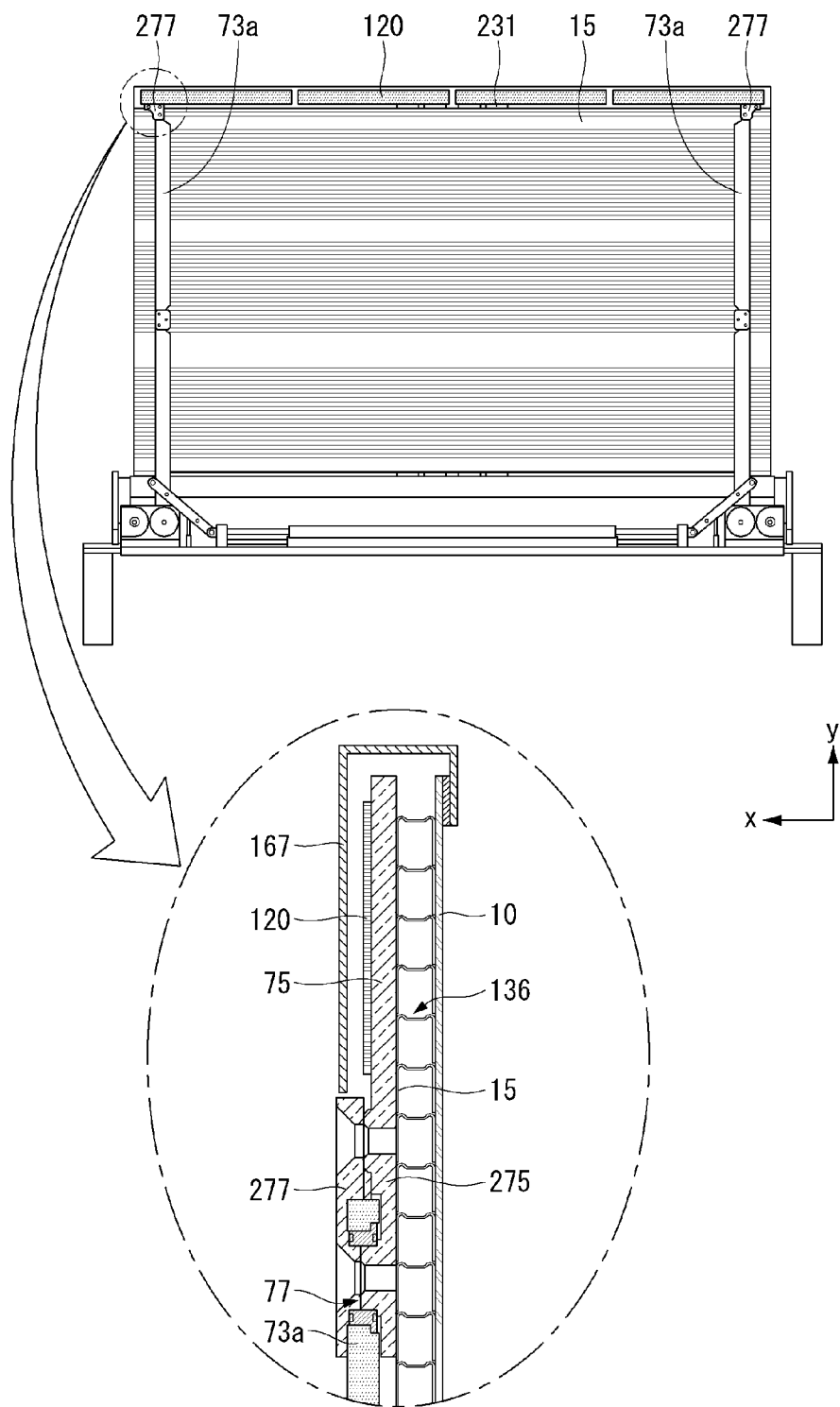

【FIG. 31a】
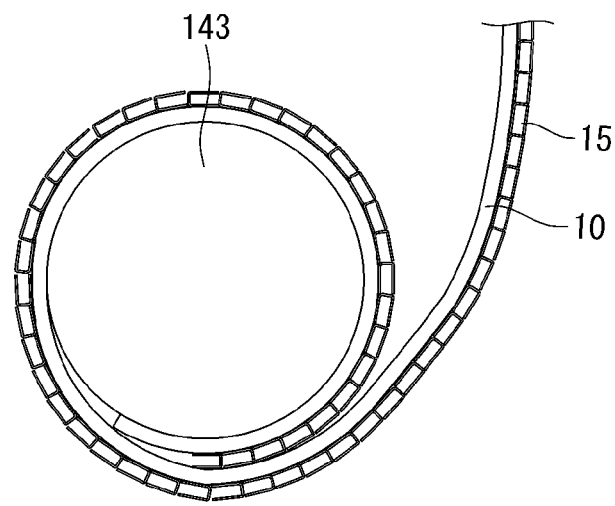
【FIG. 31b】
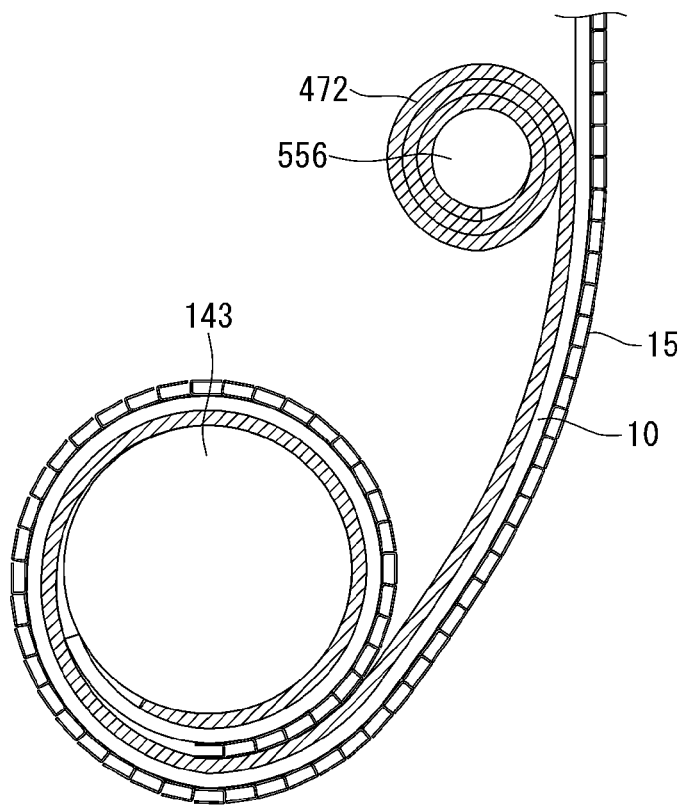

[FIG. 32]
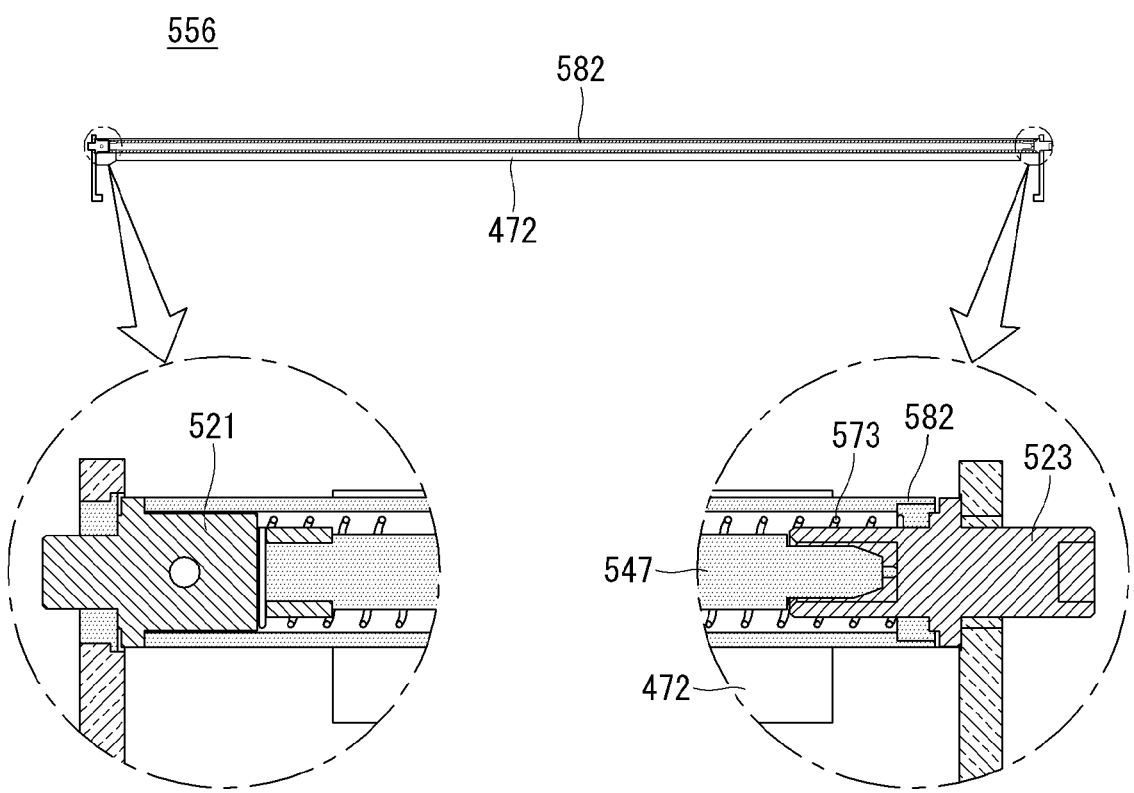

【FIG. 33】
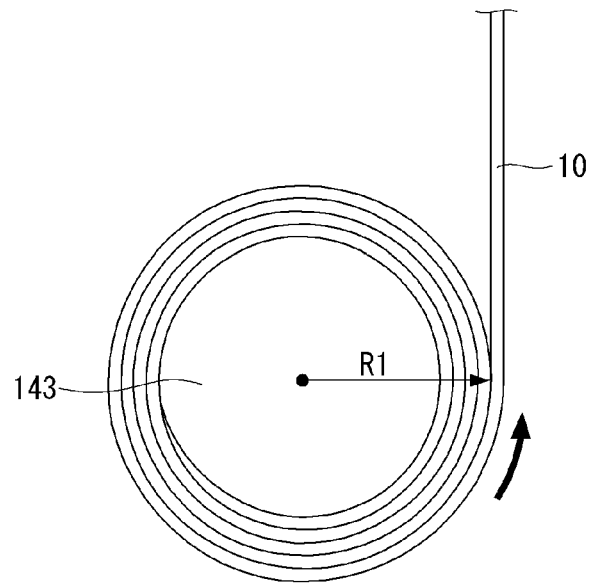
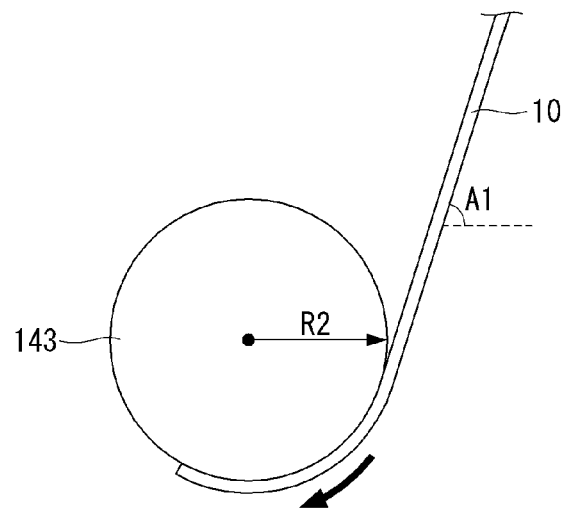

【FIG. 34】
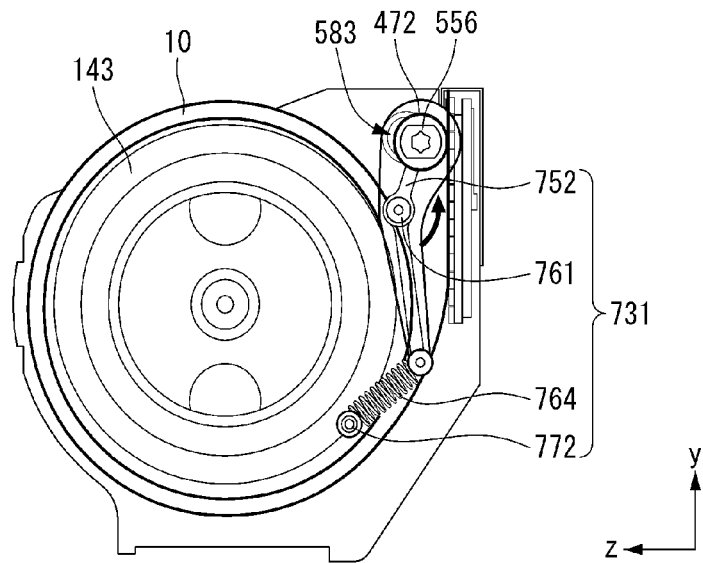
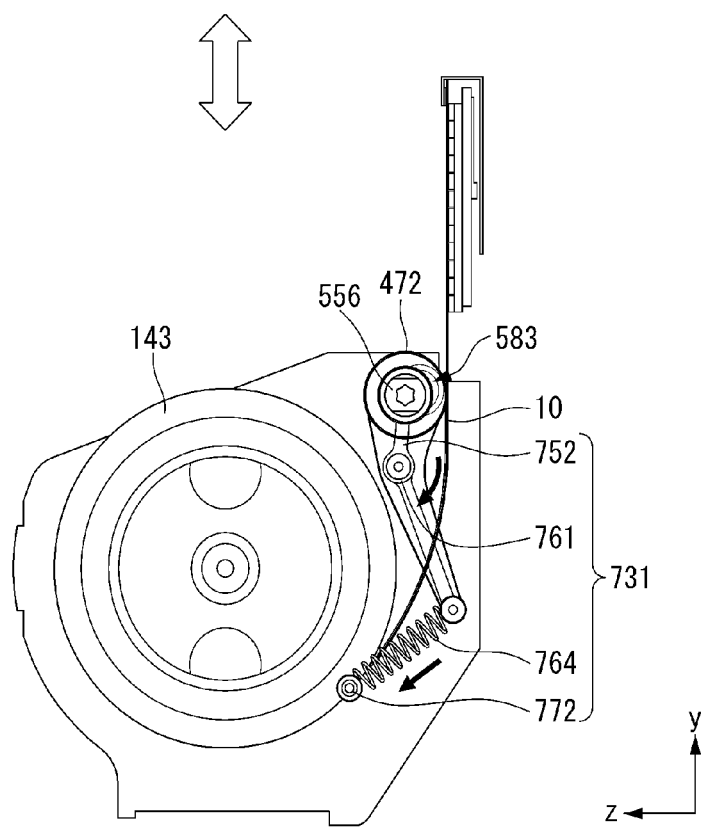

[FIG. 35]
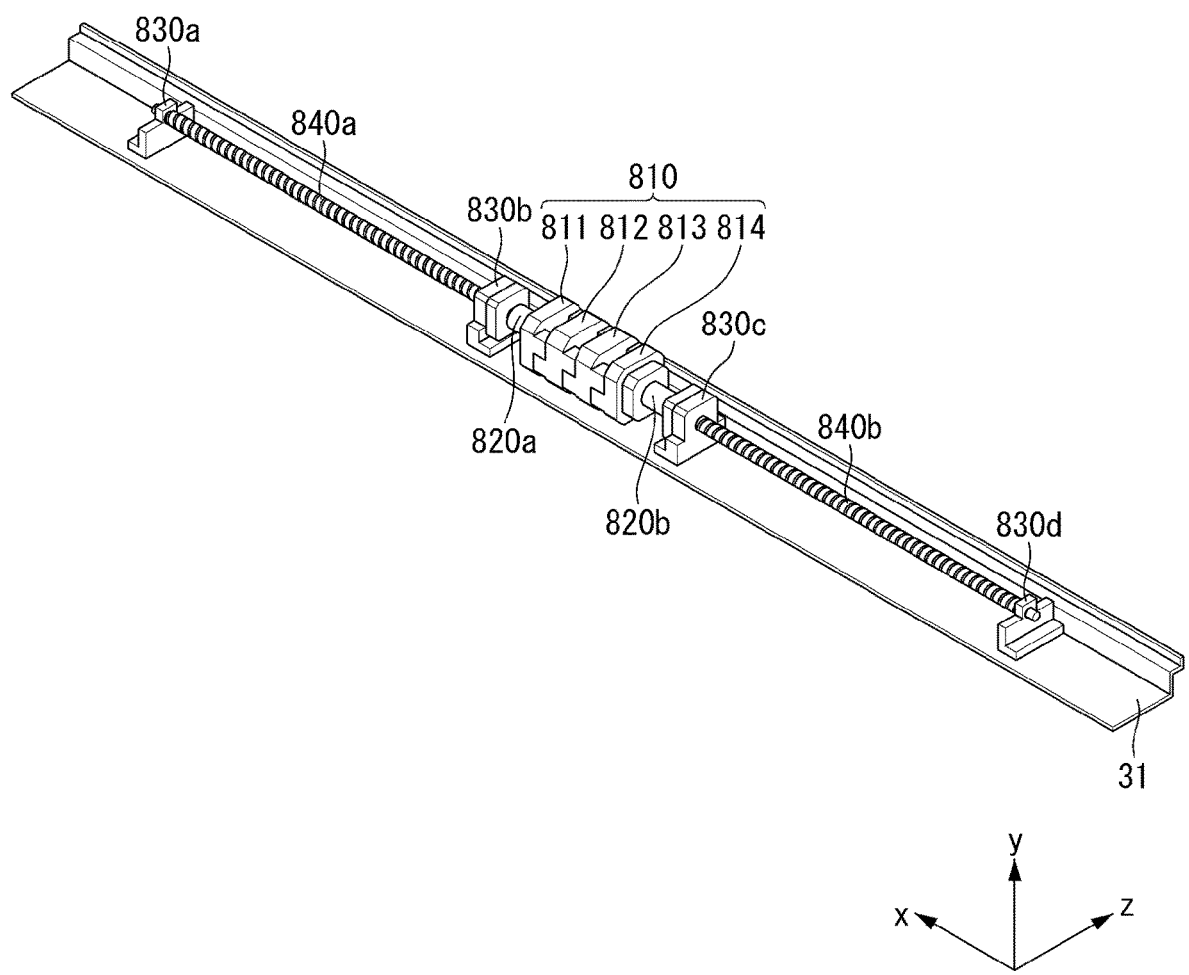

[FIG. 36]
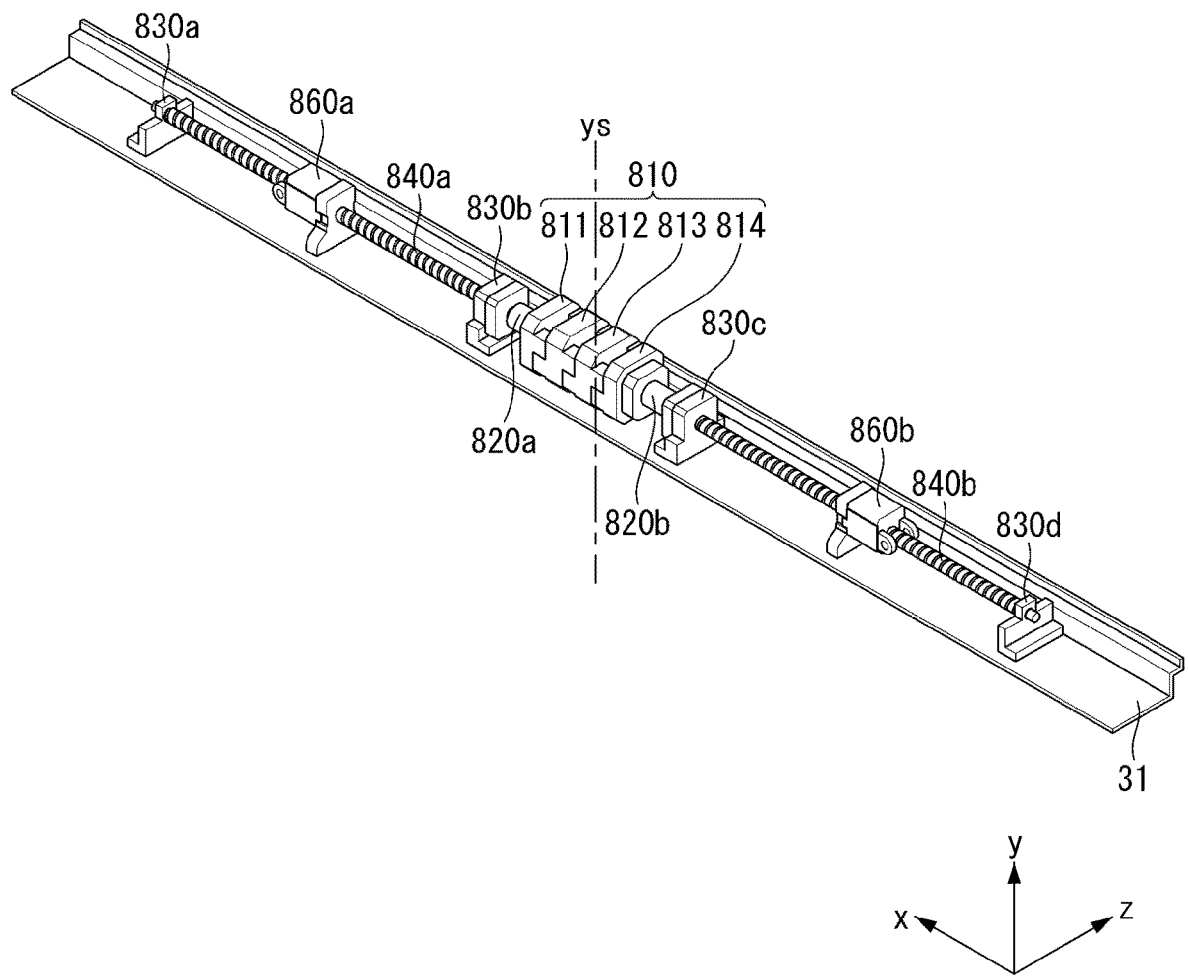

[FIG. 37]
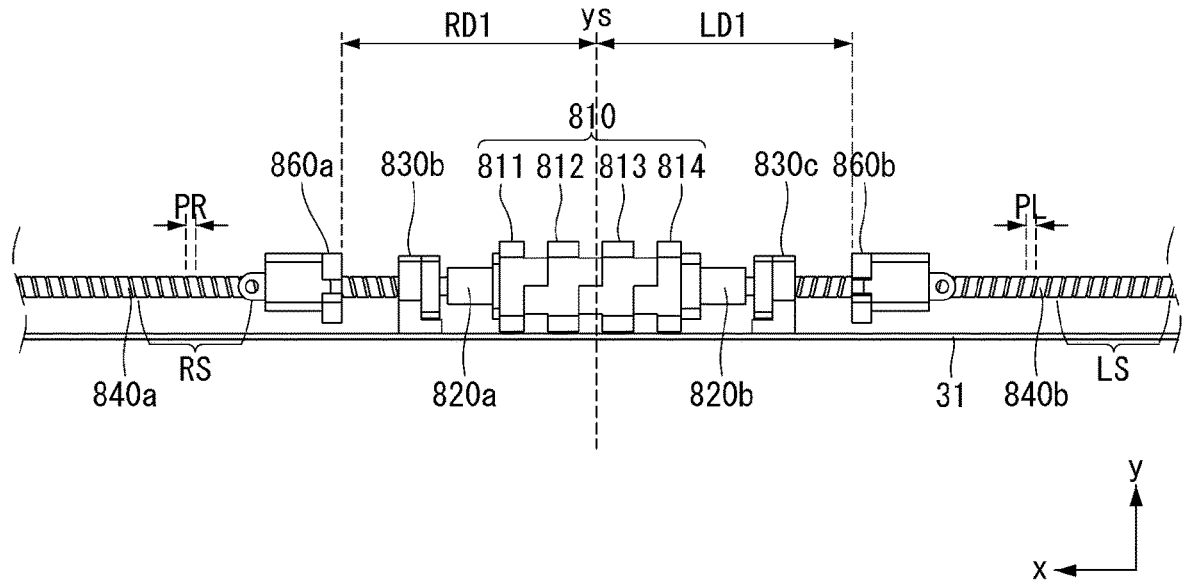
[FIG. 38]
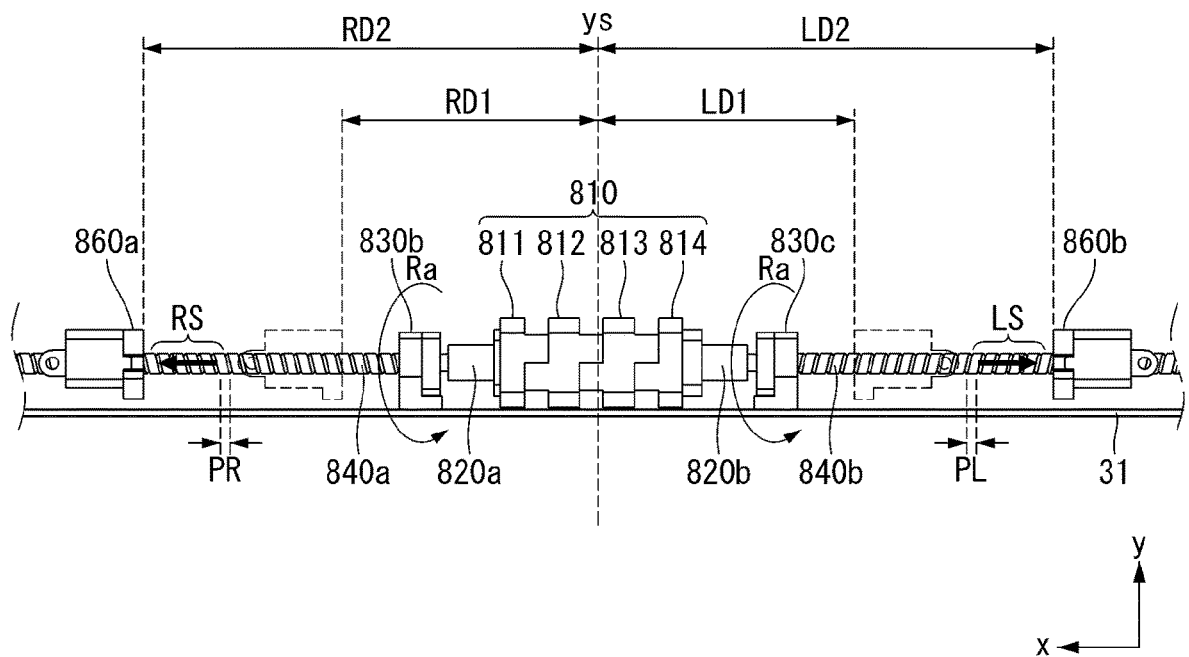

【FIG. 39】
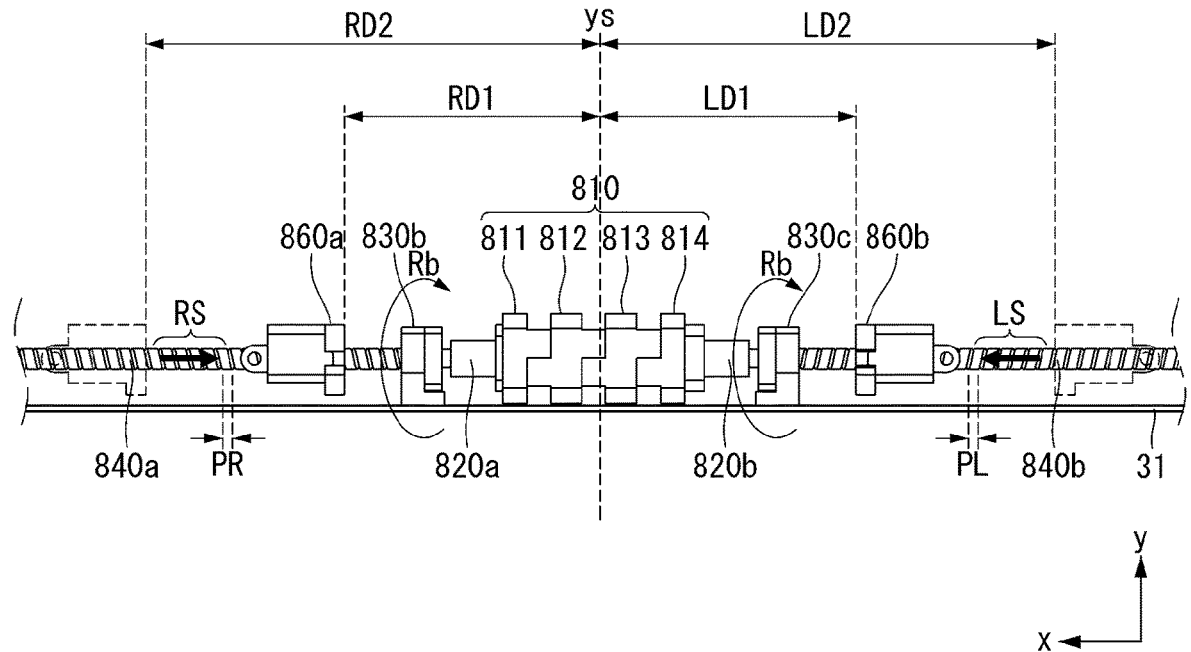
【FIG. 40】
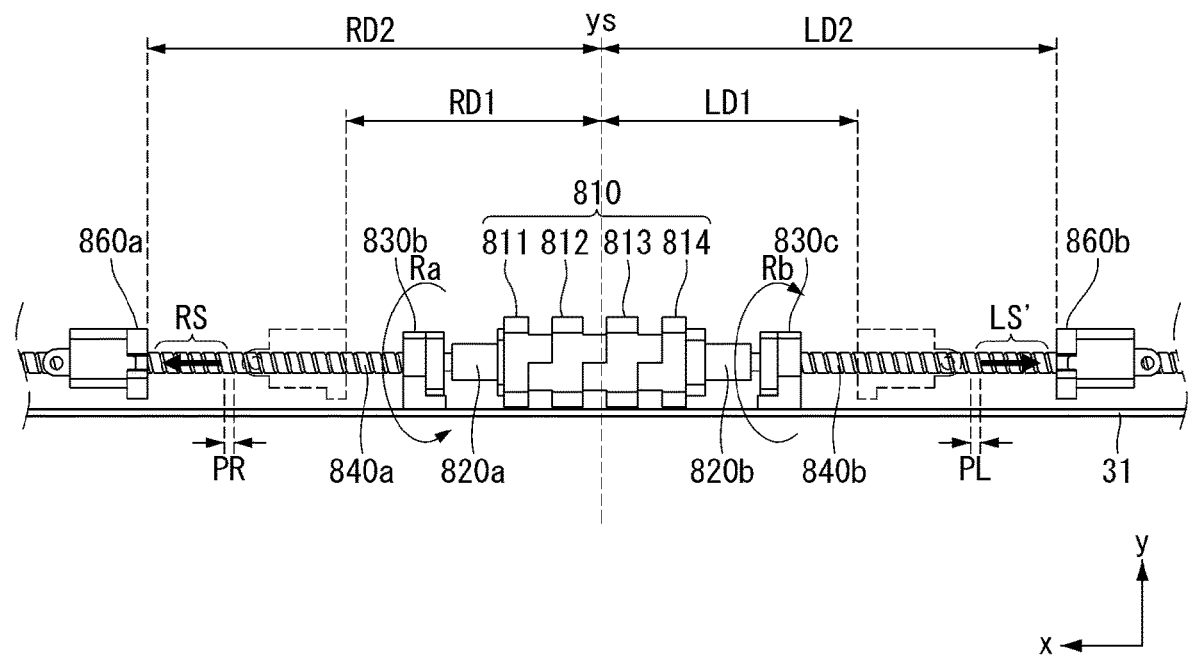

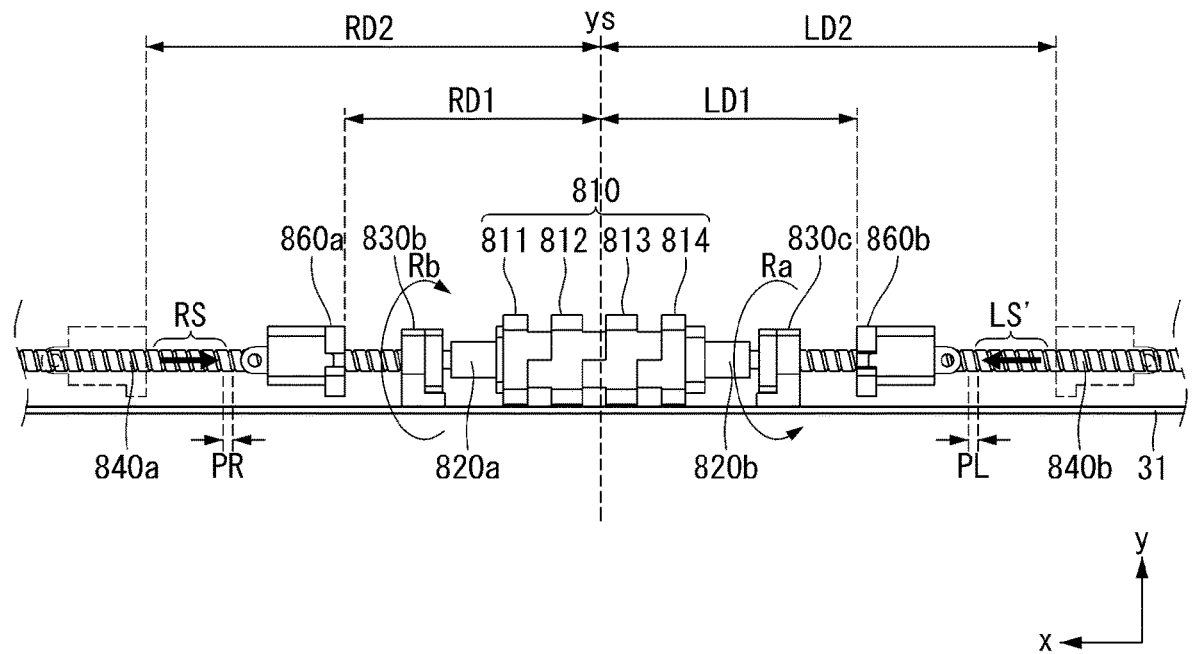
[FIG. 41]

[FIG. 42]
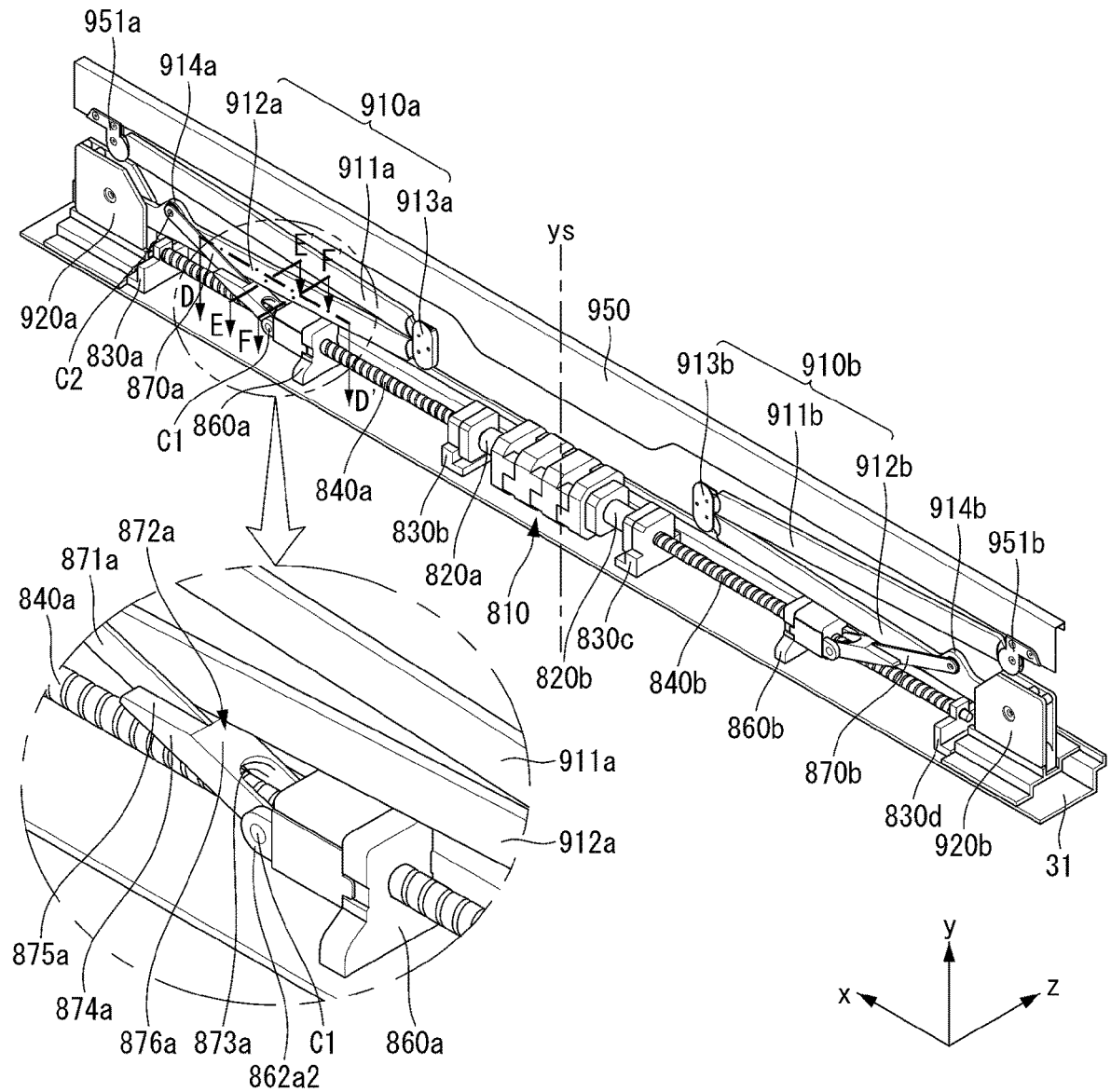

[FIG. 43]
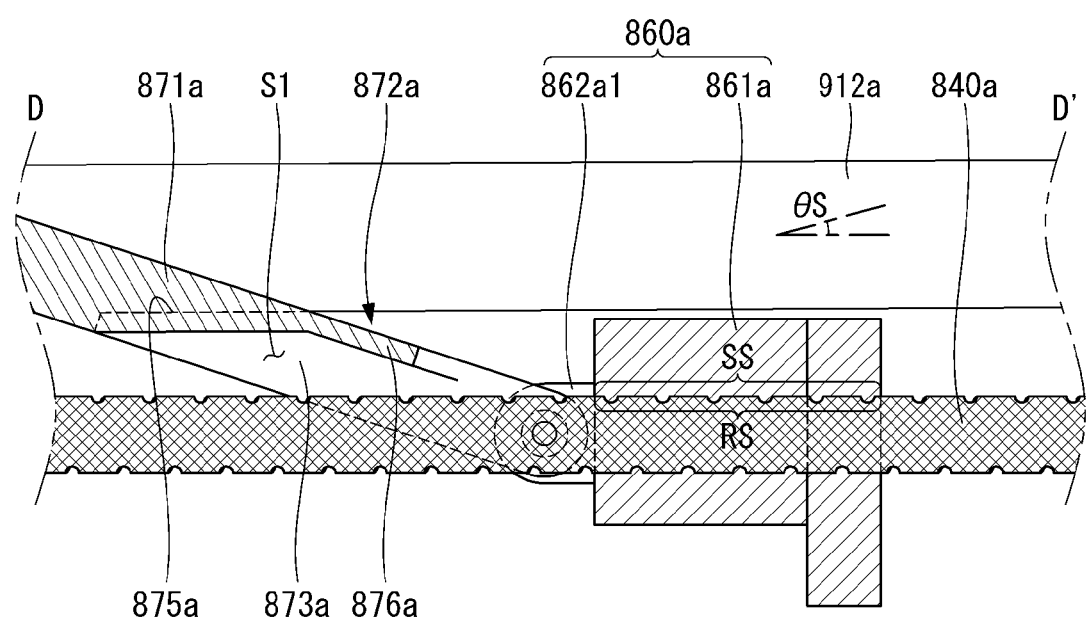

[FIG. 44a]
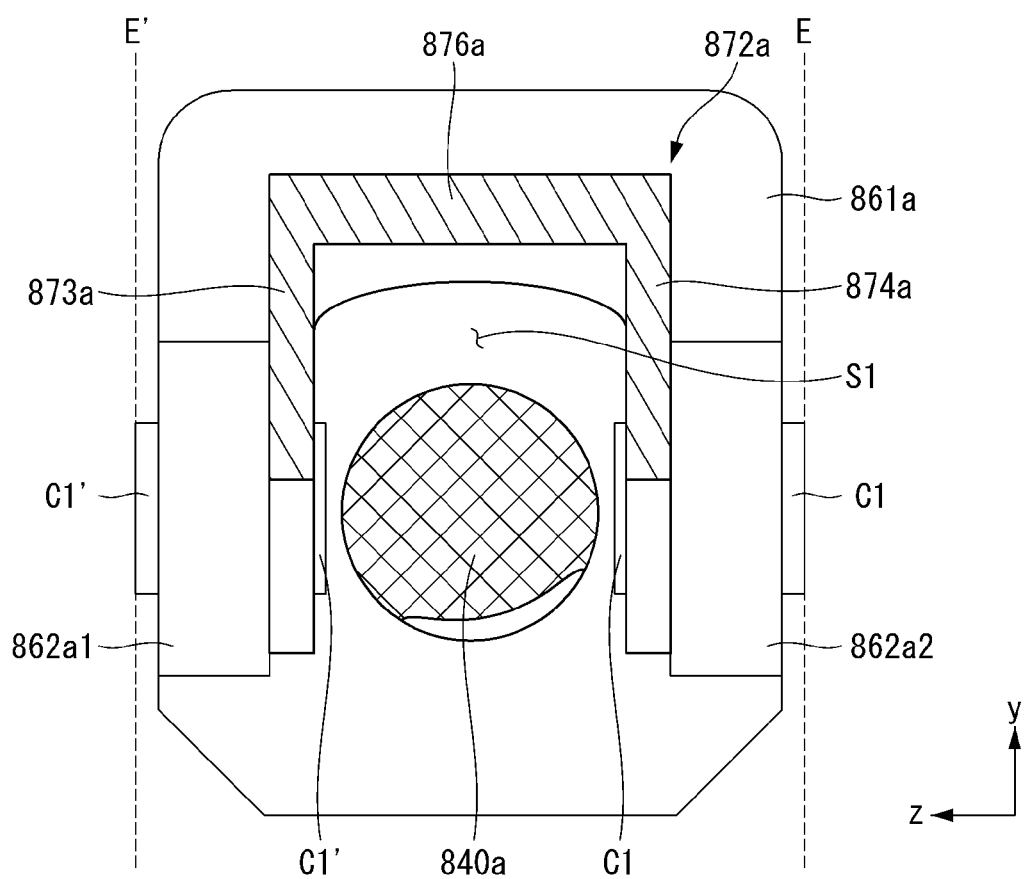

[FIG. 44b]
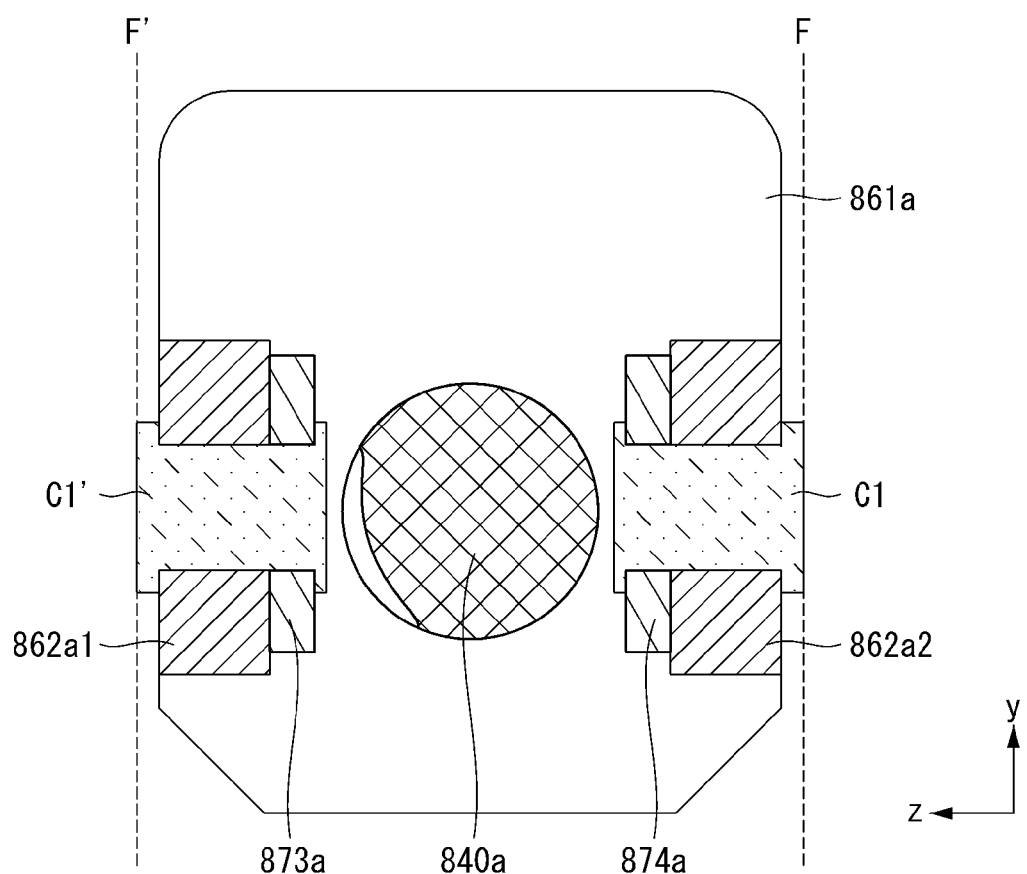

[FIG. 45]
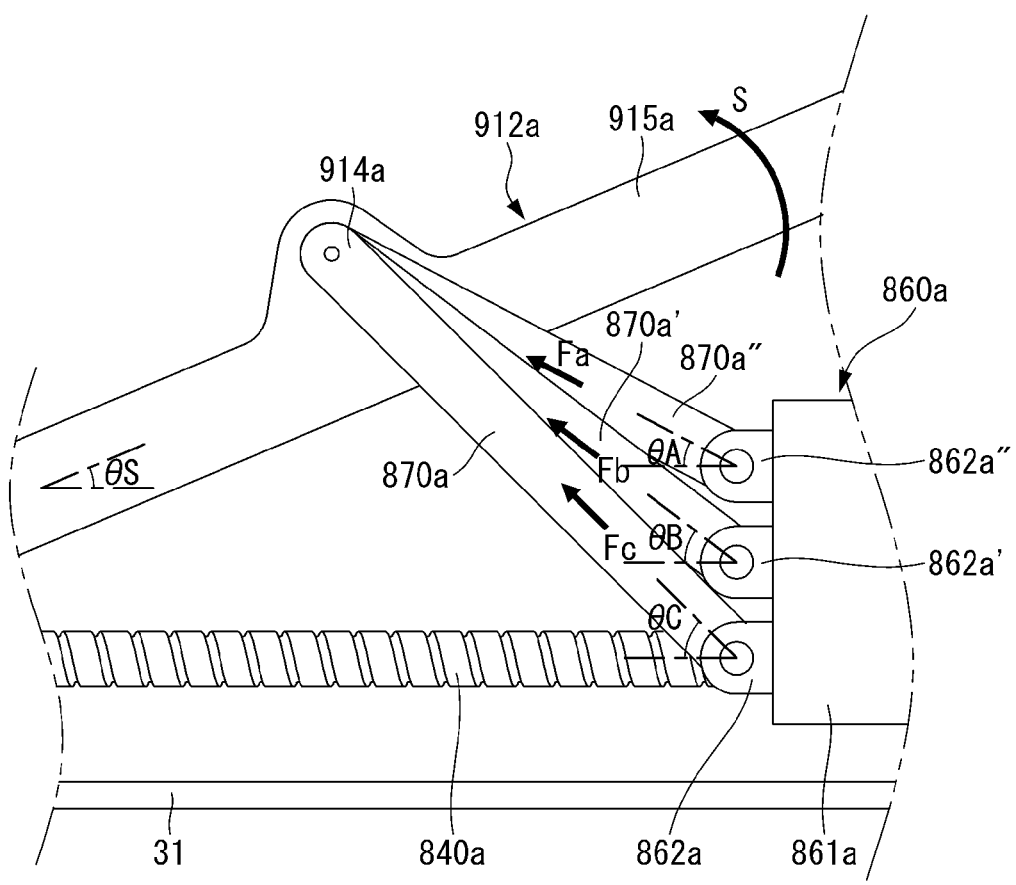

【FIG. 46】
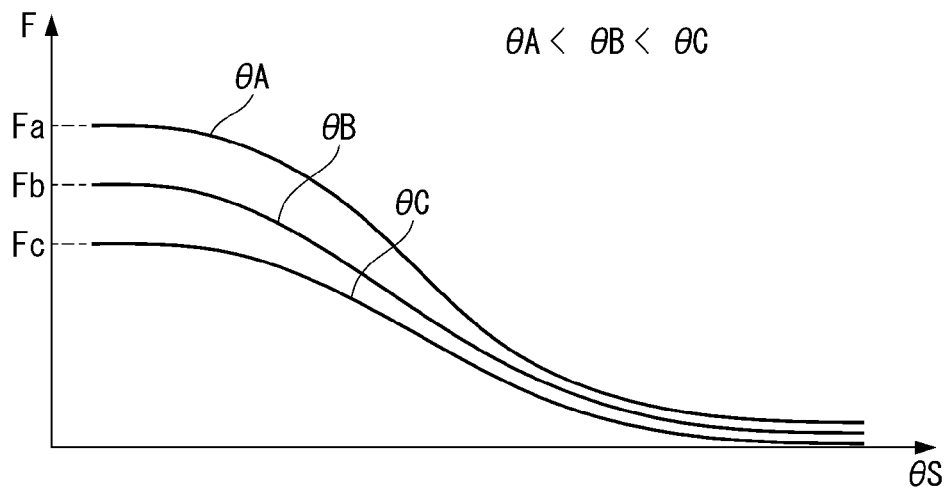
【FIG. 47】
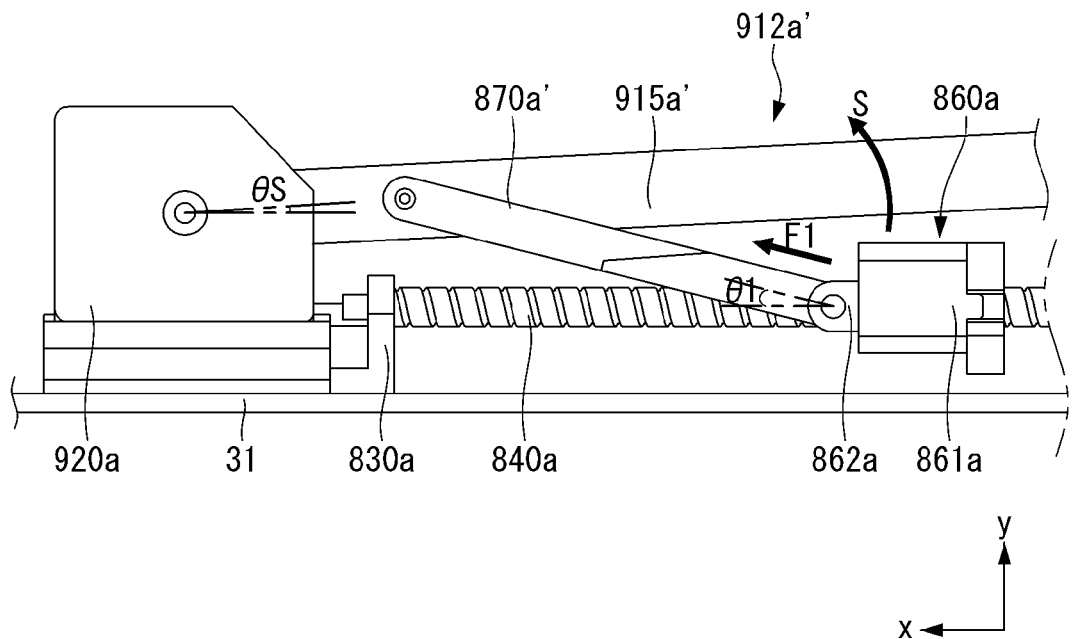

[FIG. 48]
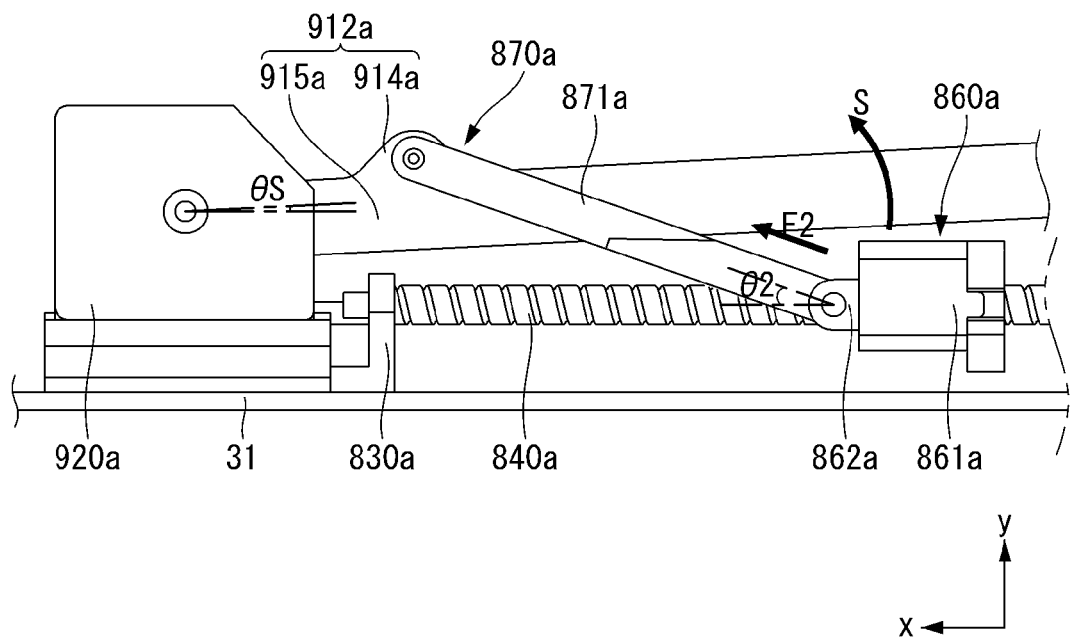
[FIG. 49]
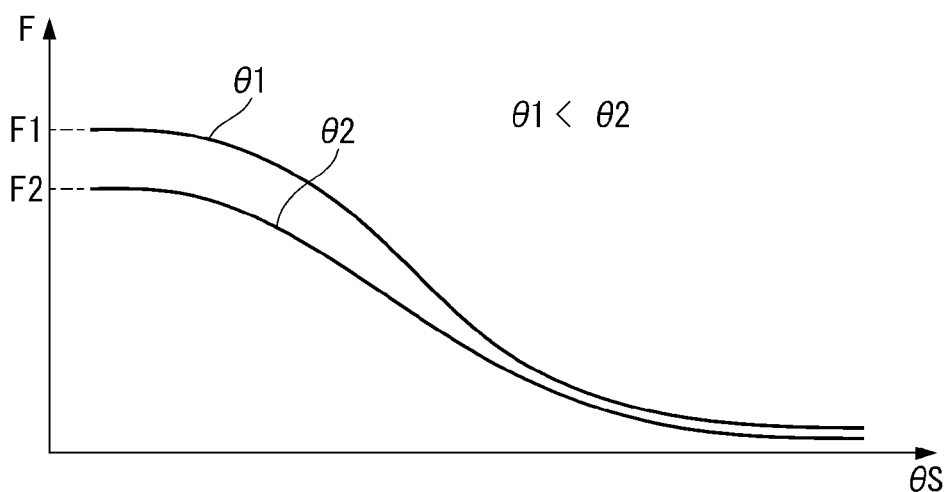

[FIG. 50]
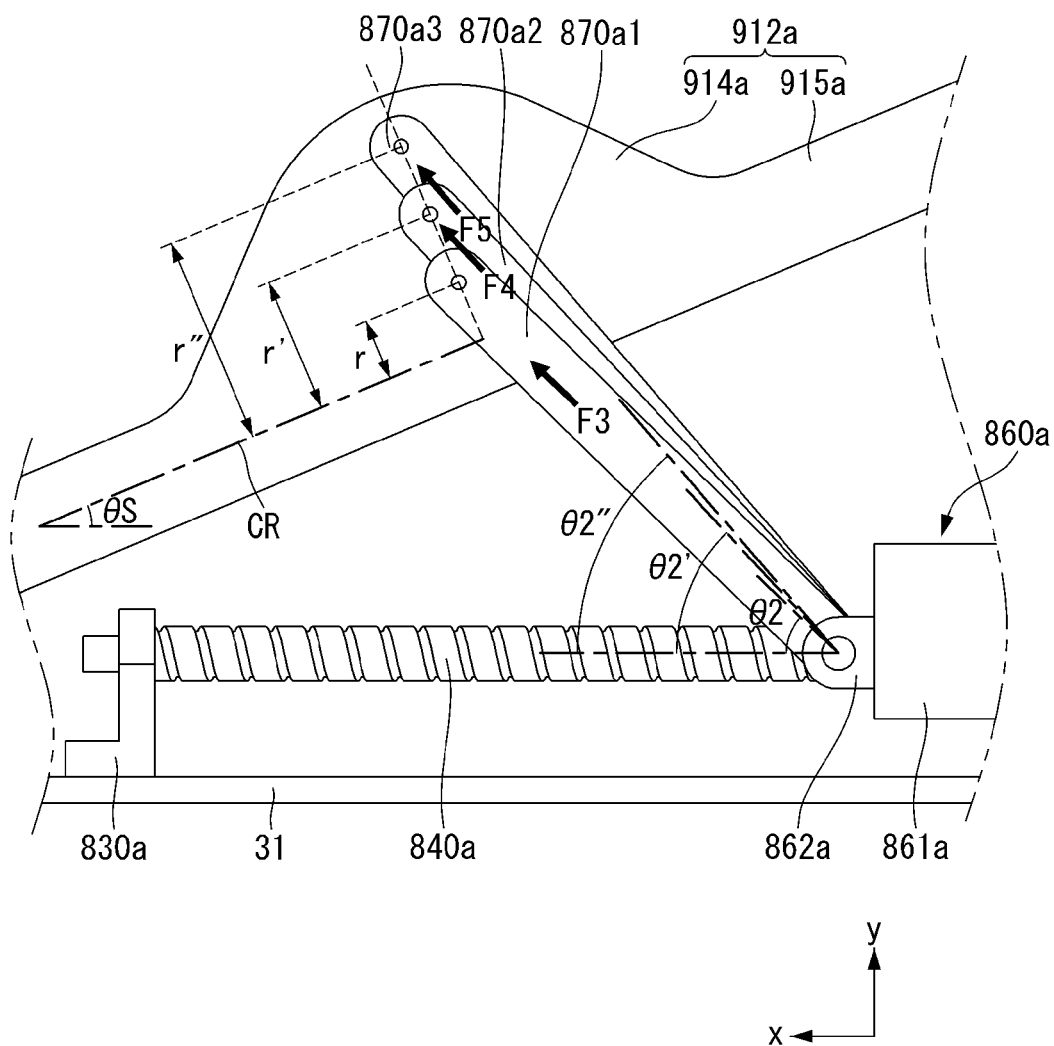

[FIG. 51]
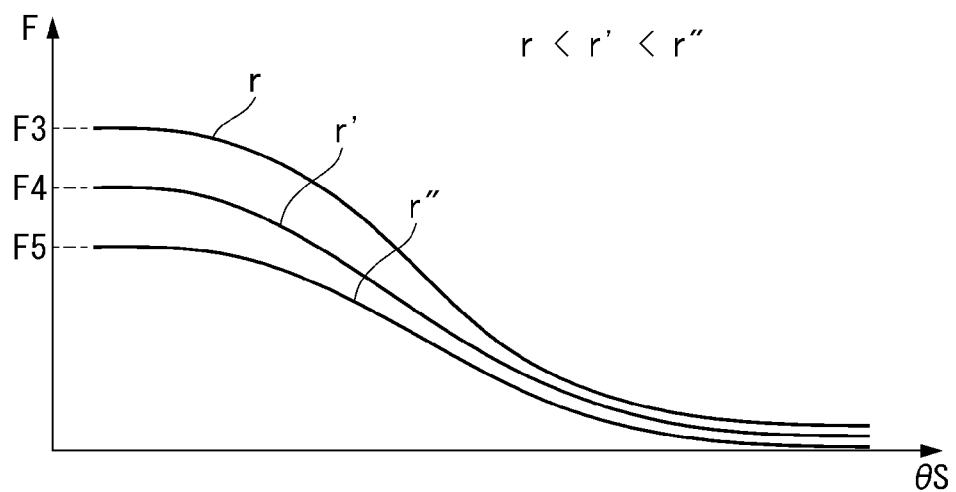

[FIG. 52]
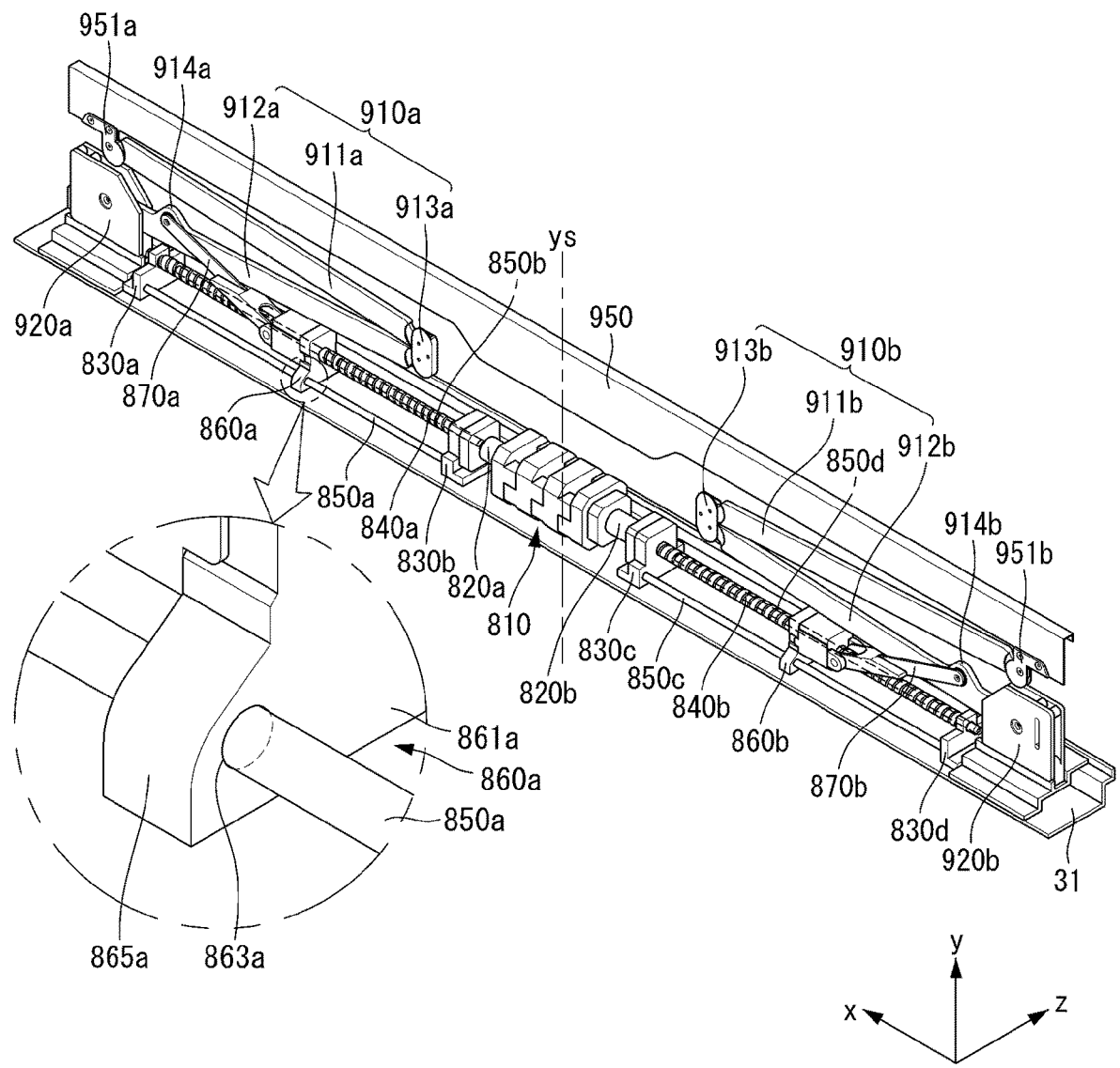

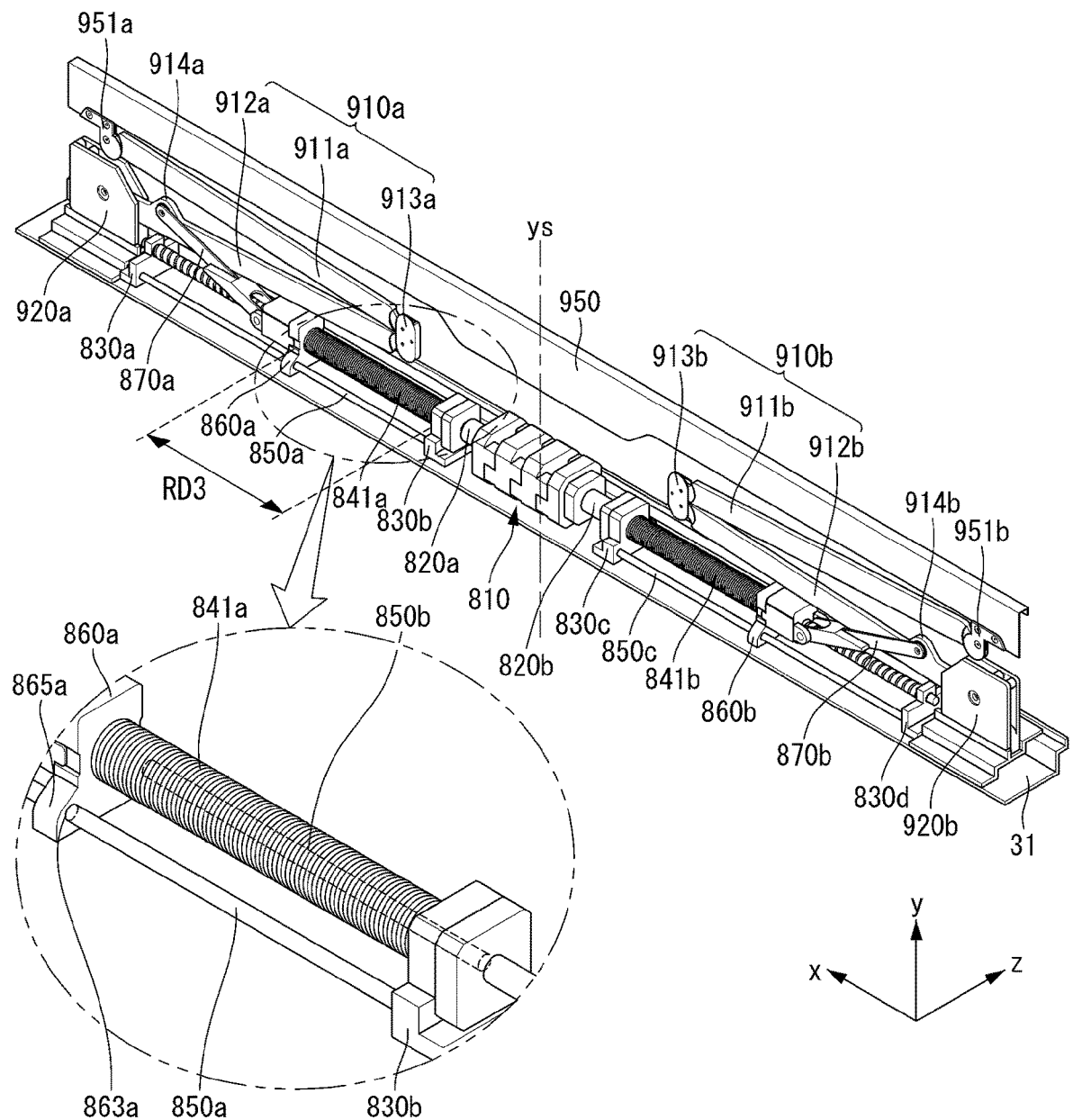
[FIG. 53]

[FIG. 54]
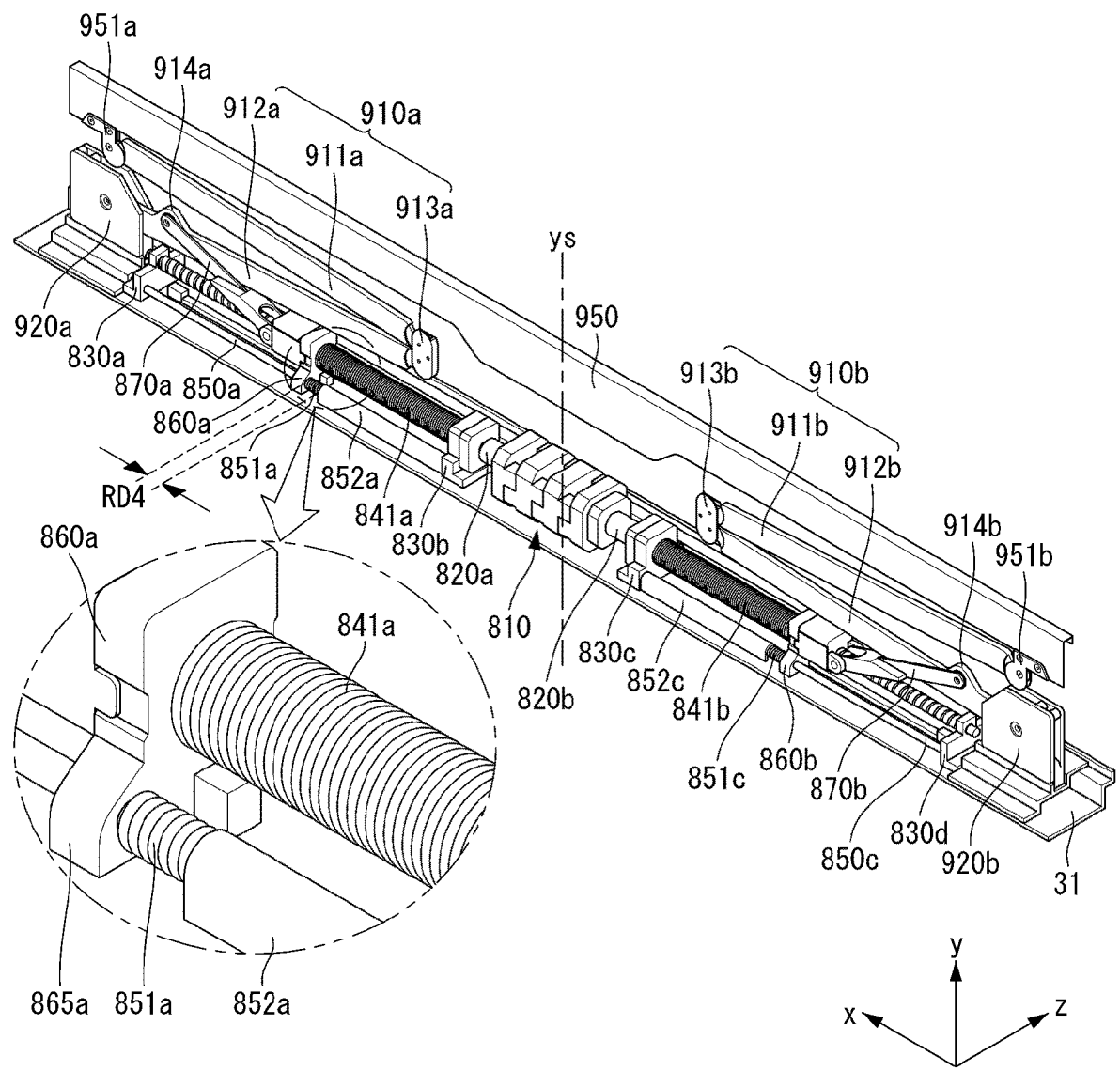

[FIG. 55]
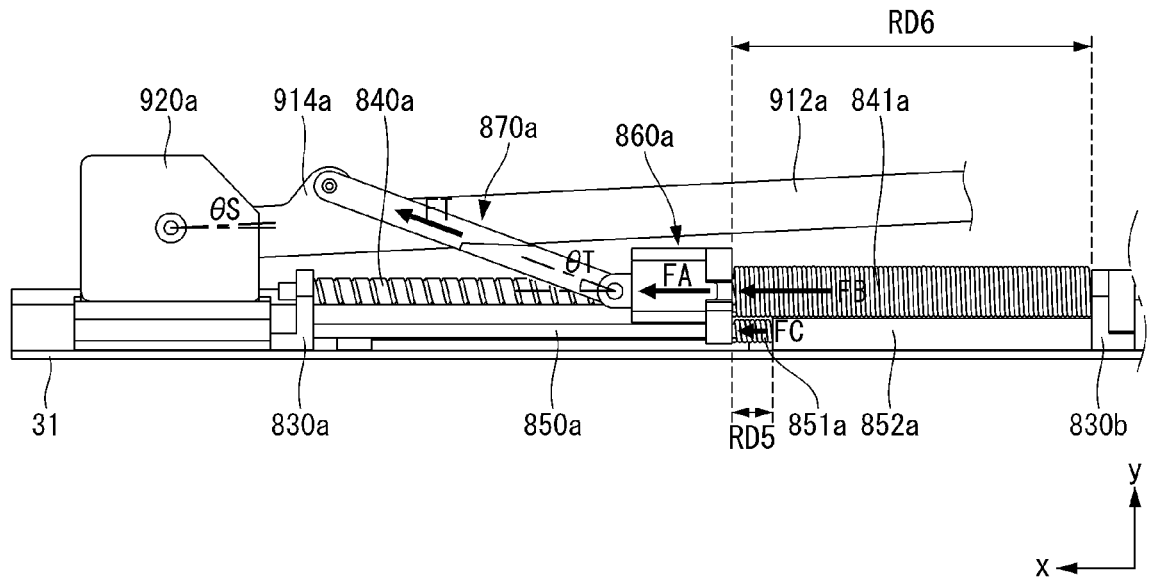
[FIG. 56]
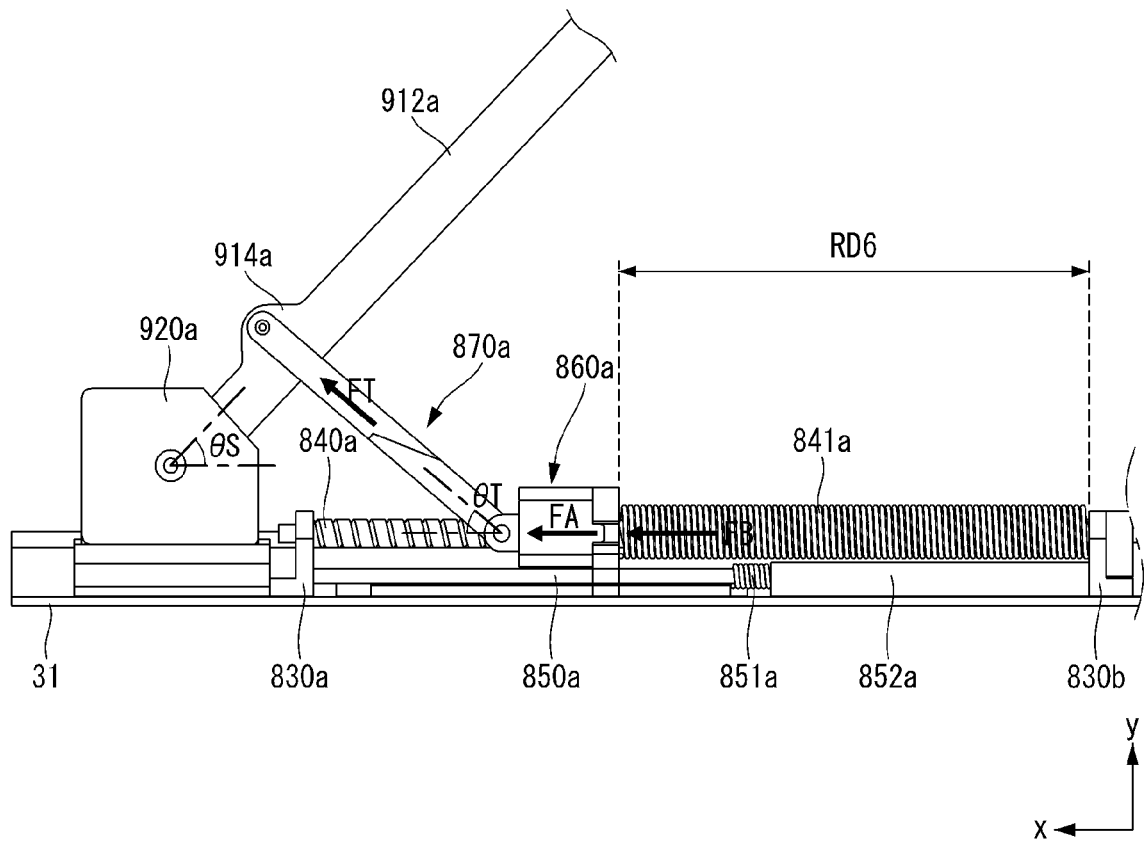

[FIG. 57]
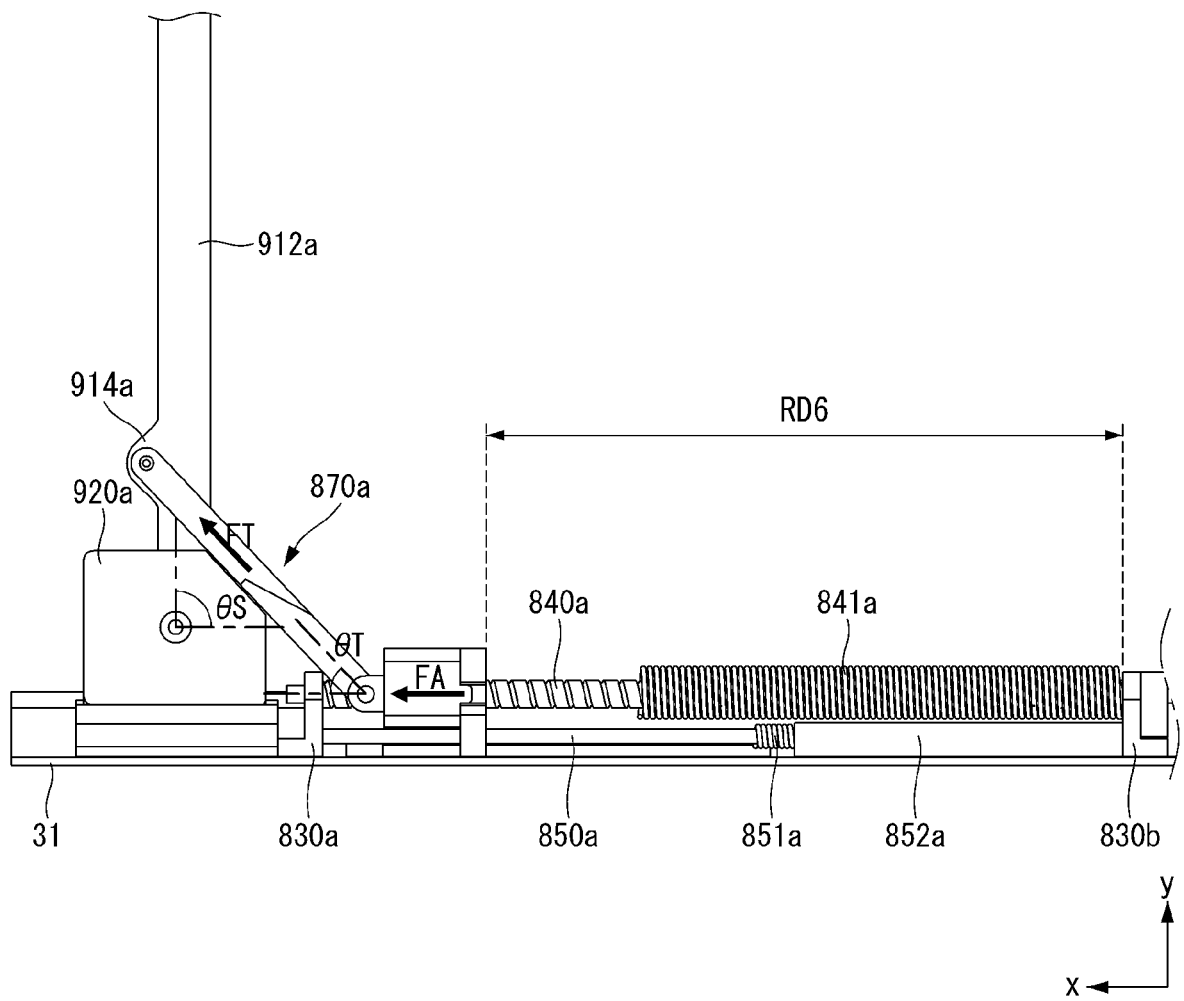

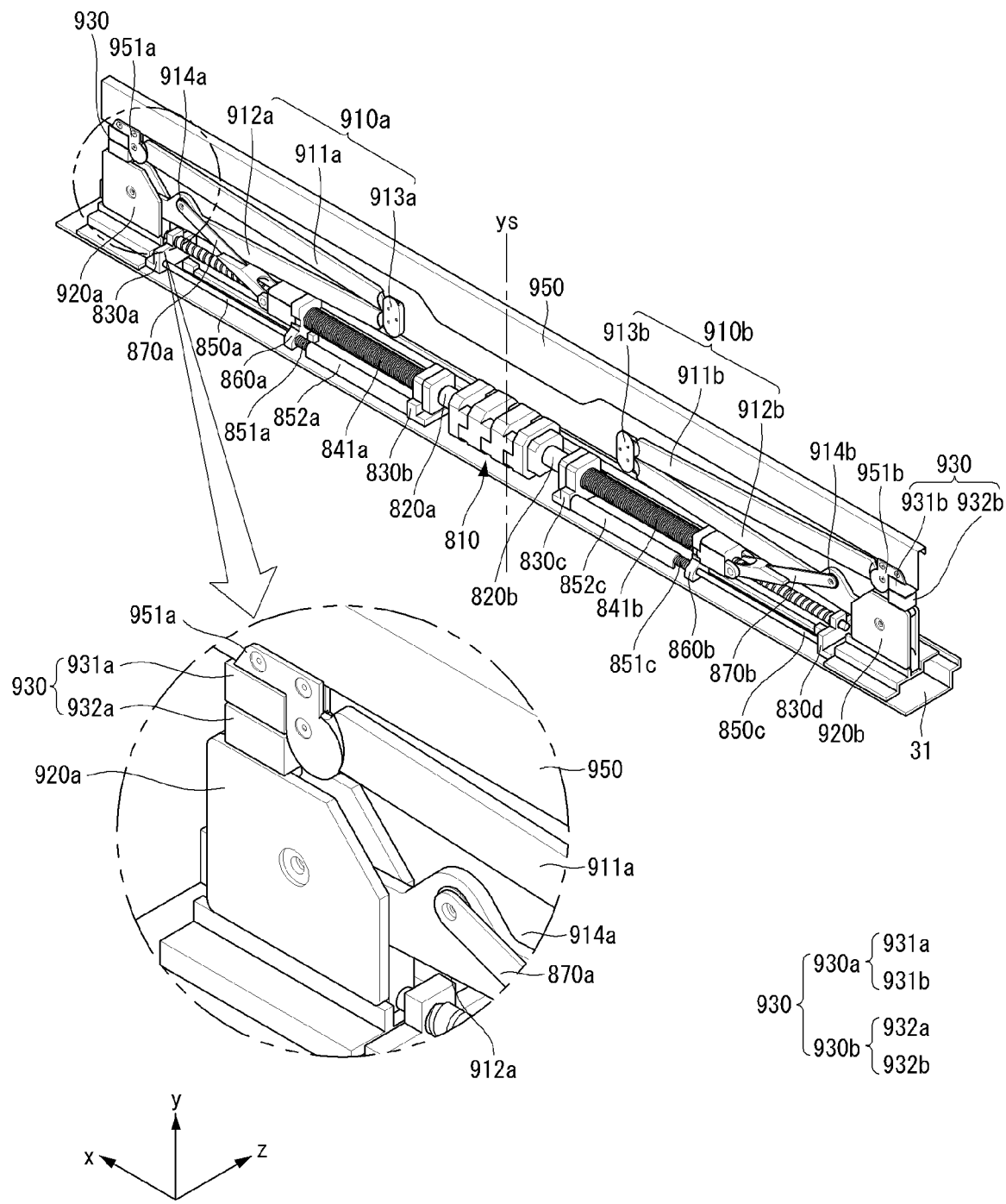
[FIG. 58]

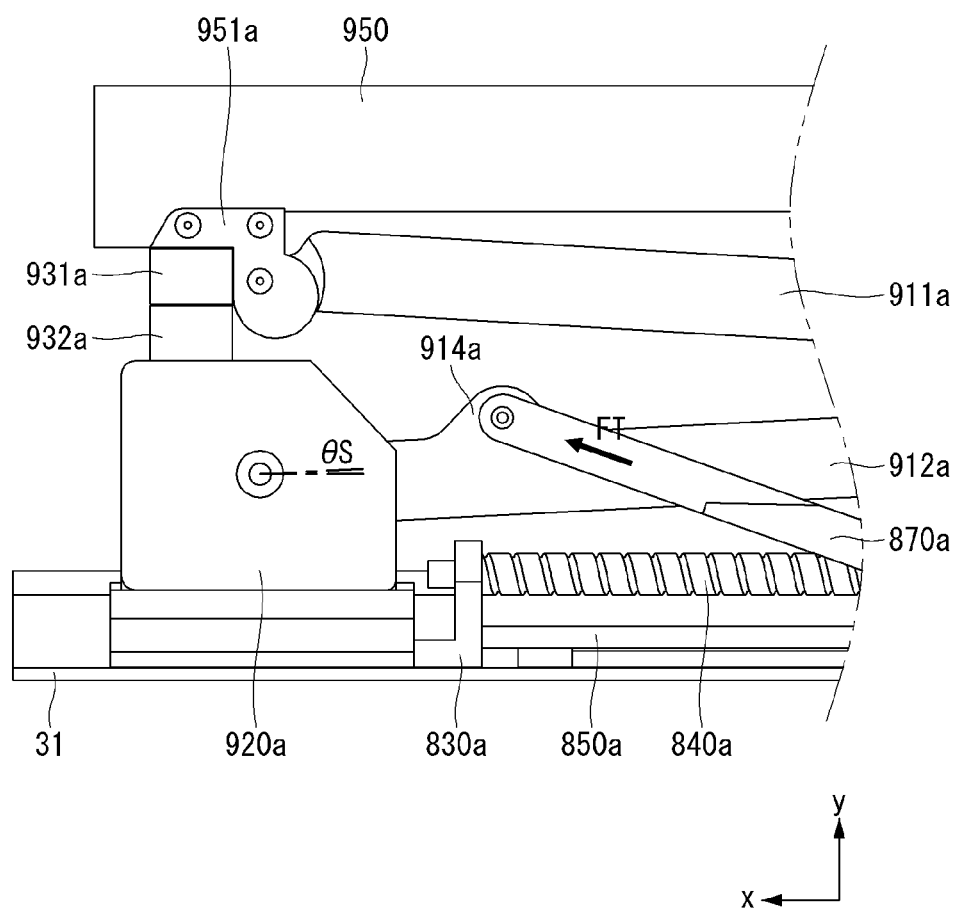
[FIG. 59]

[FIG. 60]
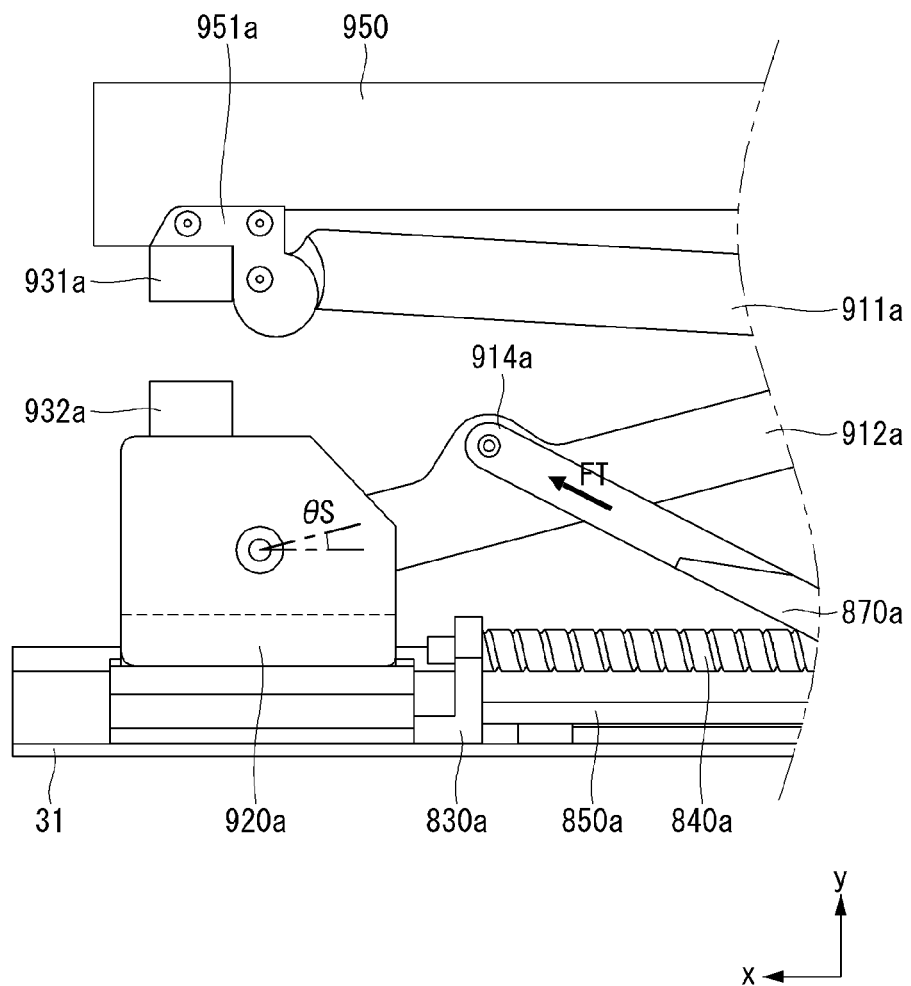

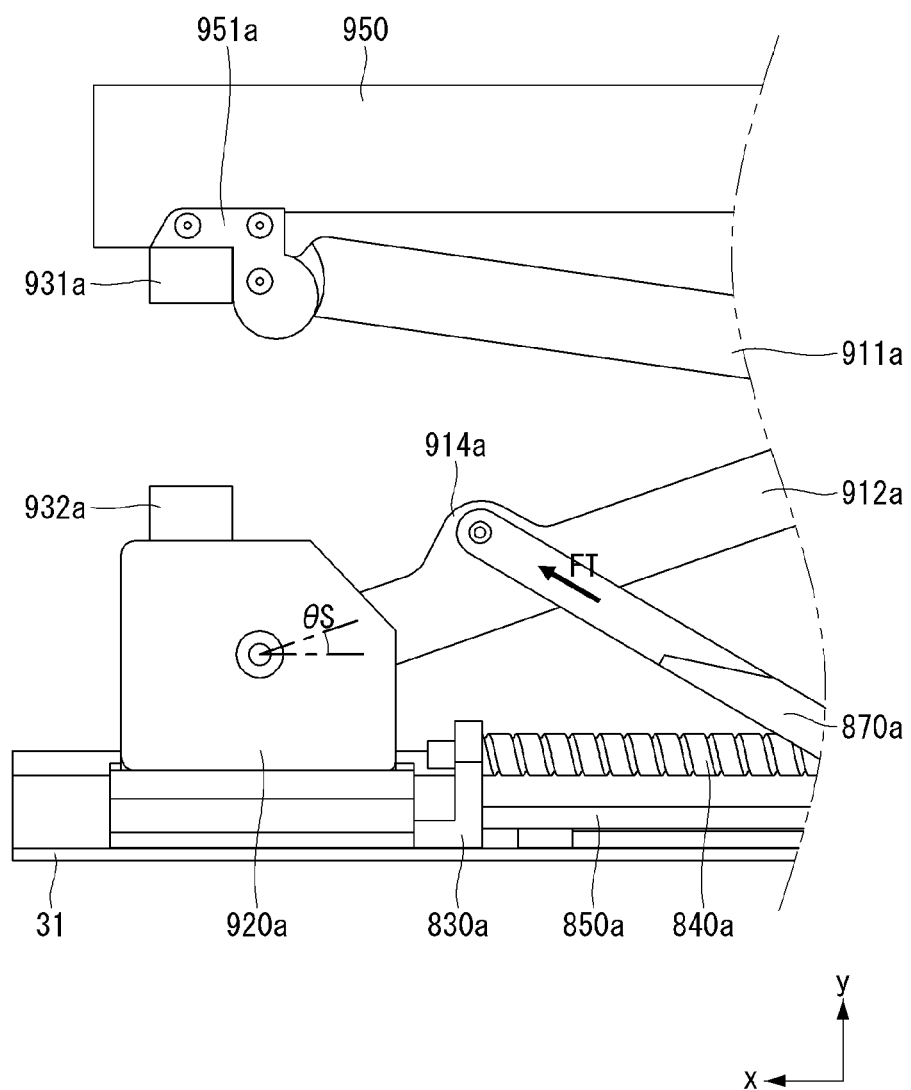
[FIG. 61]

[FIG. 62]
Roll up
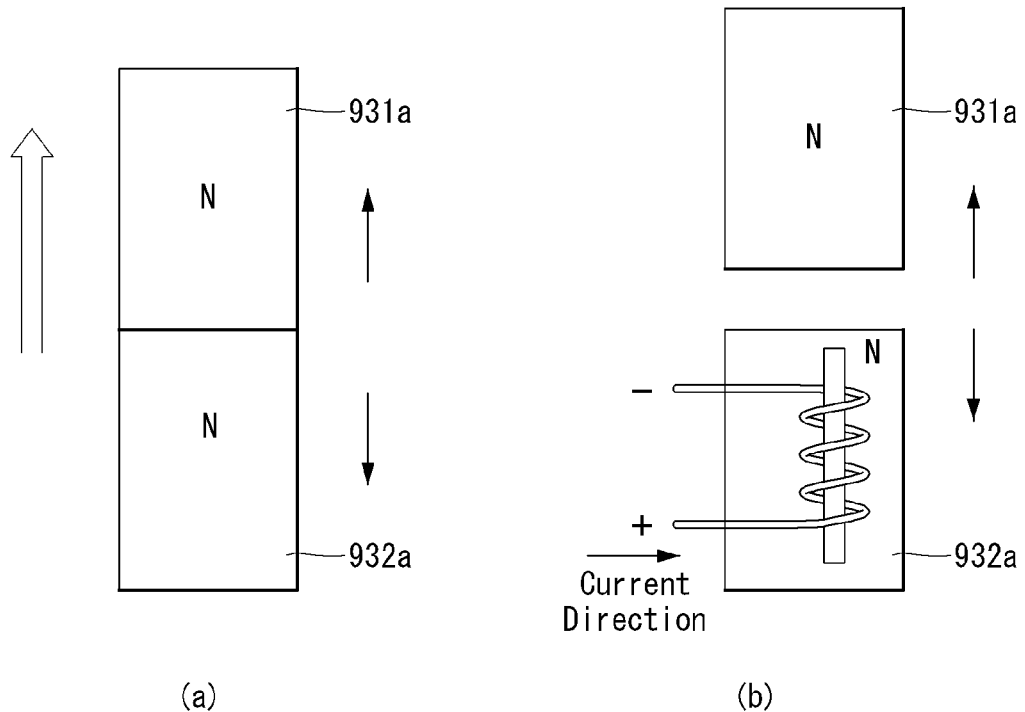

[FIG. 63]
Roll up
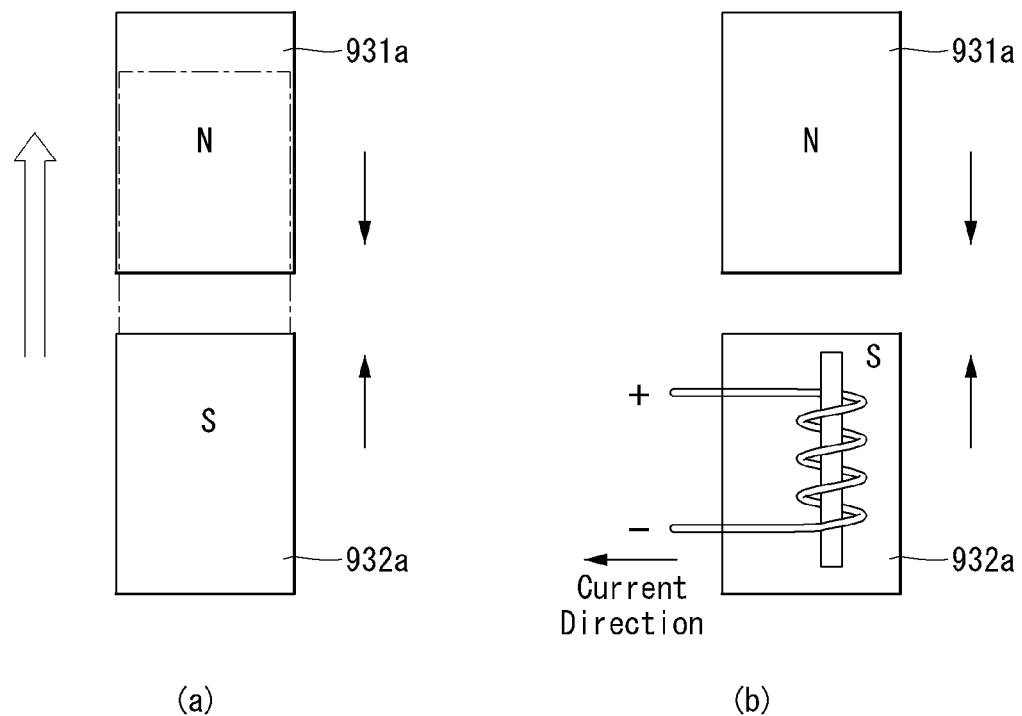

[FIG. 64]
Roll down
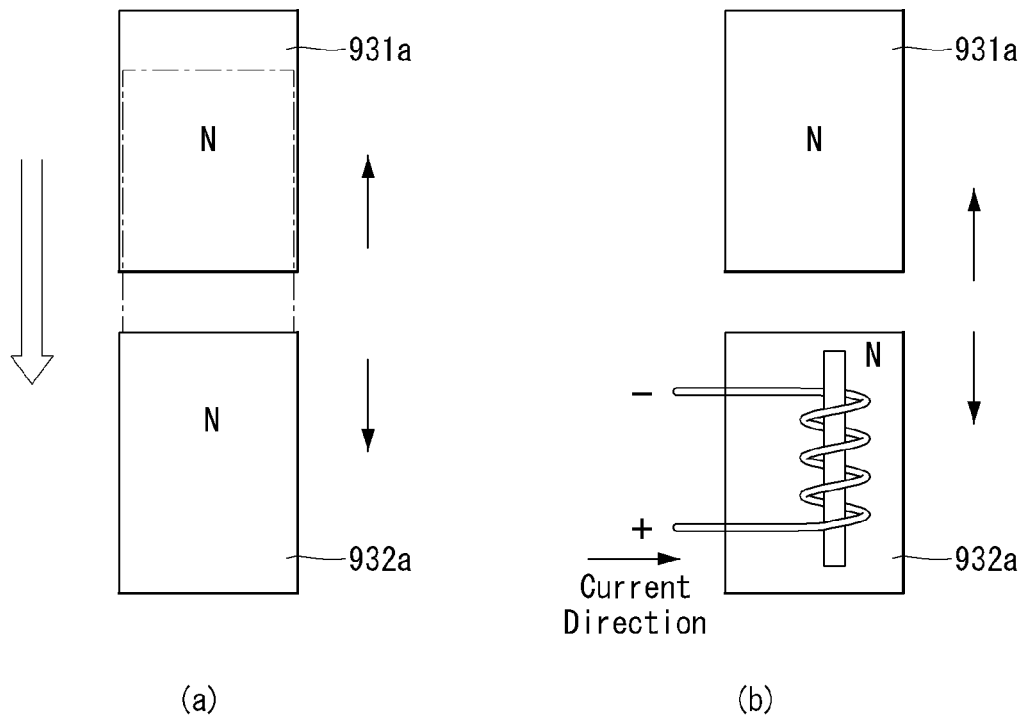
(a)　　　　　　　　　　　　(b)

[FIG. 65]
Roll down
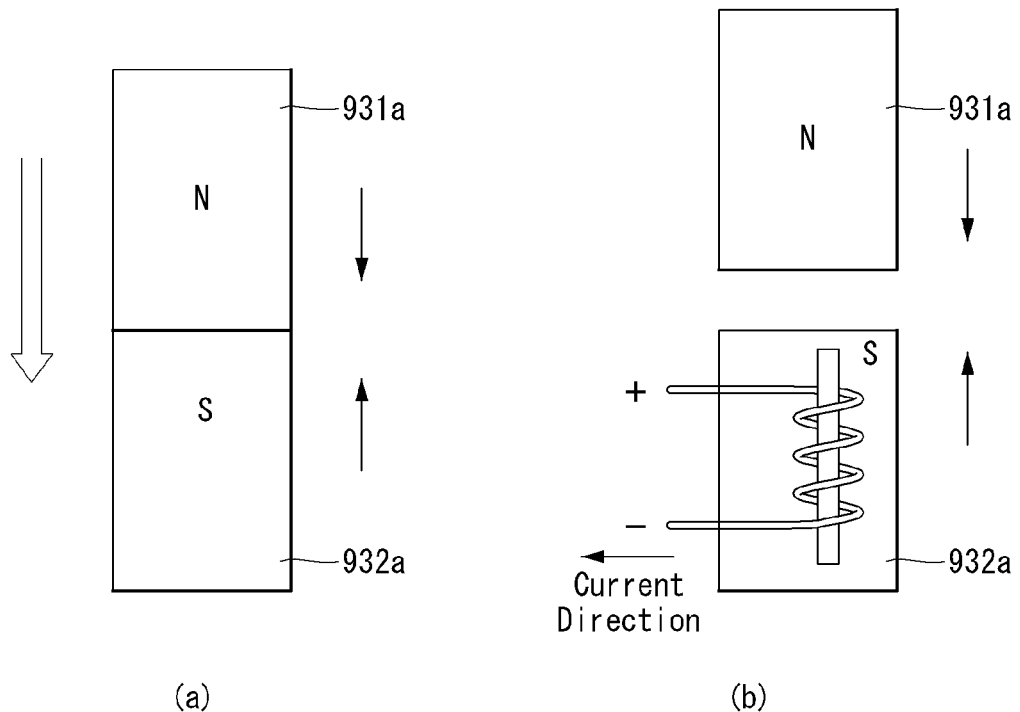
(a)　　　　　　　　　　　　(b)

[FIG. 66]
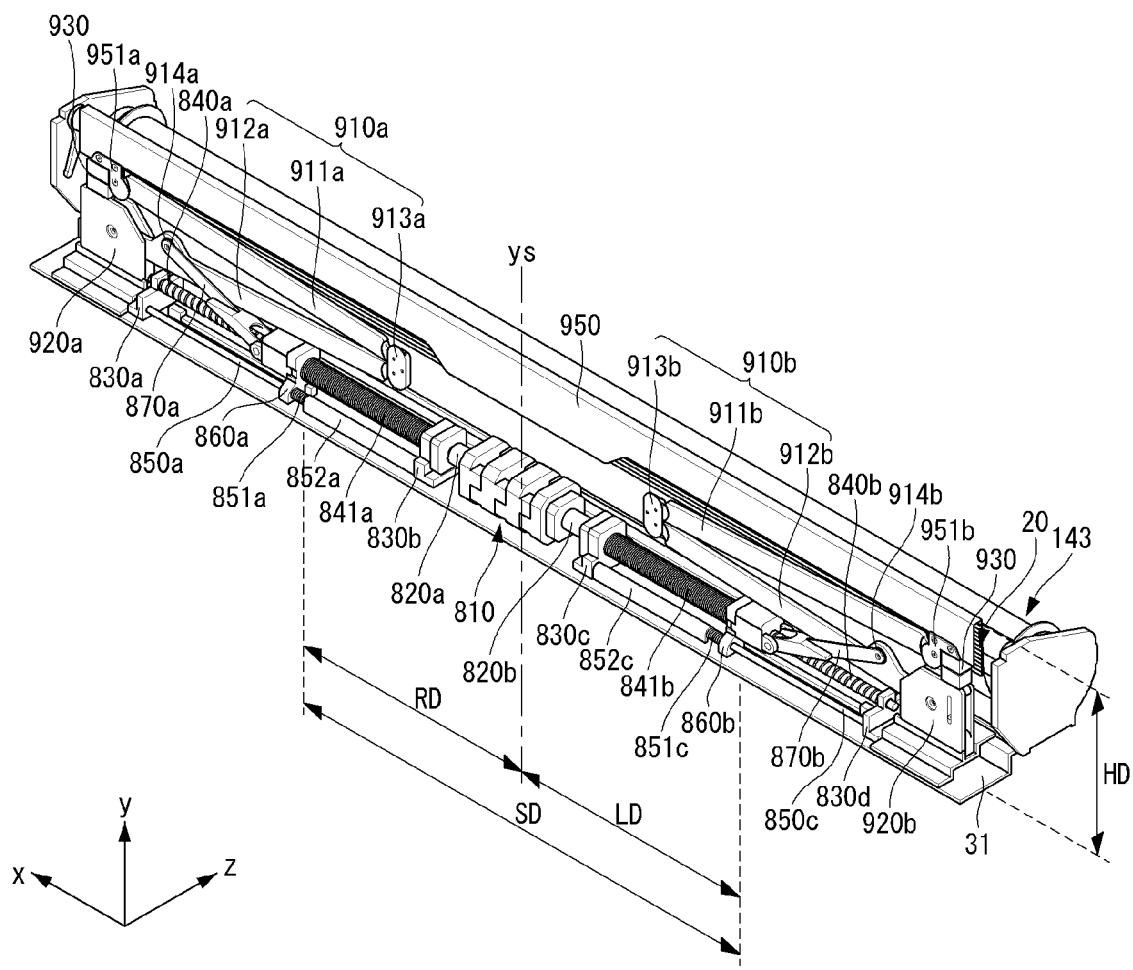

[FIG. 67]
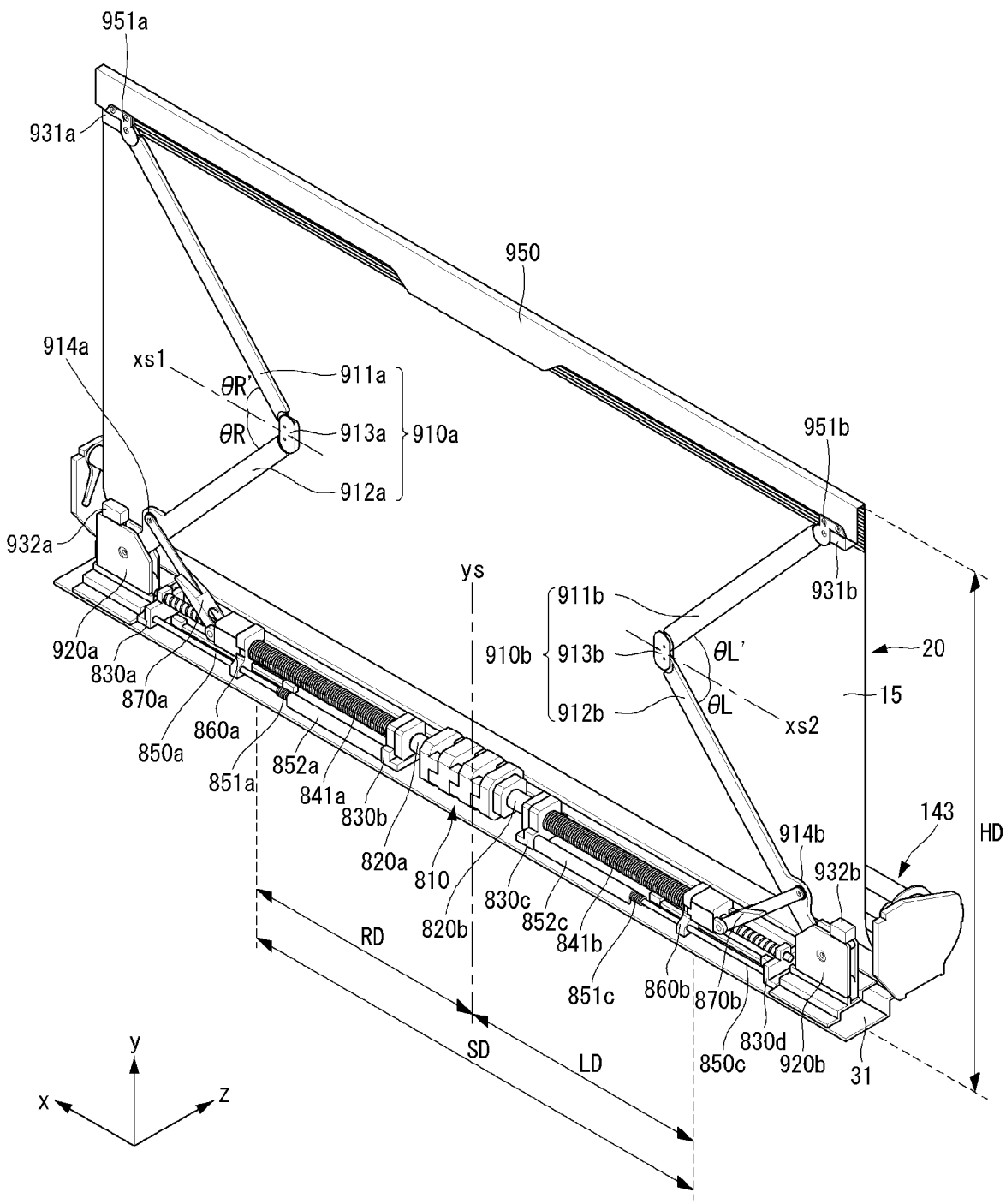

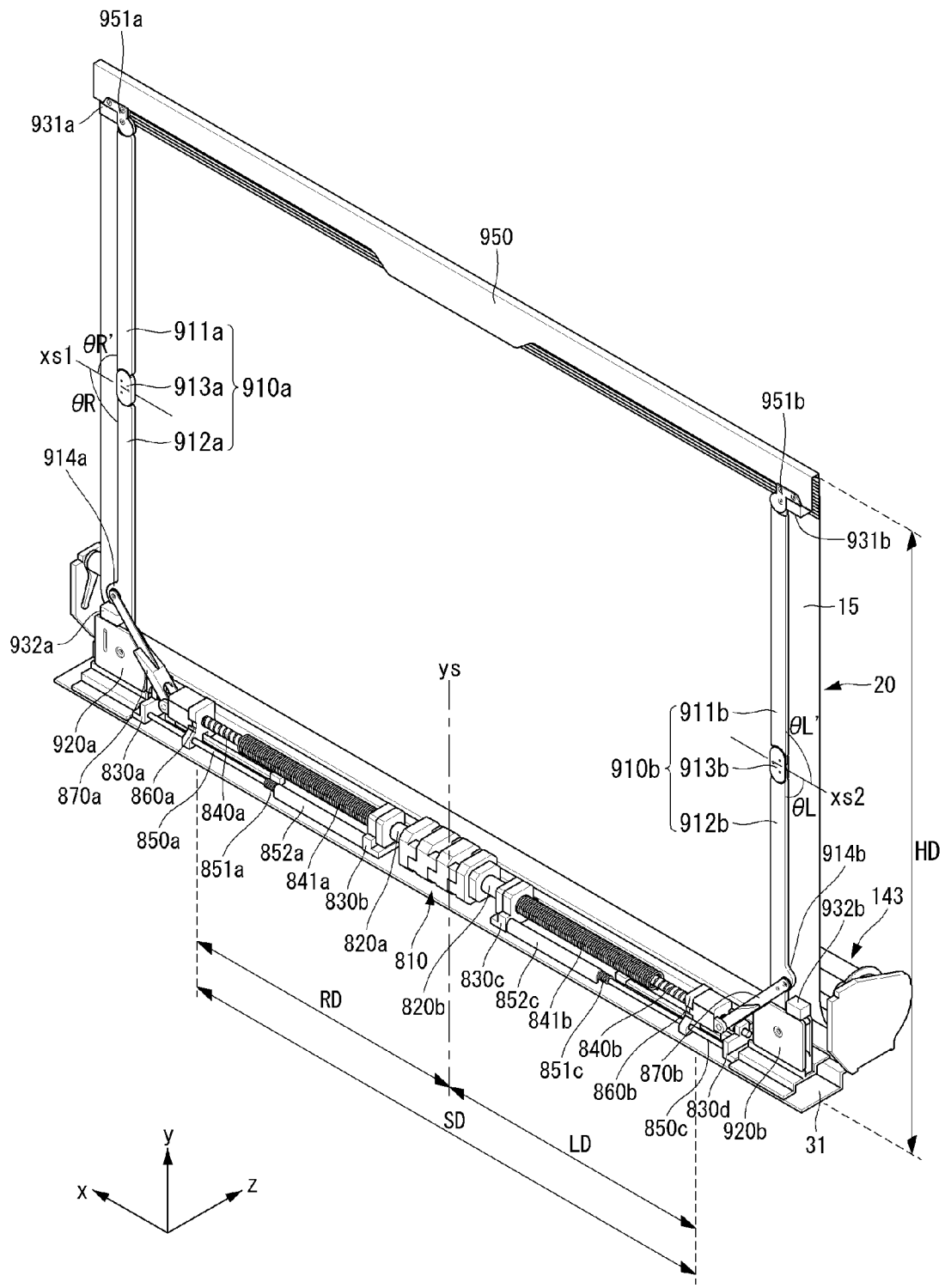
[FIG. 68]

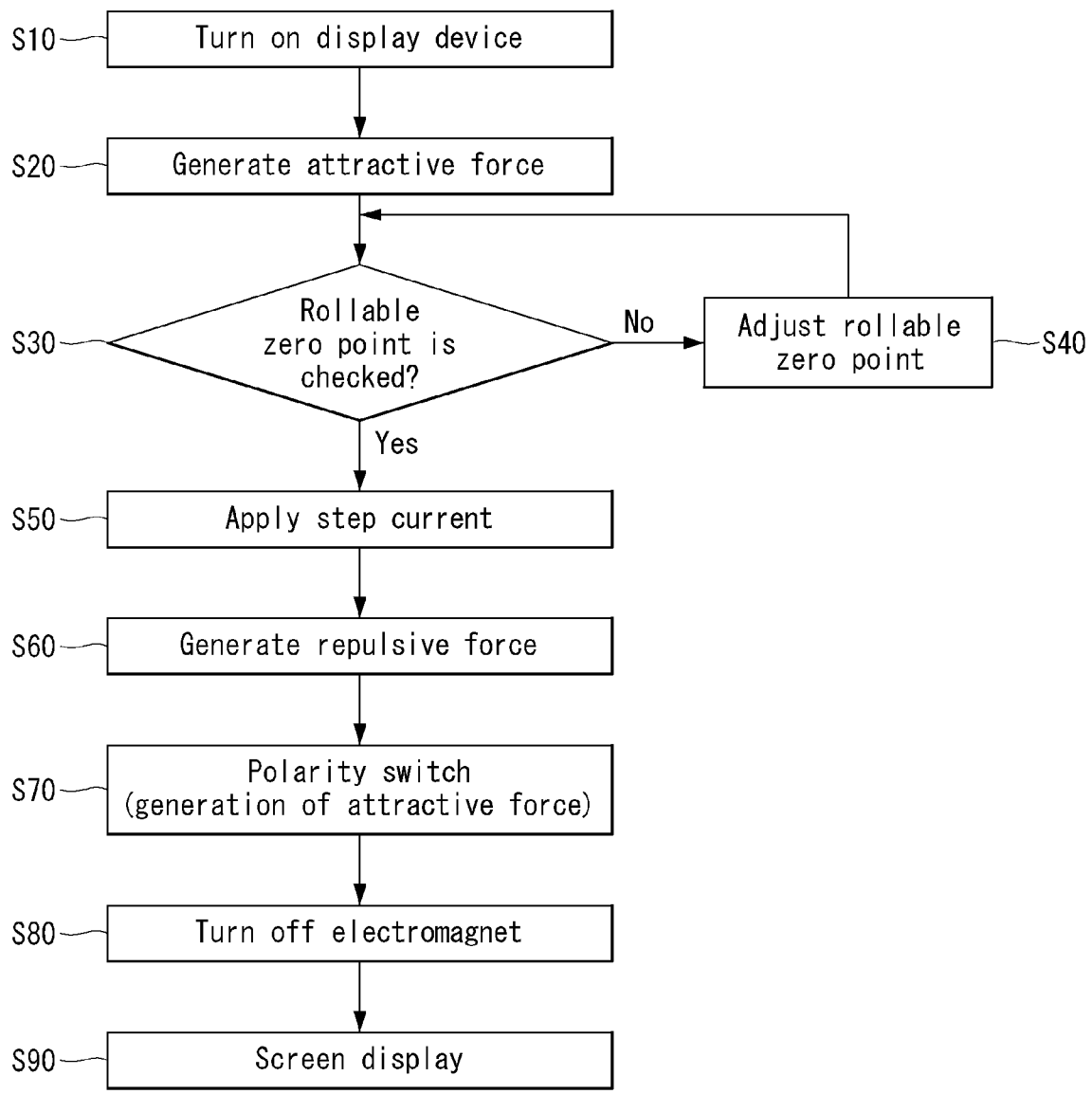
[FIG. 69]

DISPLAY DEVICE

CROSS-REFERENCE TO RELATED APPLICATIONS

This application is the National Stage filing under 35 U.S.C. 371 of International Application No. PCT/KR2019/012777, filed on Sep. 30, 2019, the contents of which are all incorporated by reference herein in its entirety.

TECHNICAL FIELD

The present disclosure relates to a display device.

BACKGROUND ART

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to the various demands for the display devices.

Among the various display devices, a display device using an organic light emitting diode (OLED) is advantageous in that it has better luminance characteristic and better viewing angle characteristic than a liquid crystal display, and has a ultra-thin profile because it does not require a backlight unit.

A flexible display can be bent or rolled around a roller. A display device rolled or unrolled from the roller using the flexible display can be implemented, if necessary or desired. In this instance, it is a problem to stably roll the flexible display on the roller or unroll the flexible display from the roller.

DISCLOSURE

Technical Problem

An object of the present disclosure is to address the above-described and other problems.

Another object of the present disclosure is to provide a display device capable of reducing a load of a motor assembly using an electromagnet when a display is unrolled from a roller.

Another object of the present disclosure is to provide a display device capable of unrolling a display from a roller while maintaining bilateral symmetry of the display rolled around the roller using a lead screw.

Another object of the present disclosure is to provide a display device capable of rolling a display around a roller while maintaining bilateral symmetry of the display using a lead screw.

Another object of the present disclosure is to provide a display device capable of reducing a load of a motor assembly using a spring when a display is unrolled from a roller.

Another object of the present disclosure is to provide a display device capable of reducing a load of a motor assembly by improving a connection position of a rod and a link when the rod receiving power from the motor assembly stands up the link to which a display is connected.

Another object of the present disclosure is to provide a display device having a structure capable of preventing interference of a rod and a lead screw when the rod receiving power from the motor assembly stands up the link to which a display is connected.

Another object of the present disclosure is to provide a display device capable of reducing a volume by rolling a display on a roller.

Technical Solution

To achieve the above-described and other objects, in one aspect of the present disclosure, there is provided a display device comprising a housing, a roller disposed inside the housing, a display unit rolled around the roller, a link comprising a first arm and a second arm, wherein the first arm is rotatably mounted on the display unit, and the second arm is rotatably connected to the first arm and is rotatably mounted on the housing, a lead screw disposed inside the housing, a slider configured to move on the lead screw based on a rotation of the lead screw, a rod comprising one side connected to the slider and another side connected to the second arm, an upper bar coupled to an upper side of the display unit, a first lock magnet positioned at a lower side of the upper bar, and a second lock magnet corresponding to the first lock magnet and positioned at an upper side of a bottom surface of the housing.

The first lock magnet may be a permanent magnet, and the second lock magnet may be an electromagnet.

A repulsive force generated between the first lock magnet and the second lock magnet may be transmitted to the second arm.

The lead screw may comprise a first lead screw; and a second lead screw spaced apart from the first lead screw in a longitudinal direction of the first lead screw. The display device may further comprise a motor assembly disposed between the first lead screw and the second lead screw and configured to drive the first lead screw and the second lead screw.

The slider may comprise a first slider configured to move on the first lead screw; and a second slider configured to move on the second lead screw, A pitch of the first lead screw and a pitch of the second lead screw may be the same as each other.

The display device may further comprise a first bearing configured to support one side of the first lead screw; and a second bearing configured to support another side of the first lead screw.

The display device may further comprise a first spring disposed between the first slider and the second bearing, and the first lead screw may pass through the first spring.

The display device may further comprise a guide disposed between the first bearing and the second bearing and extending along the first lead screw. The first slider may comprise a body through which the lead screw passes; and a protrusion formed in the body and comprising a hole. The guide may pass through the hole of the protrusion.

The display device may further comprise a second spring disposed between the first slider and the second bearing, and the guide may pass through the second spring.

The display device may further comprise a coupling configured to connect the motor assembly to the first lead screw.

The rod may comprise a first rod connected to the first slider; and a second rod connected to the second slider. The link may comprise a first link connected to the first rod; and a second link connected to the second rod. The upper bar may connect a first arm of the first link to a first arm of the second link.

The display device may further comprise a source PCB disposed on the upper bar; a timing controller board disposed inside the roller; and an FFC cable comprising an upper end electrically connected to the source PCB and a lower end electrically connected to the timing controller board. The FFC cable may be rolled around the roller.

The roller may comprise a through hole formed in an outer circumferential surface of the roller, and the FFC cable may pass through the through hole of the roller.

The display unit may be fixed to a front surface of the upper bar, and the source PCB may be fixed to a rear surface of the upper bar. The display unit may comprise a display panel; and a module cover disposed at a rear of the display panel. The FFC cable may comprise a first portion disposed between the display panel and the module cover; a second portion connected to the first portion and configured to pass through the module cover; and a third portion connected to the second portion, disposed at a rear of the module cover, and electrically connected to the source PCB.

The module cover may comprise a plurality of segments. One segment of the plurality of segments may comprise a connection hole facing a rear surface of the display panel. The second portion may pass through the connection hole.

The link may face a rear surface of the display unit. The link may comprise a magnet. The display unit may include a metal material.

Advantageous Effects

Effects of a display device according to the present disclosure are described as follows.

According to at least one aspect of the present disclosure, the present disclosure can reduce a load of a motor assembly using an electromagnet when a display is unrolled from a roller.

According to at least one aspect of the present disclosure, the present disclosure can unroll a display from a roller while maintaining bilateral symmetry of the display rolled around the roller using a lead screw.

According to at least one aspect of the present disclosure, the present disclosure can roll a display around a roller while maintaining bilateral symmetry of the display using a lead screw.

According to at least one aspect of the present disclosure, the present disclosure can reduce a load of a motor assembly using a spring when a display is unrolled from a roller.

According to at least one aspect of the present disclosure, the present disclosure can reduce a load of a motor assembly by improving a connection position of a rod and a link when the rod receiving power from the motor assembly stands up the link to which a display is connected.

According to at least one aspect of the present disclosure, the present disclosure can prevent interference of a rod and a lead screw when the rod receiving power from the motor assembly stands up the link to which a display is connected.

According to at least one aspect of the present disclosure, the present disclosure can reduce a volume of a display device by rolling a display on a roller.

Further scope of applicability of the present disclosure will become apparent from the detailed description given blow. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DESCRIPTION OF DRAWINGS

FIGS. 1 to 17K illustrate configuration of a display device related to the present disclosure.

FIGS. 18 to 29 illustrate a display device according to an embodiment of the disclosure.

FIGS. 30 to 34 illustrate a display device according to another embodiment of the disclosure.

FIGS. 35 to 69 illustrate a display device according to another embodiment of the disclosure.

MODE FOR INVENTION

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features, and it should be understood that the embodiments presented herein are not limited by the accompanying drawings. As such, the present disclosure should be construed to extend to any alterations, equivalents and substitutes in addition to those which are particularly set out in the accompanying drawings.

Hereinafter, embodiments of the disclosure are described using an organic light emitting diode (OLED) display panel as an example of a display panel. However, embodiments of the disclosure are not limited thereto. For example, a liquid crystal display (LCD) panel, a plasma display panel (PDP), and a field emission display (FED) panel may be used.

FIGS. 1 to 17*k* illustrate configuration of a display device related to the present disclosure.

As shown in FIG. 1, it is described below that a display panel 10 may include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Embodiments of the disclosure illustrate and describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

It is described below that a first direction DR1 may be a direction parallel to the long sides LS1 and LS2 of the display panel 10, and a second direction DR2 may be a direction parallel to the short sides SS1 and SS2 of the display panel 10.

A third direction DR3 may be a direction vertical to the first direction DR1 and/or the second direction DR2.

In embodiments disclosed herein, the first direction DR1 and the second direction DR2 may be commonly referred to as a horizontal direction. Further, the third direction DR3 may be referred to as a vertical direction.

In addition, a side or a surface, on which a display device 100 displays an image, may be referred to as a front side or a front surface. When the display device 100 displays the image, a side or a surface, at which the image cannot be observed, may be referred to as a rear side or a rear surface. When the display device 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

+x-axis direction may be referred to as a right direction, and −x-axis direction may be referred to as a left direction. +y-axis direction may be referred to as an upward direction, and −y-axis direction may be referred to as a downward direction. +z-axis direction may be referred to as a frontward direction, and −z-axis direction may be referred to as a rearward direction.

The x-axis direction may be a direction parallel to the first direction. The y-axis direction may be a direction parallel to the second direction. The z-axis direction may be a direction parallel to the third direction.

Referring to FIG. 2, the display device 100 according to the present disclosure may include a display unit 20 and a housing 30.

The display unit 20 may include the display panel 10 and a module cover 15. The display panel 10 may be provided on a front surface of the display device 100 and may display an image. The display panel 10 may divide an image into a plurality of pixels and output the image by controlling the light emission in accordance with color, brightness, and chroma of each pixel. The display panel 10 may be divided into an active area on which an image is displayed, and an inactive area in which no image is displayed.

If the display panel 10 has flexibility, the display panel 10 may be referred to as a flexible display panel 10.

The display panel 10 may have a rectangular shape. However, embodiments of the disclosure are not limited thereto. For example, the display panel 10 may have a shape which has a predetermined curvature at an edge. The display panel 10 may be an OLED display panel. Other display panels may be used. For example, a liquid crystal display panel may be used.

The module cover 15 may be provided on a rear surface of the display panel 10. The module cover 15 may be directly attached to the display panel 10. A size of the module cover 15 may be equal to or greater than a size of the display panel 10.

The module cover 15 may support the rear surface of the display panel 10. Hence, the module cover 15 may include a lightweight material with high rigidity. For example, the module cover 15 may include aluminum or include stainless material.

The housing 30 may be provided on a rear surface of the display unit 20. Namely, the housing 30 may be provided on a rear surface of the module cover 15. The housing 30 may shield at least one printed circuit board (PCB). Namely, the housing 30 may cover at least one PCB attached to the rear surface of the module cover 15. A coupling structure and a coupling method of at least one PCB are described in detail below.

The housing 30 may receive electromagnetic waves emitted from at least one PCB. Hence, although not shown, the housing 30 may include an inner housing made of a conductive material and an outer housing covering the inner housing. However, embodiments of the disclosure are not limited thereto. For example, the housing 30 may be formed as one body made of a conductive material.

Referring to FIG. 3, in the display device 100 according to the embodiment of the disclosure, the housing 30 may be positioned under the display unit 20. More specifically, the housing 30 may have a shape surrounding a lower part of the display unit 20. Namely, the housing 30 may be configured not to expose various driving devices or driving circuits positioned inside the housing 30 to the outside.

A width of the housing 30 in the first and third directions may be greater than a width of the display unit 20 in the first and third directions in order to protect the display unit 20 therein. A width of the housing 30 in the second direction may be less than a width of the display unit 20 in the second direction.

In the display device 100 according to the present disclosure, the housing 30 may not be positioned in the active area of the display unit 20.

Referring to FIG. 4, the display device 100 according to the embodiment of the disclosure may be in a first state, in which the active area of the display unit 20 is positioned inside the housing 30, or a second state in which the active area of the display unit 20 is exposed to the outside of the housing 30.

When the display device 100 is in the first state, the active area of the display unit 20 may be positioned inside the housing 30. Namely, the display unit 20 may be shielded by the housing 30 in the first state.

When the display device 100 is in the second state, the active area of the display unit 20 may be exposed to the outside of the housing 30. Namely, at least a portion of the display unit 20 may protrude to an upper part of the housing 30 in the second state.

Although not shown, the display unit 20 may change from the first state to the second state by a roller positioned inside the housing 30. More specifically, the display unit 20 may change from the first state, in which the display unit 20 is rolled around the roller, to the second state in which the display unit 20 is unrolled from the roller and is exposed to the outside. On the contrary, the display unit 20 may change from the second state to the first state when the display unit 20 is rolled around the roller. A structure and an operation method of the roller and the display unit 20 are described in detail below.

The display unit 20 of the display device 100 according to the present disclosure may be in the first state or the second state. Hence, only when the display device 100 is used, the display unit 20 can be exposed to the outside of the housing 30, thereby saving the space.

Referring to FIG. 5, a panel roller 143 may be connected to one end of the display panel 10. The panel roller 143 may roll or unroll the display panel 10 so that the display panel 10 is in the first state or the second state. The panel roller 143 may be referred to as a roller 143.

In the display device according to the present disclosure, at least one source PCB 120 may be positioned on at least a portion of a front surface of the display panel 10. For example, a plurality of source PCBs 120 may be positioned to be spaced apart from one another.

Signal lines may be positioned on at least one source PCB 120 and may transmit digital video data and timing control signals received from a timing controller board 105. The source PCB 120 may be connected to the display panel 10 by a source chip-on film (COF) 123. The source COF 123 connected to one side of the source PCB 120 may be extended to the active area of the display panel 10 and connected to the display panel 10.

A seating portion 379 may be positioned on an outer circumference of the panel roller 143. The seating portion 379 may form an accommodation space B as a portion of the outer circumference of the panel roller 143 is stepped. The seating portion 379 may be positioned at a contact portion between the source PCB 120 and the panel roller 143 while the panel roller 143 is rolled or unrolled. The seating portion 379 may have a shape in which at least a portion of the outer circumference of the panel roller 143 is recessed.

When the panel roller 143 is rolled, the source PCB 120 may be accommodated in the accommodation space B of the seating portion 379. Hence, even if the panel roller 143 is rolled, the source PCB 120 cannot be damaged.

The timing controller board 105 may be mounted inside the panel roller 143. A flexible flat cable (FFC) 117 may electrically connect the timing controller board 105 to the source PCB 120.

The panel roller 143 may include an upper panel roller 331 and a lower panel roller 337. The upper panel roller 331 and the lower panel roller 337 may be coupled to each other by a screw. The timing controller board 105 may be mounted between the upper panel roller 331 and the lower panel roller 337. The screw may mutually couple the upper panel roller 331, the lower panel roller 337, and the timing controller board 105. The FFC 117 may be connected to the timing controller board 105 and the source PCB 120 through a hole 331*a* positioned in the upper panel roller 331.

Because the timing controller board 105 rotates together with the panel roller 143, the FFC 117 may not be twisted. Further, the space can be saved because the timing controller board 105 is mounted inside the panel roller 143.

Referring to FIG. 6, with respect to the center of the housing 30 in which the display panel moves up and down, the timing controller board 105 may be mounted on the panel roller 143 at one side of the housing 30, and a power supply board 107 and a main board 109 may be positioned at other side of the housing 30.

The timing controller board 105 may be connected to the power supply board 107 and the main board 109. The timing controller board 105 may be connected to the power supply board 107 and the main board 109 through a wiring electrode. The wiring electrode may include a first wiring electrode 307 connecting the timing controller board 105 to the power supply board 107 and a second wiring electrode 309 connecting the timing controller board 105 to the main board 109.

For example, a plurality of first wiring electrodes 307 may be disposed. The first wiring electrode 307 may be in a circular shape. The first wiring electrode 307 may connect the timing controller board 105 to the power supply 107 through an opening in the center of a rotation axis of the panel roller 143.

The second wiring electrode 309 may use the FFC 117 connected to the timing controller board 105 and the source PCB 120. The second wiring electrode 309 may connect the timing controller board 105 to the main board 109 through an opening in the center of the rotation axis of the panel roller 143.

The first wiring electrode 307 and the second wiring electrode 309 may be positioned on the opposite sides of the timing controller board 105. An opening through which the first wiring electrode 307 passes and an opening through which the second wiring electrode 309 passes may be positioned on the opposite sides.

In the display device according to the present disclosure, the timing controller board 105 may be mounted on the panel roller 143, and the power supply board 107 and the main board 109 may be positioned on the opposite sides of the display panel. Hence, an inner space of the housing 30 can be saved.

Referring to FIG. 7, the display device according to the present disclosure may include the panel roller 143, a motor assembly 137, and a link 73 inside the housing 30.

The link 73 may be referred to as a supporter 73.

The module cover 15 may include a plurality of segments 15*a*. The segment 15*a* may be referred to as an apron.

The panel roller 143 may be positioned in front of a portion of the housing 30 in which the display unit 20 moves up and down. The panel roller 143 may simultaneously roll and unroll the display panel 10 and the module cover 15.

The link 73 may be installed in the housing 30. The link 73 may perform a support function so that the display panel 10 and the module cover 15 can move up or down. The link 73 may move up or down an upper bar 75 (see FIG. 9*a*) coupled to the upper parts of the module cover 15 and the display panel 10.

An upper end of the display unit 20 may be connected to the upper bar, and a lower end of the display unit 20 may be connected to the panel roller 143. A portion between the upper end and the lower end of the display unit 20 may easily bend. The link 73 may support the module cover 15 at the rear surface of the module cover 15 so that the module cover 15 does not bend.

A motor assembly 137 may be positioned in a portion to which the link 73 is connected. The motor assembly 137 may be driven so that the link 73 moves up or down. The motor assembly 137 may receive an electrical signal and convert the electrical signal into a physical force. The motor assembly 137 may transfer rotation energy to the link 73 and changes form the first state to the second state. A structure and a driving principle of the motor assembly 137 are described in detail below.

A guide bar 234 may be positioned at an entrance 30a at which the link 73 moves up and down inside the housing 30. The guide bar 234 may include first and second guide bars 234a and 234b. The entrance 30a of the housing 30 may be formed between the first and second guide bars 234a and 234b. The first and second guide bars 234a and 234b may face each other with the link 73 interposed therebetween. For example, the first guide bar 234a may be positioned behind the link 73, and the second guide bar 234b may be positioned in front of the link 73.

The display device according to the present disclosure can simultaneously roll and unroll the display panel 10 and the module cover 15 using one roller. Hence, a thickness of the housing 30 can decrease.

Referring to FIG. 8, the segments 15a may have a rectangular shape. The respective segments 15a may be spaced apart from each other in the y-axis direction and attached to the rear surface of the display panel 10. The module cover 15 may consist of the plurality of segments 15a and may be rolled or unrolled by the roller. The module cover 15 may include a plastic material or an aluminum material. Hence, the module cover 15 can protect the display panel 10 from an external impact.

The display panel 10 and the module cover 15 may be coupled to each other through adhesive layers 70. The adhesive layer 70 may be a double-sided tape. The display panel 10 and the module cover 15 may be rolled or unrolled together by the adhesive layers 70. The adhesive layer 70 may be positioned on each segment 15a and attached to the display panel 10. The adhesive layers 70 may be spaced apart from one another. Hence, the shape of the adhesive layers 70 may easily change when the module cover 15 is rolled or unrolled by the roller. As a width of the adhesive layer 70 in the second direction decreases, the display panel 10 can be naturally rolled or unrolled from the panel roller 143 (see FIG. 7) without being wrinkled.

As a width of the segment 15a in the second direction increases, the segments 15a can stably support the display panel 10 because rigidity of the segment 15a is improved.

When the width of the adhesive layer 70 in the second direction is equal to or less than 30% of the width of the segment 15a in the second direction, wrinkle in the display screen can decrease because less external force is transferred to the display panel 10.

Further, when the width of the adhesive layer 70 in the second direction is equal to or greater than 15% of the width of the segment 15a in the second direction, wrinkle in the display panel 10 can greatly decrease because the rigidity of the display panel 10 is improved.

As a width of the adhesive layer 70 in the third direction increases, the deformation of the display panel 10 against an external force can decrease. More specifically, as the width of the adhesive layer 70 in the third direction increases, the adhesive layer 70 can stably attach the display panel 10 and the module cover 15 because the flexibility of the adhesive layer 70 is good.

Further, as a width of the segment 15a in the third direction decreases, wrinkle of the display panel 10 can decrease. More specifically, as the width of the segment 15a in the third direction decreases, the segments 15a can decrease the wrinkle of the display panel 10 because the rigidity is improved.

Hence, when the width of the adhesive layer 70 in the third direction is equal to or greater than 3% of the width of the segment 15a in the third direction, the rigidity of the display panel 10 can be improved and the wrinkle of the display panel 10 can greatly decrease.

Further, when the width of the adhesive layer 70 in the third direction is equal to or less than 6% of the width of the segment 15a in the third direction, the rigidity of the display panel 10 can be improved and the wrinkle of the display panel 10 can greatly decrease.

In the display device 100 according to the present disclosure, the module cover 15 may include the plurality of segments 15a, and the adhesive layer 70 may be positioned on each segment 15a.

Referring to FIGS. 9a and 9b, in the display device 100 according to the present disclosure, the module cover 15 and the display panel 10 may be fastened to an upper bar 75. The module cover 15, the display panel 10, and the upper bar 75 may be fastened to each other by screws 115a and 115b.

The screws 115a and 115b may allow the module cover 15, the display panel 10, and the upper bar 75 to move up and down together. The screw 115a may fasten the upper bar 75 to the module cover 15. Alternatively, the screw 115b may fasten the upper bar 75 to the display panel 10. However, embodiments of the disclosure are not limited thereto. For example, at least one screw (115a, 115b) may fasten the module cover 15, the display panel 10, and the upper bar 75 together.

An upper part of the module cover 15 may have a shape suitable for being coupled to the upper bar 75. An upper segment 15t may be a segment positioned at the top of the module cover 15. The upper segment 15t may have a different shape from other segment 15a. The upper segment 15t may be referred to as an upper module cover 15t.

The upper segment 15t may include a first body 15ta connected to the other segment 15a and a second body 15tb coupled to the upper bar 75. A lower end of the first body 15ta may be connected to the other segment 15a, and the second body 15tb may be formed on the first body 15ta.

The upper bar 75 may include a groove 75a formed in the +y-axis direction. The second body 15tb may be inserted into the groove 75a. The screw 115a may pass through the second body 15tb in the z-axis direction.

A z-axis direction thickness of the first body 15ta may be greater than a z-axis direction thickness of the second body 15tb.

Referring to FIG. 9b, a top case 167 may cover the upper bar 75, the module cover 15, and the display panel 10. The upper bar 75, the module cover 15, and the display panel 10 may not be exposed to the outside by the top case 167. Hence, an appearance of the display device can be neat.

The top case 167 may be fastened to the upper bar 75, the module cover 15, or the display panel 10 by the screw.

Referring to FIG. 10a, the display device 100 according to the present disclosure may be in a shape in which both sides of the upper bar 75 are supported by the link 73. The upper bar 75 may be moved up and down by the link 73. The link 73 may include a first arm 73a and a second arm 73b.

The first arm 73a may be referred to as an upper link 73a. The second arm 73b may be referred to as a lower link 73b.

The first arm 73a and the second arm 73b may be connected by an arm joint 152. The arm joint 152 may be referred to as a hinge 152 or a joint 152.

An upper end of the first arm 73a may be fastened to the upper bar 75, and a lower end of the first arm 73a may be fastened to the arm joint 152. An upper end of the second arm 73b may be fastened to the motor assembly, and a lower end of the second arm 73b may be fastened to the arm joint 152.

The guide bar 234 may be positioned at the entrance 30a at which the link 73 moves up and down inside the housing 30. The guide bar 234 may include the first and second guide bars 234a and 234b. The entrance 30a of the housing 30 may be formed between the first and second guide bars 234a and 234b. The first and second guide bars 234a and 234b may face each other with the link 73 interposed therebetween. For example, the first guide bar 234a may be positioned behind the link 73, and the second guide bar 234b may be positioned in front of the link 73.

The panel roller 143 may be positioned in front of the link 73. A base 31 of the housing 30 may include a plurality of brackets 221. The base 31 may be referred to as a bottom surface 31.

The plurality of brackets 221 may be formed under the panel roller 143. The plurality of brackets 221 may be spaced along a longitudinal direction of the panel roller 143. Alternatively, the plurality of brackets 221 may be spaced along a longitudinal direction of the base 31. Each bracket 221 may be fixed to the base 31 through a screw.

Referring to FIG. 10b, the display device 100 according to the present disclosure may be in a gear shape in which other side of the first arm 73a and one side of the second arm 73b that are positioned inside the arm joint 152 are engaged with each other. The arm joint 152 may be referred to as a connection portion 152. The first arm 73a may be referred to as an upper support link 73a. The second arm 73b may be referred to as a lower support link 73b.

The first arm 73a may be rotatably connected to an upper part of the arm joint 152. The second arm 73b may be rotatably connected to a lower part of the arm joint 152.

A lower part of the first arm 73a may be provided with a gear st1. An upper part of the second arm 73b may be provided with a gear st2. The gear st1 of the first arm 73a and the gear st2 of the second arm 73b may be engaged with each other.

An angle HRA1 of the first arm 73a from the ground and an angle HRA2 of the second arm 73b from the ground may be equal to each other because the first arm 73a and the second arm 73b are engaged with each other to form a gear shape. Further, an angle between the first arm 73a and the second arm 73b may be the same on both sides because the first arm 73a and the second arm 73b are engaged with each other to form the gear shape. Hence, both sides of the upper bar 75 can move up or down while not being inclined and maintaining level. That is, the angle between the first arm 73a and the second arm 73b of each link 73 can be equal regardless of a height of the upper bar 75 from the ground.

Referring to FIG. 11, the display device 100 according to the present disclosure may further include a module cover roller 141 as well as the panel roller 143 inside the housing 30. The module cover roller 141 may be referred to as an apron roller 141.

The panel roller 143 may be positioned in front of the link 73, and the module cover roller 141 may be positioned behind the link 73. That is, the panel roller 143 and the module cover roller 141 may face each other based on the link 73.

The panel roller 143 may roll and unroll the display panel 10, and the module cover roller 141 may roll and unroll the module cover 15.

The module cover 15 may be thicker than the display panel 10. The module cover roller 141 on which the module cover 15 is rolled may occupy a larger space inside the housing 30 than the panel roller 143 on which the display panel 10 is rolled. Thus, the motor assembly 137 may be positioned in front of the link 73 relatively having a margin of space. However, embodiments of the disclosure are not limited thereto. For example, the motor assembly 137 may be positioned behind the link 73.

Because the display panel 10 and the module cover 15 are dividedly rolled and unrolled inside the housing 30, a rolling force required for the panel roller 143 to roll the display panel 10 may be greater than an adhesive force between the display panel 10 and the module cover 15. Further, a rolling force required for the module cover roller 141 to roll the module cover 15 may be greater than the adhesive force between the display panel 10 and the module cover 15.

The present disclosure can roll and unroll the display panel 10 and the module cover 15 using two rollers, respectively. Hence, less weight can be loaded on each of two rollers respectively rolling the display panel 10 and the module cover 15 than one roller rolling both the display panel 10 and the module cover 15. As a result, the display panel 10 rolled around the panel roller 143 can be prevented from sagging, and the module cover 15 rolled around the module cover roller 141 can be prevented from sagging.

Referring to FIG. 12, the panel roller 143 and the module cover roller 141 may be positioned on the same side with respect to the link 73. For example, the panel roller 143 and the module cover roller 141 may be positioned behind the link 73. However, embodiments of the disclosure are not limited thereto. For example, the panel roller 143 and the module cover roller 141 may be positioned in front of the link 73.

The module cover roller 141 may be positioned under the panel roller 143. The module cover roller 141 on which the module cover 15 is rolled and the panel roller 143 on which the display panel 10 is rolled may interfere with each other. Thus, as the module cover roller 141 and the panel roller 143 are spaced apart from each other by a first distance PGD, interference between them can be prevented.

The first distance PGD may be a distance capable of preventing interference between the display panel 10 rolled around the panel roller 143 and the module cover 15 rolled around the module cover roller 141.

A guide roller 145 may be positioned under the panel roller 143. The guide roller 145 may guide a location of the module cover 15 so that the module cover 15 does not interfere with the panel roller 143.

Referring to FIG. 13, a pressure roller 147 may be positioned under the panel roller 143. The pressure roller 147 may press the module cover 15 so that the module cover 15 contacts the link 73. Hence, the module cover 15 can be prevented from sagging or bending. The pressure roller 147 may be positioned adjacent to the link 73. The pressure roller 147 may guide the module cover 15 so that the module cover 15 and the display panel 10 do not interfere with each other.

Referring to FIG. 14, a guide roller 145 and a pressure roller 147 may be positioned under the panel roller 143. The guide roller 145 may guide a location of the module cover 15 so that the module cover 15 does not interfere with the panel roller 143. The pressure roller 147 may press the module cover 15 so that the module cover 15 contacts the link 73.

Hence, malfunction of the display device due to the sagging or bending of the module cover 15 can be prevented. Further, malfunction of the display device due to interference between the module cover 15 and the display panel 10 can be prevented.

Referring to FIG. 15, in the display device 100 according to the present disclosure, segments 15c on both sides of the module cover 15 may be attached to the display panel 10. The segment 15c may be referred to as a third module cover 15c.

A magnet 64 may be attached to a front surface of the segment 15c. The magnet 64 may be attached to the segment 15c through a double-sided tape. Each segment 15c may be provided with the magnet 64.

The display panel 10 may include a metal material. Thus, the display panel 10 and the magnet 64 may be attached to each other by a magnetic force. Further, the display panel 10 and the segment 15c may be attached to each other by the magnet 64.

The rear surface of the display panel 10 may include Fe—Ni Invar alloy. Thus, the display panel 10 can be strongly attached to the magnet 64.

Because the display panel 10 and the module cover 15 are attached by the magnets 64 positioned only on both sides of the module cover 15, a large number of magnets 64 are not needed. As a result, the manufacturing cost of the display device can be reduced.

Referring to FIG. 16, in the display device 100 according to the present disclosure, the magnet 64 may be positioned in a groove 118 of the segment 15c.

The groove 118 may be positioned on a surface of the segment 15c facing the display panel 10. The groove 118 may be positioned on a front surface of each segment 15c. Because the magnet 64 is accommodated in the groove 118, the magnet 64 may not protrude to the outside of the segment 15c. Thus, even if the display panel 10 contacts the segment 15c, the display panel 10 does not wrinkle and can be flat.

As the magnet 64 is accommodated in the groove 118, a thickness of the segment 15c can be reduced. Hence, a thickness of the display device 100 can be reduced.

Referring to FIGS. 17a to 17c, as the display device 100 according to the present disclosure changes from the first state to the second state, the upper bar 75 may move up. The upper bar 75 may move up and down by the links 73 connected to both sides of the upper bar 75.

As shown in FIG. 17a, when the display device is in the first state, an angle HRA between the first arm 73a and the second arm 73b may be very small. Hence, the upper bar 75 may not move up. Further, the display panel 10 and the module cover 15 may be rolled around the panel roller 143.

As shown in FIG. 17b, the angle HRA between the first arm 73a and the second arm 73b may increase while the motor assembly 137 rotates. While the angle HRA between the first arm 73a and the second arm 73b increases, the upper bar 75 may move up. Hence, the display panel 10 and the module cover 15 that have been rolled around the panel roller 143 may be gradually unrolled.

As shown in FIG. 17c, when the display device is in the second state, the first arm 73a and the second arm 73b may be positioned on a straight line. Namely, the angle HRA between the first arm 73a and the second arm 73b may be 180 degrees. Thus, the upper bar 75 may move up to a maximum height. Further, the display panel 10 and the module cover 15 may be unrolled from the panel roller 143.

Referring to FIG. 17d, in the display device 100 according to the present disclosure, a plurality of first arms 73a and a plurality of second arms 73b may be used.

More specifically, the first arm 73a may include a first upper arm 73Ca and a second upper arm 73Fa. Further, the second arm 73b may include a first lower arm 73Cb and a second lower arm 73Fb.

The first upper arm 73Ca may be referred to as a first upper link 73Ca, and the second upper arm 73Fa may be referred to as a second upper link 73Fa. The first lower arm 73Cb may be referred to as a first lower link 73Cb, and a second lower arm 73Fb may be referred to as a second lower link 73Fb.

The first arm 73a may be rotatably connected to the upper part of the arm joint 152. The second arm 73b may be rotatably connected to the lower part of the arm joint 152.

More specifically, the second upper arm 73Fa may be connected to an upper side above the first upper arm 73Ca. The second lower arm 73Fb may be connected to a lower side below the first lower arm 73Cb.

A lower part of the first upper arm 73Ca may be provided with a gear st3. An upper part of the first lower arm 73Cb may be provided with a gear st4. The gear st3 of the first upper arm 73Ca and the gear st4 of the first lower arm 73Cb may be engaged with each other.

An angle HRA1 of the first upper arm 73Ca from the ground and an angle HRA2 of first lower arm 73Cb from the ground may be equal to each other because the first upper arm 73Ca and the first lower arm 73Cb are engaged with each other. Further, an angle between the first upper arm 73Ca and the first lower arm 73Cb may be the same on both sides because the first upper arm 73Ca and the first lower arm 73Cb are engaged with each other. Hence, the upper bar 75 can move up or down while not being inclined and maintaining level. That is, the angle between the first upper arm 73Ca and the first lower arm 73Cb can be the same on both sides regardless of the height of the upper bar 75 from the ground.

The second upper arm 73Fa and the second lower arm 73Fb may not be provided with a gear. An angle between the second upper arm 73Fa and the second lower arm 73Fb may be equal to the angle between the first upper arm 73Ca and the first lower arm 73Cb.

As shown in FIG. 17e, in a display device 100 according to the existing invention, upper and lower arms 73a and 73b may be formed as one arm. Hence, when an external force F is applied to one side, an angle HLA between the upper and lower arms 73a and 73b may be different on both sides. In this case, the display panel 10 may be inclined to one side.

Unlike FIG. 17e, as shown in FIG. 17f, when the gear st3 of the first upper arm 73Ca and the gear st4 of the first lower arm 73Cb are engaged with each other, an angle HLA between the upper and lower arms 73a and 73b may not change even if an external force F is applied to one side of the display device 100. Hence, a damage of the display panel 10 due to the inclination can be prevented.

Referring to FIG. 17g, one side of each of the first upper and lower arms 73Ca and 73Cb may be extended in a direction toward the second upper and lower arms 73Fa and 73Fb. That is, a width of each of the first upper and lower arms 73Ca and 73Cb may further increase. Hence, the first upper and lower arms 73Ca and 73Cb can shield the second upper and lower arms 73Fa and 73Fb at the front when viewing the link 73 from the front of the display device 100. Alternatively, the first upper arm 73Ca and the second upper arm 73Fa may overlap each other. Alternatively, the first lower arm 73Cb and the second lower arm 73Fb may overlap each other.

A rotation axis of the first upper arm 73Ca, a rotation axis of the second upper arm 73Fa, a rotation axis of the first lower arm 73Cb, and a rotation axis of the second lower arm 73Fb may be spaced apart from each other.

A vertical height of a portion of the arm joint 152 connected to the first upper and lower arms 73Ca and 73Cb may be different from a vertical height of a portion of the arm joint 152 connected to the second upper and lower arms 73Fa and 73Fb.

Although not shown, one side of each of the second upper and lower arms 73Fa and 73Fb may also be extended in a direction toward the first upper and lower arms 73Ca and 73Cb. That is, a width of each of the second upper and lower arms 73Fa and 73Fb may further increase when viewed from the rear surface. Hence, the second upper and lower arms 73Fa and 73Fb can shield the first upper and lower arms 73Ca and 73Cb at the front.

As shown in FIG. 17h, in the first state, a width of at least a portion of the first upper and lower arms 73Ca and 73Cb may overlap the second upper and lower arms 73Fa and 73Fb. For example, the first upper and lower arms 73Ca and 73Cb may be spaced apart from the second upper and lower arms 73Fa and 73Fb by a predetermined distance SLB and may overlap the second upper and lower arms 73Fa and 73Fb. Hence, an entire width HLW of the first arm 73a may be greater than a width of the second upper arm 73Fa or a width CLW of the first upper arm 73Ca.

Unlike FIG. 17h, as shown in FIG. 17i, in the second state, an entire width of the first upper and lower arms 73Ca and 73Cb may overlap the second upper and lower arms 73Fa and 73Fb. Hence, an entire width HLW of the first arm 73a may be equal to a width of the second upper arm 73Fa or a width CLW of the first upper arm 73Ca.

As shown in FIG. 17j, when one side of the first upper arm 73Ca is not extended, the first upper arm 73Ca and the second upper arm 73Fa may be separated at a predetermined gap LD as the first upper arm 73Ca changes from the second state to the first state. As the change to the first state proceeds, the gap LD between the first upper arm 73Ca and the second upper arm 73Fa may further increase. In this case, there is a problem that the user's hand may be caught between the first upper arm 73Ca and the second upper arm 73Fa and may be injured during the change from the first state to the second state.

Unlike FIG. 17j, as shown in FIG. 17k, when one side of the first upper arm 73Ca is extended and overlaps the second upper arm 73Fa, the gap between the first upper arm 73Ca and the second upper arm 73Fa may not be still exposed even if the first upper arm 73Ca changes from the second state to the first state. Hence, the present disclosure can prevent the user's hand from being caught between the first upper arm 73Ca and the second upper arm 73Fa during the change from the first state to the second state.

Referring to FIG. 18, a plurality of magnets 64 may be positioned on the link 73. For example, at least one magnet 64 may be positioned on the first arm 73a, and at least one magnet 64 may be positioned on the second arm 73b. The plurality of magnets 64 may be spaced apart from each other.

The display unit may include a metal material. The display unit may be in close contact with the link 73 by the magnet 64. Even if a magnetic force of one of the plurality of magnets 64 weakens, it can be maintained that the display panel and the module cover are in close contact with the link 73 by a magnetic force of the remaining magnets 64.

Referring to FIG. 19, one magnet 64 may be positioned on each of the first arm 73a and the second arm 73b. In this case, the magnet 64 may have a shape extending in a long side direction of the first arm 73a and the second arm 73b.

Because the magnet 64 has the shape extending in the long side direction of the first arm 73a and the second arm 73b, an area of a portion where the link 73 is in close contact with the display panel and the module cover can be increased. Hence, an adhesive strength between the link 73 and the display panel and the module cover can increase.

Referring to FIG. 20, the magnet 64 may be positioned in a recess 321 formed on the link 73. The recess 321 may have a shape recessed to the inside of the link 73. The magnet 64 may be coupled to the link 73 through at least one screw 187.

A width LHW of the recess 321 recessed to the inside of the link 73 may be equal to or greater than a thickness MGW of the magnet 64. If the thickness MGW of the magnet 64 is greater than the width LHW of the recess 321, the display panel 10 and the module cover 15 may not be in close contact with the link 73. In this case, the display panel 10 may be wrinkled or may not be flat.

A panel protection portion 97 may be disposed on the rear surface of the display panel 10. The panel protection portion 97 can prevent an impact that the display panel 10 receives due to a friction with the module cover 15. The panel protection portion 97 may include a metal material. The panel protection portion 97 may have a very thin thickness. For example, the panel protection portion 97 may be about 0.1 mm thick.

Because the panel protection portion 97 includes a metal material, a mutual attraction may act between the panel protection portion 97 and the magnet 64. Even if the module cover 15 between the panel protection portion 97 and the link 73 does not include a metal material, the module cover 15 may be in close contact with the magnet 64.

Referring to FIG. 21, when a magnet is not provided on the link 73, the module cover 15 may be in close contact with the link 73 by the upper bar 75 on the upper side and the guide bar 234 (see FIG. 10a) on the lower side. A portion of the link 73 between the upper bar 75 and the guide bar 234 may not be in close contact with the module cover 15. Alternatively, a central portion of the link 73 may not be in close contact with the module cover 15. The central portion of the link 73 may be around the arm joint 152. In this case, distances APRD1 and APLD2 between the module cover 15 and the link 73 may not be constant. In this case, the display panel 10 may bend.

Referring to FIG. 22, when the magnet 64 is positioned on the recess 321 of the link 73, the magnet 64 may be in close contact with both the module cover 15 and the panel protection portion 97 at the same time because the magnet 64 pulls the panel protection portion 97. That is, the central portion of the link 73 may be in close contact with the module cover 15.

Referring to FIGS. 23a to 23c, both ends of the module cover 15 may bend in the +z-axis direction. The display panel 10 may be attached to a non-bent portion of the module cover 15. A bent length in the +z-axis direction on both ends of the module cover 15 may be greater than a sum of thicknesses of the display panel 10 and the adhesive layer 70. That is, a bent portion of the module cover 15 may protrude from the display panel 10 by a predetermined distance AD1 in the +z-axis direction. Hence, the display panel 10 can be shielded when viewing the module cover 15 in the x-axis direction.

Referring to FIG. 23a, the adhesive layer 70 may be disposed between the display panel 10 and the module cover 15. The adhesive layer 70 may be disposed to elongate along the x-axis direction. The whole of the display panel 10 may be attached to the module cover 15. In this case, because an adhesive strength between the module cover 15 and the display panel 10 may be very strong, the module cover 15 and the display panel 10 may not be easily detached from each other.

Referring to FIG. 23b, the adhesive layer 70 may be disposed between the display panel 10 and the module cover 15. The adhesive layer 70 may be partially disposed between the display panel 10 and the module cover 15. For example, the adhesive layers 70 may be respectively disposed at one end and other end of the display panel 10. In this case, a smaller amount of the adhesive layer 70 may be used than when the adhesive layer 70 is disposed to elongate along the x-axis direction. Thus, the manufacturing cost of the display device can be reduced.

The present disclosure is not limited to the case where the adhesive layer 70 is used to attach the display panel 10 and the module cover 15. For example, the magnet may be used to attach the display panel 10 and the module cover 15.

Referring to FIG. 24, a bead 136 may be formed on an upper surface of a segment 15b. The bead 136 may have a shape recessed to the inside of the segment 15b. The bead 136 may have a shape recessed in the −y-axis direction. A plurality of beads 136 may be formed on the segment 15b. The plurality of beads 136 may be spaced apart from each other. The beads 136 can improve rigidity of the segment 15b. For example, the bead 136 can prevent the shape of the segment 15b from being deformed by an external impact.

Referring to FIG. 25, the source PCB 120 may be positioned on the upper side of the module cover 15. When the first state changes to the second state, a location of the source PCB 120 may change depending on the movement of the module cover 15.

The FFC 231 may be positioned in the center of the module cover 15 with respect to the first direction. However, embodiments of the invention are not limited thereto. For example, the FFC 231 may be positioned at both ends of the module cover 15 with respect to the first direction.

Referring to FIG. 26, a segment 15d may include a recess 425 that is recessed in the −z-axis direction. The recess 425 may form a space between the display panel 10 and the module cover 15. The FFC 231 may be accommodated in the space formed by the recess 425. The recess 425 can improve the rigidity of the segment 15d.

The bead 136 may be positioned on the segment 15d except a formation portion of the recess 425. The bead 136 may not be positioned in the formation portion of the recess 425 because a thickness of the segment 15d in the third direction decreases. However, embodiments of the invention are not limited thereto. For example, the bead 136 may be positioned in the formation portion of the recess 425.

Referring to FIG. 27, a segment 15e may have a through portion 437 positioned in the center with respect to the first direction. The through portion 437 may pass through a central portion of the segment 15e in the second direction. Namely, the through portion 437 may be a hole positioned in the segment 15e. The through portion 437 may be a portion in which the FFC 231 is positioned. Because the through portion 437 is formed inside the segment 15e, a thickness of the segment 15e can further decrease compared to when the FFC 231 is positioned in the recess 425.

The bead 136 may be positioned on the segment 15e except a formation portion of the through portion 437. The bead 136 may not be positioned in the formation portion of the through portion 437 because the thickness of the segment 15e in the third direction decreases. However, embodiments of the invention are not limited thereto. For example, the bead 136 may be positioned in the formation portion of the through portion 437.

Referring to FIG. 28, in the display device according to the present disclosure, the top case 167 may shield the source PCB 120 and the upper bar 75 as well as the display panel 10 and the module cover 15. Hence, the appearance of the display device can be neat because the source PCB 120 is not exposed to the outside.

One surface of the upper bar 75 may be coupled to the rear surface of the module cover 15, and other surface of the upper bar 75 may be coupled to the source PCB 120. The upper bar 75 may be fixed to the module cover 15 and may support the source PCB 120.

A lower end of the FFC 231 may be connected to the timing controller board 105 (see FIG. 29) inside the panel roller 143 (see FIG. 29). The FFC 231 and the display unit 20 may be rolled and unrolled from the panel roller 143.

A portion of the FFC 231 may be positioned between the display panel 10 and the module cover 15. The portion of the FFC 231 that is positioned between the display panel 10 and the module cover 15 may be referred to as a first portion 231a. The first portion 231a may be positioned in the recess 425 in which the plurality of segments 15d is formed. Alternatively, the first portion 231a may be accommodated in the recess 425 in which the plurality of segments 15d is formed.

A portion of the FFC 231 may pass through a segment 15f. The portion of the FFC 231 that passes through the segment 15f may be referred to as a second portion 231b. The segment 15f may include a first hole 521a formed at a front surface and a second hole 521b formed at a rear surface. The first hole 521a and the second hole 521b may be connected to each other to form one hole 521. The hole 521 may pass through the segment 15f in the third direction. The second portion 231b may pass through the hole 521. The hole 521 may be referred to as a connection hole 521.

An upper end of the FFC 231 may be electrically connected to the source PCB 120. A portion of the FFC 231 may be positioned on the rear surface of the module cover 15. The portion of the FFC 231 that is positioned on the rear surface of the module cover 15 may be referred to as a third portion 231c. The third portion 231c may be electrically connected to the source PCB 120.

The third portion 231c may be shielded by the top case 167. Hence, the third portion 231c may not be exposed to the outside.

Referring to FIG. 29, in the display device according to the present disclosure, the FFC 231 may be connected to the timing controller board 105 mounted on the panel roller 143. A through hole 615 may be positioned in the panel roller 143, and the FFC 231 may be connected to one side of the timing controller board 105 through the through hole 615.

The through hole 615 may be positioned on one side of the panel roller 143 and may pass through an outer circumferential portion of the panel roller 143. The FFC 231 may be connected to one side of the timing controller board 105 through the through hole 615.

In the display device according to the present disclosure, even if the FFC 231 is positioned on the outer circumference of the panel roller 143, the connection between the FFC 231 and the timing controller board 105 can be maintained by the through hole 615. Hence, the FFC 231 rotates together with the panel roller 143 and cannot be twisted.

A portion of the FFC 231 may be rolled around the panel roller 143. The portion of the FFC 231 rolled around the panel roller 143 may be referred to as a fourth portion 231d. The fourth portion 231d may contact an outer circumferential surface of the panel roller 143.

A portion of the FFC 231 may pass through the through hole 615. The portion of the FFC 231 that passes through the through hole 615 may be referred to as a fifth portion 231e.

The lower end of the FFC 231 may be electrically connected to the timing controller board 105. A portion of the FFC 231 may be positioned inside the panel roller 143. The portion of the FFC 231 that is positioned inside the panel roller 143 may be referred to as a sixth portion 231f. The sixth portion 231f may be electrically connected to the timing controller board 105.

Referring to FIG. 30, the first arm 73a may be connected to both ends of the upper bar 75. The first arm 73a may be rotatably connected to a link bracket 277 through a coupling hole 77 positioned in the first arm 73a. The link bracket 277 may be coupled to a connection portion 275 of the upper bar 75. The link bracket 277 may be separated from the top case 167 downwardly (in −y-axis direction). The link bracket 277 may couple the first arm 73a to the connection portion 275 through at least one screw.

The small-sized display device can be implemented by coupling the module cover 15, the source PCB 120, and the first link 73a to the upper bar 75.

Referring to FIGS. 31a and 31b, an auxiliary roller 556 may be spaced apart from the panel roller 143. The auxiliary roller 556 may be connected to a protective sheet 472. One end of the protective sheet 472 may be connected to the auxiliary roller 556, and other end of the protective sheet 472 may be connected to the display panel 10. The auxiliary roller 556 may roll or unroll the protective sheet 472. The protective sheet 472 may include a nonwoven fabric.

The auxiliary roller 556 may be positioned adjacent to a portion in which the panel roller 143 rolls and unrolls. The auxiliary roller 556 may rotate in the opposite direction of a rotation direction of the panel roller 143. Namely, when the panel roller 143 unrolls the display panel 10, the auxiliary roller 556 may roll the protective sheet 472. Further, when the panel roller 143 rolls the display panel 10, the auxiliary roller 556 may unroll the protective sheet 472.

Referring to FIG. 31a, if the protective sheet 472 is not included, the module cover 15 and the display panel 10 may rub against each other when the panel roller 143 rolls and unrolls the module cover 15 and the display panel 10. The display panel 10 may be damaged by friction with the module cover 15.

Referring to FIG. 31b, the display panel 10, the module cover 15, and the protective sheet 472 may be together rolled and unrolled from the panel roller 143. If the display panel 10, the module cover 15, and the protective sheet 472 are rolled around the panel roller 143, the protective sheet 472 may be positioned between the display panel 10 and the module cover 15. The protective sheet 472 can prevent friction between the display panel 10 and the module cover 15. The protective sheet 472 can prevent a damage of the display panel 10 by preventing the friction between the display panel 10 and the module cover 15.

Referring to FIG. 32, the auxiliary roller 556 may include a fixed cap 521, a rotating cap 523, a shaft 547, a coil spring 573, and a roller cover 582.

The coil spring 573 may be disposed inside the auxiliary roller 556. A longitudinal direction of the coil spring 573 may be parallel to a longitudinal direction of the auxiliary roller 556.

The fixed cap 521 may be positioned at one end of the auxiliary roller 556. The fixed cap 521 may be coupled to one end of the coil spring 573. The fixed cap 521 may be fixed regardless of a rotation of the roller cover 582. The fixed cap 521 may not rotate.

The rotating cap 523 may be positioned at other end of the auxiliary roller 556. The rotating cap 523 may be coupled to other end of the coil spring 573. When the roller cover 582 rotates, the rotating cap 523 may rotate together with the roller cover 582.

When the roller cover 582 rotates, the fixed cap 521 at one side may not rotate, the rotating cap 523 may rotate together with the roller cover 582, and the coil spring 573 may be elastically deformed. The coil spring 573 may store energy during the elastic deformation and apply a restoring force to the rotating cap 523. The restoring force of the coil spring 573 may act in the opposite direction of a rotation direction of the rotating cap 523.

Hence, as the protective sheet 472 is unrolled from the auxiliary roller 556, a force of rolling again the protective sheet 472 on the auxiliary roller 556 may act on the auxiliary roller 556. That is, when the display panel is unrolled from the panel roller, the protective sheet 472 may be rolled around the auxiliary roller 556.

As the protective sheet 472 is rolled around the auxiliary roller 556, a force of unrolling again the protective sheet 472 from the auxiliary roller 556 may act on the auxiliary roller 556. That is, when the display panel is rolled around the panel roller, the protective sheet 472 may be unrolled from the auxiliary roller 556.

The shaft 547 may be a central axis of the auxiliary roller 556. The shaft 547 may be connected to the fixed cap 521. The coil spring 573 may be inserted into the shaft 547. The shaft 547 may assist so that the coil spring 573 is stably positioned inside the auxiliary roller 556.

The roller cover 582 may form an appearance of the auxiliary roller 556. The roller cover 582 may accommodate the fixed cap 521, the rotating cap 523, the shaft 547, and the coil spring 573. The roller cover 582 may be connected to one end of the protective sheet 472. That is, the protective sheet 472 may be rolled around the roller cover 582.

Referring to FIG. 33, a diameter formed by the panel roller 143 and the display panel 10 rolled around the panel roller 143 may be denoted by R1. A value of R1 may vary depending on a rolling degree of the display panel 10 on the panel roller 143. A diameter of the panel roller 143 may be denoted by R2.

The panel roller 143 may be fixed inside the housing 30 (see FIG. 7). Further, the entrance 30a (see FIG. 7) of the housing 30 through which the display panel 10 passes may be fixed. Thus, an angle formed by the display panel 10 unrolled from the panel roller 143 inside the housing 30 and the base 31 (see FIG. 10a) may vary depending on R1.

When the display panel 10 is sufficiently unrolled from the panel roller 143, the radius formed by the panel roller 143 and the display panel 10 rolled around the panel roller 143 is the radius R2 of the panel roller 143. In this instance, the display panel 10 may be inclined to the base 31 by an angle A1. When the display panel 10 may be inclined to the base 31, the moving up and down of the display panel 10 may be unstable.

Referring to FIG. 34, a guide assembly 731 may be coupled to the auxiliary roller 556.

The auxiliary roller 556 can prevent the display panel 10 from being inclined to the base 31 (see FIG. 10a). The auxiliary roller 556 can stably guide the display panel 10 unrolled from the panel roller 143. However, the radius formed by the panel roller 143 and the display panel 10 rolled around the panel roller 143 may vary depending on a rolling degree of the protective sheet 472 on the auxiliary roller 556.

The guide assembly 731 may be coupled to the auxiliary roller 556 and may adjust a location of the auxiliary roller 556 depending on a rolling degree of the protective sheet 472 on the auxiliary roller 556. Hence, the auxiliary roller 556 can stably guide the display panel 10 unrolled from the panel roller 143 even if the radius formed by the auxiliary roller 556 and the protective sheet 472 rolled around the auxiliary roller 556 varies.

The guide assembly 731 may include a guide arm 752, a pin bolt 761, a tension spring 764, and a supporter 772. One end of the guide arm 752 may be connected to the auxiliary roller 556, and other end of the guide arm 752 may be connected to the tension spring 764. The guide arm 752 may rotate around the pin bolt 761. The pin bolt 761 may be fixed to the housing. The auxiliary roller 556 may be connected to the guide arm 752 and may rotate around the pin bolt 761.

One end of the tension spring 764 may be connected to the guide arm 762, and the other end of the tension spring 764 may be connected to the supporter 772. The supporter 772 may be fixed to the housing 30.

When the display panel 10 is unrolled from the panel roller 143, the auxiliary roller 556 may roll the protective sheet 472, and the radius formed by the auxiliary roller 556 and the protective sheet 472 rolled around the auxiliary roller 556 may increase. In addition, the auxiliary roller 556 may rotate counterclockwise around the pin bolt 761. In this instance, the tension spring 764 may apply a force to rotate the guide arm 752 clockwise. The tension spring 764 can prevent the auxiliary roller 556 from excessively rotating counterclockwise around the pin bolt 761.

When the display panel 10 is rolled around the panel roller 143, the protective sheet 472 may be unrolled from the auxiliary roller 556, and the radius formed by the auxiliary roller 556 and the protective sheet 472 rolled around the auxiliary roller 556 may decrease. In addition, the auxiliary roller 556 may rotate clockwise around the pin bolt 761.

The tension spring 764 can prevent the auxiliary roller 556 from rotating counterclockwise around the pin bolt 761.

The following description will be given focusing on different configurations and actions from the embodiments described above, and the description of configurations equivalent to or similar to the embodiments described above is omitted to avoid the duplicate description.

Referring to FIG. 35, a motor assembly 810 may be installed on the base 31. The base 31 may be the bottom of the housing 30 (see FIG. 19). Drive shafts may be formed on both sides of the motor assembly 810. A right drive shaft and a left drive shaft of the motor assembly 810 may rotate in the same direction. Alternatively, the right drive shaft and the left drive shaft of the motor assembly 810 may rotate in opposite directions.

The motor assembly 810 may include a plurality of motors. The plurality of motors may be connected in series with each other. The plurality of motors may be arranged in order of a first motor 811, a second motor 812, a third motor 813, and a fourth motor 814 from right to left. The right drive shaft of the motor assembly 810 may be formed in the first motor 811, and the left drive shaft of the motor assembly 810 may be formed in the fourth motor 814. The motor assembly 810 can output a high torque by connecting the plurality of motors in series.

The motor assembly 810 may be connected to lead screws 840a and 840b. The lead screws 840a and 840b may include a right lead screw 840a connected to the right side of the motor assembly 810 and a left lead screw 840b connected to the left side of the motor assembly 810. The right lead screw 840a may be referred to as a first lead screw 840a, and the left lead screw 840b may be referred to as a second lead screw 840b.

The right drive shaft of the motor assembly 810 may be connected to the right lead screw 840a. Alternatively, the right drive shaft of the motor assembly 810 and the right lead screw 840a may be connected to each other through a right coupling 820a. Alternatively, a drive shaft of the first motor 811 may be connected to the right lead screw 840a. Alternatively, the drive shaft of the first motor 811 and the right lead screw 840a may be connected to each other through the right coupling 820a. The right drive shaft may be referred to as a first drive shaft, and the left drive shaft may be referred to as a second drive shaft.

The left drive shaft of the motor assembly 810 may be connected to the left lead screw 840b. Alternatively, the left drive shaft of the motor assembly 810 and the left lead screw 840b may be connected to each other through a left coupling 820b. Alternatively, a drive shaft of the fourth motor 814 may be connected to the left lead screw 840b. Alternatively, the drive shaft of the fourth motor 814 and the left lead screw 840b may be connected to each other through the left coupling 820b.

The couplings 820a and 820b may include the right coupling 820a connecting the right drive shaft of the motor assembly 810 to the right lead screw 840a, and the left coupling 820b connecting the left drive shaft of the motor assembly 810 to the left lead screw 840b.

Each of the lead screws 840a and 840b may be formed with a screw thread in the longitudinal direction. A direction of the screw thread of the right lead screw 840a and a direction of the screw thread of the left lead screw 840b may be opposite to each other. Alternatively, the direction of the screw thread of the right lead screw 840a and the direction of the screw thread of the left lead screw 840b may be the same.

Bearings 830a, 830b, 830c and 830d may be installed on the base 31. The plurality of bearings 830a, 830b, 830c and 830d may be formed along a longitudinal direction of the base 31. The bearings 830a, 830b, 830c and 830d may include right bearings 830a, 830b, 830c and 830d on the right side of the motor assembly 810 and left bearings 830a, 830b, 830c and 830d on the left side of the motor assembly 810.

The bearings 830a, 830b, 830c and 830d may support the lead screws 840a and 840b. The lead screws 840a and 840b may be connected to the drive shafts of the motor assembly 810 and may rotate. The bearings 830a, 830b, 830c and 830d may support the lead screws 840a and 840b without disturbing the rotation of the lead screws 840a and 840b.

The right bearings 830a, 830b, 830c and 830d may support the right lead screw 840a. The right bearings 830a, 830b, 830c and 830d may include a first right bearing 830a supporting the right side of the right lead screw 840a, and a second right bearing 830b supporting the left side of the right lead screw 840a. The first right bearing 830a may be referred to as a first bearing 830a, and the second right bearing 830b may be referred to as a second bearing 830b.

The left bearings 830a, 830b, 830c and 830d may support the left lead screw 840b. The left bearings 830a, 830b, 830c and 830d may include a first left bearing 830c supporting the right side of the left lead screw 840b, and a second left bearing 830d supporting the left side of the left lead screw 840b.

The bearings 830a, 830b, 830c and 830d, the couplings 820a and 820b, and the motor assembly 810 may be arranged in order of the first right bearing 830a, the second right bearing 830b, the right coupling 820a, the motor assembly 810, the left coupling 820b, the first left bearing 830c, and the second left bearing 830d from right to left.

Referring to FIGS. 36 and 37, the display device may further include sliders 860a and 860b. The sliders 860a and 860b may be coupled to the lead screws 840a and 840b, and the lead screws 840a and 840b may be disposed to pass through the sliders 860a and 860. The plurality of sliders 860a and 860b may be used. The sliders 860a and 860b may include a right slider 860a coupled to the right lead screw 840a, and a left slider 860b coupled to the left lead screw 840b. The right slider 860a may be referred to as a first slider 860a, and the left slider 860b may be referred to as a second slider 860b.

A screw thread SS (see FIG. 43) may be formed on an inner perimeter surface of each of the sliders 860a and 860b. The screw threads SS on the inner perimeter surface of each of the sliders 860a and 860b may be engaged with screw threads RS and LS on the lead screws 840a and 840b. The sliders 860a and 860b may move back and forth in the longitudinal direction of the lead screws 840a and 840b according to the rotation of the lead screws 840a and 840b.

The right slider 860a may be engaged with the right lead screw 840a. The right slider 860a may move back and forth between the first right bearing 830a and the second right bearing 830b according to the rotation of the right lead screw 840a.

The left slider 860b may be engaged with the left lead screw 840b. The left slider 860b may move back and forth between the first left bearing 830c and the second left bearing 830d according to the rotation of the left lead screw 840b.

The right slider 860a may be spaced apart from a symmetry axis ys of the motor assembly 810 by a distance RD1. The left slider 860b may be spaced apart from the symmetry axis ys of the motor assembly 810 by a distance LD1. The distance RD1 and the distance LD1 may be set to the same length. That is, the right slider 860a and the left slider 860b may be symmetrical to each other with respect to the symmetry axis ys of the motor assembly 810.

The motor assembly 810 may be configured such that a rotation direction of the right drive shaft and a rotation direction of the left drive shaft are equally output. A direction of the screw thread RS of the right lead screw 840a and a direction of the screw thread LS of the left lead screw 840b may be opposite to each other. Hence, when the right slider 860a moves in the +x-axis direction according to the rotation of the right drive shaft, the left slider 860b may move in the −x-axis direction according to the rotation of the left drive shaft. Alternatively, when the right slider 860a moves in the −x-axis direction according to the rotation of the right drive shaft, the left slider 860b may move in the +x-axis direction according to the rotation of the left drive shaft.

Referring to FIG. 38, a direction of the screw thread RS of the right lead screw 840a and a direction of the screw thread LS of the left lead screw 840b may be opposite to each other. The right lead screw 840a may have a pitch PL, and the left lead screw 840b may have a pitch PR. The pitch PL of the right lead screw 840a and the pitch PR of the left lead screw 840b may be set to the same length.

The motor assembly 810 may be configured such that an output of the right drive shaft and an output of the left drive shaft are equally output. A rotation direction Ra of the right drive shaft and a rotation direction Ra of the left drive shaft may be the same as each other. The number of revolutions per unit time in the right drive shaft and the number of revolutions per unit time in the left drive shaft may be the same as each other. A direction of torque of the right drive shaft and a direction of torque of the left drive shaft may be the same as each other. A magnitude of torque of the right drive shaft and a magnitude of torque of the left drive shaft may be the same as each other.

The right slider 860a may move in the +x-axis direction according to the rotation of the right drive shaft at a location that is spaced apart from the symmetry axis ys of the motor assembly 810 by a distance RD1. When the right drive shaft rotates n times, the right slider 860a may be spaced apart from the symmetry axis ys of the motor assembly 810 by a distance LD2. In this case, the distance RD1 and the distance LD2 may have a difference of (the number n of revolutions) *(pitch PL of the right slider 860a).

The left slider 860b may move in the −x-axis direction according to the rotation of the left drive shaft at a location that is spaced apart from the symmetry axis ys of the motor assembly 810 by a distance LD1. When the left drive shaft rotates n times, the left slider 860b may be spaced apart from the symmetry axis ys of the motor assembly 810 by a distance RD2. In this case, the distance LD1 and the distance RD2 may have a difference of (the number n of revolutions) *(pitch PR of the left slider 860b).

That is, when the pitch PL of the right slider 860a and the pitch PR of the left slider 860b are the same as each other, a displacement of the right slider 860a and a displacement of the left slider 860b may have the same magnitude and opposite directions.

When initial locations of the right slider 860a and the left slider 860b are symmetrical with respect to the symmetry axis ys of the motor assembly 810, the right slider 860a and the left slider 860b may be far from each other while maintaining the symmetry with respect to the symmetry axis ys of the motor assembly 810.

Referring to FIG. 39, the right slider 860a may move in the −x-axis direction according to the rotation of the right drive shaft at a location that is spaced apart from the symmetry axis ys of the motor assembly 810 by a distance LD2. A rotation direction Rb of the right drive shaft and a rotation direction Rb of the left drive shaft may be the same as each other. When the right drive shaft rotates n times, the right slider 860a may be spaced apart from the symmetry axis ys of the motor assembly 810 by a distance RD1. In this case, the distance RD1 and the distance LD2 may have a difference of (the number n of revolutions)*(pitch PR of the right slider 860a).

The left slider 860b may move in the +x-axis direction according to the rotation of the left drive shaft at a location that is spaced apart from the symmetry axis ys of the motor assembly 810 by a distance RD2. When the left drive shaft rotates n times, the left slider 860b may be spaced apart from the symmetry axis ys of the motor assembly 810 by a distance LD1. In this case, the distance LD1 and the distance RD2 may have a difference of (the number n of revolutions) *(pitch PL of the left slider 860b).

That is, when the pitch PL of the right slider 860a and the pitch PR of the left slider 860b are the same as each other, a displacement of the right slider 860a and a displacement of the left slider 860b may have the same magnitude and opposite directions.

When initial locations of the right slider 860a and the left slider 860b are symmetrical with respect to the symmetry axis ys of the motor assembly 810, the right slider 860a and the left slider 860b may be close to each other while maintaining the symmetry with respect to the symmetry axis ys of the motor assembly 810.

Referring to FIG. 40, the motor assembly 810 may be configured such that a rotation direction Ra of the right drive shaft and a rotation direction Rb of the left drive shaft are output in opposite directions. A direction of the screw thread RS of the right lead screw 840a and a direction of the screw thread LS of the left lead screw 840b may be the same. Hence, when the right slider 860a moves in the +x-axis direction according to the rotation of the right drive shaft, the left slider 860b may move in the −x-axis direction according to the rotation of the left drive shaft. Alternatively, when the right slider 860a moves in the −x-axis direction according to the rotation of the right drive shaft, the left slider 860b may move in the +x-axis direction according to the rotation of the left drive shaft.

The right lead screw 840a may have a pitch PL, and the left lead screw 840b may have a pitch PR. The pitch PL of the right lead screw 840a and the pitch PR of the left lead screw 840b may be set to the same length.

The motor assembly 810 may be configured such that an output of the right drive shaft and an output of the left drive shaft are equally output. A rotation direction of the right drive shaft and a rotation direction of the left drive shaft may be opposite to each other. The number of revolutions per unit time in the right drive shaft and the number of revolutions per unit time in the left drive shaft may be the same as each other. A direction of torque of the right drive shaft and a direction of torque of the left drive shaft may be opposite to each other. A magnitude of torque of the right drive shaft and a magnitude of torque of the left drive shaft may be the same as each other.

The right slider 860a may move in the +x-axis direction according to the rotation of the right drive shaft at a location that is spaced apart from the symmetry axis ys of the motor assembly 810 by a distance RD1. When the right drive shaft rotates n times, the right slider 860a may be spaced apart from the symmetry axis ys of the motor assembly 810 by a distance LD2. In this case, the distance RD1 and the distance LD2 may have a difference of (the number n of revolutions) *(pitch PL of the right slider 860a).

The left slider 860b may move in the −x-axis direction according to the rotation of the left drive shaft at a location that is spaced apart from the symmetry axis ys of the motor assembly 810 by a distance LD1. When the left drive shaft rotates n times, the left slider 860b may be spaced apart from the symmetry axis ys of the motor assembly 810 by a distance RD2. In this case, the distance LD1 and the distance RD2 may have a difference of (the number n of revolutions) *(pitch PL of the left slider 860b).

That is, when the pitch PL of the right slider 860a and the pitch PR of the left slider 860b are the same as each other, a displacement of the right slider 860a and a displacement of the left slider 860b may have the same magnitude and opposite directions.

When initial locations of the right slider 860a and the left slider 860b are symmetrical with respect to the symmetry axis ys of the motor assembly 810, the right slider 860a and the left slider 860b may be far from each other while maintaining the symmetry with respect to the symmetry axis ys of the motor assembly 810.

Referring to FIG. 41, the motor assembly 810 may be configured such that a rotation direction Rb of the right drive shaft and a rotation direction Ra of the left drive shaft are output in opposite directions. The right slider 860a may move in the −x-axis direction according to the rotation of the right drive shaft at a location that is spaced apart from the symmetry axis ys of the motor assembly 810 by a distance LD2. When the right drive shaft rotates n times, the right slider 860a may be spaced apart from the symmetry axis ys of the motor assembly 810 by a distance RD1. In this case, the distance RD1 and the distance LD2 may have a difference of (the number n of revolutions)*(pitch PL of the right slider 860a).

The left slider 860b may move in the +x-axis direction according to the rotation of the left drive shaft at a location that is spaced apart from the symmetry axis ys of the motor assembly 810 by a distance RD2. When the left drive shaft rotates n times, the left slider 860b may be spaced apart from the symmetry axis ys of the motor assembly 810 by a distance LD1. In this case, the distance LD1 and the distance RD2 may have a difference of (the number n of revolutions) *(pitch PR of the left slider 860b).

That is, when the pitch PL of the right slider 860a and the pitch PR of the left slider 860b are the same as each other, a displacement of the right slider 860a and a displacement of the left slider 860b may have the same magnitude and opposite directions.

When initial locations of the right slider 860a and the left slider 860b are symmetrical with respect to the symmetry axis ys of the motor assembly 810, the right slider 860a and the left slider 860b may be close to each other while maintaining the symmetry with respect to the symmetry axis ys of the motor assembly 810.

Referring to FIGS. 42, 43, 44a and 44b, link mounts 920a and 920b may be installed on the base 31. The link mounts 920a and 920b may include a right link mount 920a that is spaced apart from the first right bearing 830a toward the right side, and a left link mount 920b that is spaced apart from the second left bearing 830d toward the left side.

Links 910a and 910b may be connected to the link mounts 920a and 920b. The links 910a and 910b may include a right link 910a connected to the right link mount 920a and a left link 910b connected to the left link mount 920b.

The right link 910a may be referred to as a first link, and the left link 910b may be referred to as a second link. The right link mount 920a may be referred to as a first link mount 920a, and the left link mount 920b may be referred to as a second link mount 920b.

The links 910a and 910b may include first arms 911a and 911b, second arms 912a and 912b, and arm joints 913a and 913b. One sides of the second arms 912a and 912b may be rotatably connected to the link mounts 920a and 920b, and other sides of the second arms 912a and 912b may be rotatably connected to the arm joints 913a and 913b. One sides of the first arms 911a and 911b may be rotatably connected to the arm joints 913a and 913b, and other sides of the first arms 911a and 911b may be rotatably connected to link brackets 951a and 951b.

The link brackets 951a and 951b may include a right link bracket 951a connected to the first arm 911a of the right link 910a and a left link bracket 951b connected to the first arm 911b of the left link 910b. The link brackets 951a and 951b may be connected to an upper bar 950.

The upper bar 950 may connect the right link bracket 951a to the left link bracket 951b.

Rods 870a and 870b may connect the sliders 860a and 860b to the links 910a and 910b. One sides of the rods 870a and 870b may be rotatably connected to the sliders 860a and 860b, and other sides of the rods 870a and 870b may be rotatably connected to the second arms 912a and 912b. The rods 870a and 870b may include a right rod 870a connecting the right slider 860a to the second arm 912a of the right link 910a and a left rod 870b connecting the left slider 860b to the second arm 912b of the left link 910b. The right rod 870a may be referred to as a first rod 870a, and the left rod 870b may be referred to as a second rod 870b.

More specifically, a structure formed by the right lead screw 840*a*, the right slider 860*a*, the right rod 870*a*, and the right link 910*a* is described. The right slider 860*a* may include a body 861*a* and a rod mount 862*a*. A screw thread SS may be formed on an inner perimeter surface of the body 861*a*. The screw thread SS of the body 861*a* may be engaged with the screw thread RS of the right lead screw 840*a*. The right lead screw 840*a* may pass through the body 861*a*.

The rod mount 862*a* may be formed on the right side of the body 861*a*. The rod mount 862*a* may be rotatably connected to one side of the right rod 870*a*. The rod mount 862*a* may include a first rod mount 862*a*1 and a second rod mount 862*a*2. The first rod mount 862*a*1 may be disposed in front of the right lead screw 840*a*, and the second rod mount 862*a*2 may be disposed behind the right lead screw 840*a*. The first rod mount 862*a*1 and the second rod mount 862*a*2 may be spaced apart from each other. The second rod mount 862*a*2 may be spaced apart from the first rod mount 862*a*1 in the −z-axis direction. The right lead screw 840*a* may be positioned between the first rod mount 862*a*1 and the second rod mount 862*a*2.

The rod mount 862*a* may be rotatably connected to one side of the right rod 870*a* through a connection member C1. The connection member C1 may pass through the rod mount 862*a* and the right rod 870*a*.

The right rod 870*a* may be rotatably connected to the second arm 912*a* through a connection member C2. The connection member C2 may pass through the second arm 912*a* and the right rod 870*a*.

The right rod 870*a* may include a transfer portion 871*a* connected to the second arm 912*a* of the right link 910*a* and a cover 872*a* connected to the rod mount 862*a* of the right slider 860*a*. The transfer portion 871*a* may transfer, to the right link 910*a*, a force generated when the right slider 860*a* moves back and forth along the right lead screw 840*a*.

The cover 872*a* may include a first plate 873*a* disposed in front of the right lead screw 840*a*. The first plate 873*a* may be disposed perpendicular to the base 31. Alternatively, the first plate 873*a* may face the right lead screw 840*a*.

The cover 872*a* may include a second plate 874*a* disposed behind the right lead screw 840*a*. The second plate 874*a* may be disposed perpendicular to the base 31. Alternatively, the second plate 874*a* may face the right lead screw 840*a*. Alternatively, the second plate 874*a* may be spaced apart from the first plate 873*a*. The right lead screw 840*a* may be positioned between the first plate 873*a* and the second plate 874*a*.

The cover 872*a* may include a third plate 875*a* connecting the first plate 873*a* to the second plate 874*a*. The third plate 875*a* may be connected to the transfer portion. The third plate 875*a* may be positioned on an upper side of the right lead screw 840*a*.

The cover 872*a* may include a fourth plate 876*a* connecting the first plate 873*a* to the second plate 874*a*. The fourth plate 876*a* may be connected to the third plate 875*a*. The fourth plate 876*a* may be positioned on the upper side of the right lead screw 840*a*.

One side of the first plate 873*a* may be connected to the first rod mount 862*a*1. The first plate 873*a* and the first rod mount 862*a*1 may be connected through a connection member C1'. Other side of the first plate 873*a* may be connected to the third plate 875*a*.

One side of the second plate 874*a* may be connected to the second rod mount 862*a*2. The second plate 874*a* and the second rod mount 862*a*2 may be connected through a connection member C1. Other side of the second plate 874*a* may be connected to the third plate 875*a*.

When the right slider 860*a* moves to close to the motor assembly 810, the right lead screw 840*a* and the right rod 870*a* may contact each other. When the right lead screw 840*a* and the right rod 870*a* contact each other, a mutual interference may occur, and a movement of the right slider 860*a* may be restricted.

The cover 872*a* may provide a space S1 therein. The first plate 873*a*, the second plate 874*a*, the third plate 875*a*, and the fourth plate 876*a* may form the space S1. When the right slider 860*a* moves to close to the motor assembly 810, the right lead screw 840*a* may be accommodated or escaped in the space S1 provided by the cover 872*a*. The right slider 860*a* may move closer to the motor assembly 810 than when there is no cover 872*a*, due to the space S1 provided by the cover 872*a*. That is, the cover 872*a* can increase a movable range of the right slider 860*a* by providing the space S1 therein. In addition, there is an advantage in that the size of the housing 30 (see FIG. 2) can be reduced by accommodating the right lead screw 840*a* in the cover 872*a*.

The cover 872*a* may limit a minimum value of an angle θS formed by the second arm 912*a* and the base 31. When the angle θS is sufficiently small, the third plate 875*a* of the cover 872*a* may contact the second arm 912*a* and support the second arm 912*a*. The third plate 875*a* can limit the minimum value of the angle θS and prevent the sagging of the second arm 912*a* by supporting the second arm 912*a*. That is, the cover 872*a* may serve as a stopper preventing the sagging of the second arm 912*a*. Further, the third plate 875*a* can reduce an initial load of standing up the second arm 912*a* by limiting the minimum value of the angle θS.

The lead screws 840*a* and 840*b* may be driven by one motor assembly 810. The second arms 912*a* and 912*b* may stand up while being symmetrical to each other by driving the lead screws 840*a* and 840*b* by one motor assembly 810. However, when the lead screws 840*a* and 840*b* are driven by one motor assembly 810, a load on the motor assembly 810 may excessively increase to stand up the second arms 912*a* and 912*b*. In this instance, the third plate 875*a* can reduce the load on the motor assembly 810 in order to stand up the second arms 912*a* and 912*b* by limiting the minimum value of the angle θS.

A structure formed by the left lead screw 840*b*, the left slider 860*b*, the left rod 870*b*, and the left link 910*b* may be symmetrical to the above-described structure formed by the right lead screw 840*a*, the right slider 860*a*, the right rod 870*a*, and the right link 910*a*. In this instance, a symmetry axis may be the symmetry axis ys of the motor assembly 810.

With reference to FIGS. 45 and 46, a connection of the right rod 870*a* to a protrusion 914*a* is shown. The protrusion 914*a* may be referred to as a connection portion 914*a*.

An angle formed by the right rod 870*a* and the base 31 may vary depending on a location of the connection portion. An angle formed by the second arm 912*a* and the base 31 may be denoted by an angle θS. When the right slider 860*a* is positioned closest to the motor assembly 810 within a movable range, the second arm 912*a* may lie completely on the base 31. When the second arm 912*a* lies completely on the base 31, the angle θS may have a minimum value. For example, when the second arm 912*a* lies completely on the base 31, the angle θS may have a value close to 0°.

When the right slider 860*a* moves in the +x-axis direction, the angle θS may gradually increase. Alternatively, when the right slider 860*a* moves in the +x-axis direction, the second arm 912*a* may stand up with respect to the base 31. Alternatively, when the angle θS gradually increases, the second arm 912*a* may stand up with respect to the base 31.

When the right slider 860a is positioned farthest from the motor assembly 810 within a movable range, the second arm 912a may completely stand up with respect to the base 31. When the second arm 912a completely stands up with respect to the base 31, the angle θS may have a maximum value. For example, when the second arm 912a completely stands up with respect to the base 31, the second arm 912a may be positioned perpendicular to the base 31. Alternatively, when the second arm 912a completely stands up with respect to the base 31, an angle formed by the second arm 912a and the base 31 may have a value close to 90°.

A direction in which an angle (angle θS) between the second arm 912a of the right link 910a and the base 31 increases may be referred to as a standing direction S. Alternatively, a direction in which an angle between the second arm 912b of the left link 910b and the base 31 increases may be referred to as a standing direction S.

When a rod mount 862a" is positioned on an upper side of the body 861a, an angle formed by a right rod 870a" and the base 31 may be denoted by OA, and a minimum force required for the right rod 870a" to stand up the second arm 912a may be denoted by Fa.

When a rod mount 862a' is positioned at a middle height of the body 861a, an angle formed by a right rod 870a' and the base 31 may be denoted by OB, and a minimum force required for the right rod 870a' to stand up the second arm 912a may be denoted by Fb.

When a rod mount 862a is positioned on a lower side of the body 861a, an angle formed by a right rod 870a and the base 31 may be denoted by OC, and a minimum force required for the right rod 870a to stand up the second arm 912a may be denoted by Fc.

In this case, a relationship of θA<θB<θC may be established for the same angle θS. Further, a relationship of Fc<Fb<Fa may be established for the same angle θS.

That is, if an angle formed by the second arm 912a and the base 31 is the same, a force required to stand up the second arm 912a may decrease as the angle formed by the right rod 870a and the base 31 increases.

The cover 872a (see FIG. 43) of the right rod 870a provides a space S1 (see FIG. 43) capable of accommodating the right lead screw 840a and thus can allow the rod mount 862a to be coupled close to a lower side of a body 861b or the right lead screw 840a.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, the load on the motor assembly 810 in order to stand up the second arm 912a can decrease by increasing the angle formed by the right rod 870a and the base 31.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this instance, a symmetry axis may be the symmetry axis ys of the motor assembly 810.

Referring to FIGS. 47 to 49, the second arm 912a may include a bar 915a and a protrusion 914a. FIG. 47 illustrates that the right rod 870a is connected to the bar 915a, and FIG. 48 illustrates that the right rod 870a is connected to the protrusion 914a. The protrusion 914a may be referred to as a connection portion 914a.

An angle formed by the second arm 912a and the base 31 may be denoted by OS. When the right slider 860a is positioned closest to the motor assembly 810 within a movable range, the second arm 912a may lie completely on the base 31. When the second arm 912a lies completely on the base 31, the angle θS may have a minimum value. For example, when the second arm 912a lies completely on the base 31, the angle θS may have a value close to 0°.

When the right slider 860a moves in the +x-axis direction, the angle θS may gradually increase. Alternatively, when the right slider 860a moves in the +x-axis direction, the second arm 912a may stand up with respect to the base 31. Alternatively, when the angle θS gradually increases, the second arm 912a may stand up with respect to the base 31.

When the right slider 860a is positioned farthest from the motor assembly 810 within a movable range, the second arm 912a may completely stand up with respect to the base 31. When the second arm 912a completely stands up with respect to the base 31, the angle θS may have a maximum value. For example, when the second arm 912a completely stands up with respect to the base 31, the second arm 912a may be positioned perpendicular to the base 31. Alternatively, when the second arm 912a completely stands up with respect to the base 31, an angle formed by the second arm 912a and the base 31 may have a value close to 90°.

A direction in which an angle (angle θS) between the second arm 912a of the right link 910a and the base 31 increases may be referred to as a standing direction S. Alternatively, a direction in which an angle between the second arm 912b of the left link 910b and the base 31 increases may be referred to as a standing direction S.

Referring to FIG. 47, an angle formed by the right rod 870a and the right lead screw 840a may be denoted by θ1. When the second arm 912a lies completely on the base 31, the angle θ1 may have a minimum value.

To stand up the second arm 912a, the motor assembly 810 may drive the drive shaft. When the drive shaft rotates, the right slider 860a may move in the +x-axis direction. The right slider 860a may apply a force to the right rod 870a, and the rod 870a may transfer the force to the bar 915a of the second arm 912a. The second arm 912a may receive the force from the right rod 870a and rotate in the standing direction S. When the right link 910a stands up, the angles θS and θ1 may increase.

When the second arm 912a lies completely on the base 31, a minimum force for standing up the second arm 912a may be denoted by F1. That is, the F1 may mean a minimum force that the right rod 870a has to transfer to the bar 915a of the second arm 912a in order to stand up the second arm 912a.

Referring to FIG. 48, an angle formed by the right rod 870a and the right lead screw 840a may be denoted by θ2. When the second arm 912a lies completely on the base 31, the angle θ2 may have a minimum value.

To stand up the second arm 912a, the motor assembly 810 may drive the drive shaft. When the drive shaft rotates, the right slider 860a may move in the +x-axis direction, and the left slider 860b may move in the −x-axis direction. The sliders 860a and 860b may apply a force to the rods 870a and 870b, and the rods 870a and 870b may transfer the force to the bar 915a of the second arm 912a. The second arm 912a may receive the force from the rods 870a and 870b and rotate in the standing direction S. When the links 910a and 910b stand up, the angles θS and θ2 may increase.

When the second arm 912a lies completely on the base 31, a minimum force for standing up the second arm 912a may be denoted by F2. That is, the F2 may mean a minimum force that the right rod 870a has to transfer to the bar 915a of the second arm 912a in order to stand up the second arm 912a.

With reference to FIGS. 47 and 48, in preparation for the case where the right rod 870a is connected to the bar 915a of the second arm 912a and the case where the right rod 870a is connected to the protrusion 914a of the second arm 912a, when an angle θS formed by the second arm 912a and the base 31 is the same, an angle θ2 formed by the right rod 870a connected to the protrusion 914a of the second arm 912a and the right lead screw 840a may be greater than an angle θ1 formed by the right rod 870a connected to the bar 915a of the second arm 912a and the right lead screw 840a.

Further, when the angle θS formed by the second arm 912a and the base 31 is the same, the force F1 required to stand up the second arm 912a when the right rod 870a is connected to the bar 915a of the second arm 912a may be greater than the force F2 required to stand up the second arm 912a when the right rod 870a is connected to the protrusion 914a of the second arm 912a.

That is, if an angle formed by the second arm 912a and the base 31 is the same, a force required to stand up the second arm 912a may decrease as an angle formed by the right rod 870a and the right lead screw 840a increases. Alternatively, the second arm 912a can stand up by less force than the force required when the right rod 870a is connected to the bar 915a, by connecting the right rod 870a to the protrusion 914a.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, by connecting the right rod 870a to the protrusion 914a of the second arm 912a, an angle formed by the right rod 870a and the base 31 may increase, and the load on the motor assembly 810 in order to stand up the second arm 912a can decrease.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this instance, a symmetry axis may be the symmetry axis ys of the motor assembly 810.

With reference to FIGS. 50 and 51, a connection of the right rod 870a to the protrusion 914a is shown. The protrusion 914a may be referred to as a connection portion 914a.

An angle formed by the right rod 870a and the base 31 may vary depending on a connection location of the protrusion 914a and the right rod 870a. An angle formed by the second arm 912a and the base 31 may be denoted by OS. When the right slider 860a is positioned closest to the motor assembly 810 within a movable range, the second arm 912a may lie completely on the base 31. When the second arm 912a lies completely on the base 31, the angle θS may have a minimum value. For example, when the second arm 912a lies completely on the base 31, the angle θS may have a value close to 0°.

When the right slider 860a moves in the +x-axis direction, the angle θS may gradually increase. Alternatively, when the right slider 860a moves in the +x-axis direction, the second arm 912a may stand up with respect to the base 31. Alternatively, when the angle θS gradually increases, the second arm 912a may stand up with respect to the base 31.

When the right slider 860a is positioned farthest from the motor assembly 810 within a movable range, the second arm 912a may completely stand up with respect to the base 31. When the second arm 912a completely stands up with respect to the base 31, the angle θS may have a maximum value. For example, when the second arm 912a completely stands up with respect to the base 31, the second arm 912a may be positioned perpendicular to the base 31. Alternatively, when the second arm 912a completely stands up with respect to the base 31, an angle formed by the second arm 912a and the base 31 may have a value close to 90°.

A direction in which an angle (angle θS) between the second arm 912a of the right link 910a and the base 31 increases may be referred to as a standing direction S. Alternatively, a direction in which an angle between the second arm 912b of the left link 910b and the base 31 increases may be referred to as a standing direction S.

When a right rod 870a1 and the protrusion 914a are fastened to be spaced apart from a central axis CR of the second arm 912a by a distance r, an angle formed by the right rod 870a1 and the base 31 may be denoted by θ2, and a minimum force required for the right rod 870a1 to stand up the second arm 912a may be denoted by F3.

When a right rod 870a2 and the protrusion 914a are fastened to be spaced apart from the central axis CR of the second arm 912a by a distance r', an angle formed by the right rod 870a2 and the base 31 may be denoted by θ2', and a minimum force required for the right rod 870a2 to stand up the second arm 912a may be denoted by F4.

When a right rod 870a3 and the protrusion 914a are fastened to be spaced apart from the central axis CR of the second arm 912a by a distance r", an angle formed by the right rod 870a3 and the base 31 may be denoted by θ2", and a minimum force required for the right rod 870a3 to stand up the second arm 912a may be denoted by F5.

In this case, a relationship of θ2<θ2'<θ2" may be established for the same angle θS. Further, a relationship of F5<F4<F3 may be established for the same angle θS.

That is, if an angle formed by the second arm 912a and the base 31 is the same, a force required to stand up the second arm 912a may decrease as the angle formed by the right rod 870a and the base 31 increases.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this instance, a symmetry axis may be the symmetry axis ys of the motor assembly 810.

Referring to FIG. 52, guides 850a, 850b, 850c and 850d may be connected to bearings 830a, 830b, 830c and 830d. The guides 850a, 850b, 850c and 850d may include right guides 850a and 850b disposed on the right side of the motor assembly 810 and left guides 850c and 850d disposed on the left side of the motor assembly 810.

One sides of the right guides 850a and 850b may be connected to the first right bearing 830a, and other sides of the right guides 850a and 850b may be connected to the second right bearing 830b. The right guides 850a and 850b may be positioned parallel to the right lead screw 840a. Alternatively, the right guides 850a and 850b may be spaced apart from the right lead screw 840a.

The right guides 850a and 850b may include a first right guide 850a and a second right guide 850b. The first right guide 850a and the second right guide 850b may be spaced apart from each other. The right lead screw 840a may be positioned between the first right guide 850a and the second right guide 850b.

The right slider 860a may include a protrusion. Alternatively, the display device may include a protrusion formed in the right slider 860a. The protrusion may be formed on the body of the slider. The protrusion may include a front protrusion (not shown) that protrudes from the body 861a of the right slider 860a in the +z-axis direction, and a rear protrusion 865a that protrudes from the body of the slider in the −z-axis direction.

The first right guide 850a may pass through the rear protrusion 865a. Alternatively, a first hole 863a may be formed in the rear protrusion 865a, and the first right guide 850a may pass through the first hole 863a. The first hole 863a may be formed in the x-axis direction. The first hole 863a may be referred to as a hole 863a.

The second right guide 850b may pass through the front protrusion (not shown). Alternatively, a second hole (not shown) may be formed in the front protrusion (not shown), and the second right guide 850b may pass through the second hole. The second hole may be formed in the x-axis direction.

The right guides 850a and 850b may guide the right slider 860a to move more stably when the right slider 860a moves back and forth along the right lead screw 840a. Since the right guides 850a and 850b stably guide the right slider 860a, the right slider 860a does not rotate about the right lead screw 840a and may move back and forth along the right lead screw 840a.

A structure formed by the left guides 850c and 850d, the left bearings 830a, 830b, 830c and 830d, the left slider 860b, and the left lead screw 840b may be symmetrical to the above-described structure formed by the right guides 850a and 850b, the right bearings 830a, 830b, 830c and 830d, the right slider 860a, and the right lead screw 840a. In this instance, a symmetry axis may be the symmetry axis ys of the motor assembly 810.

Referring to FIG. 53, first springs 841a and 841b may be inserted into the lead screws 840a and 840b. Alternatively, the lead screws 840a and 840b may pass through the first springs 841a and 841b. The first springs 841a and 841b may include a first right spring 841a disposed on the right side of the motor assembly 810 and a first left spring 841b disposed on the left side of the motor assembly 810.

The first right spring 841a may be disposed between the right slider 860a and the second right bearing 830b. One end of the first right spring 841a may contact or be separated from the right slider 860a, and other end of the first right spring 841a may contact or be separated from the second right bearing 830b.

When the second arm 912a lies completely on the base 31, a distance between the right slider 860a and the second right bearing 830b may be denoted by RD3. The first right spring 841a may have a length greater than the distance RD3 in a non-compressed or non-tensioned state. Thus, when the second arm 912a lies completely on the base 31, the first right spring 841a may be compressed between the right slider 860a and the second right bearing 830b. Further, the first right spring 841a may provide a restoring force of the +x-axis direction to the right slider 860a.

When the second arm 912a changes from a state of lying completely on the base 31 to a state of standing up with respect to the base 31, the restoring force provided by the first right spring 841a may assist the second arm 912a to stand up. The first right spring 841a assists the second arm 912a to stand up, and thus the load of the motor assembly 810 can be reduced.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, the first right spring 841a can assist the second arm 912a to stand up, thereby reducing the load of the motor assembly 810 and reducing the load on the motor assembly 810 in order to stand up the second arm 912a.

Alternatively, when the second arm 912a changes from a state of standing up with respect to the base 31 to a state of lying completely on the base 31, the restoring force provided by the first right spring 841a can alleviate an impact generated when the second arm 912a lies on the base 31. That is, the first right spring 841a may serve as a damper when the second arm 912a lies on the base 31. The first right spring 841a serves as the damper, and thus the load of the motor assembly 810 can be reduced.

A structure formed by the first left spring 841b, the left bearings 830a, 830b, 830c and 830d, the left slider 860b, the left lead screw 840b, and the second arm 912a may be symmetrical to the above-described structure formed by the first right spring 841a, the right bearings 830a, 830b, 830c and 830d, the right slider 860a, the right lead screw 840a, and the second arm 912a. In this instance, a symmetry axis may be the symmetry axis ys of the motor assembly 810.

Referring to FIG. 54, second springs 851a and 851b may be inserted into the guides 850a, 850b, 850c and 850d. Alternatively, the guides 850a, 850b, 850c and 850d may pass through the second springs 851a and 851b. The second springs 851a and 851b may include a second right spring 851a disposed on the right side of the motor assembly 810 and a second left spring 851b disposed on the left side of the motor assembly 810.

The second right spring 851a may be provided as a plurality of springs. The second right spring 851a may include springs 940a and 940b inserted into the first right guide 850a and springs 940a and 940b inserted into the second right guide 850b. Alternatively, the second right spring 851a may include springs 940a and 940b through which the first right guide 850a passes, and springs 940a and 940b through which the second right guide 850b passes.

The guides 850a, 850b, 850c and 850d may include locking jaws 852a and 852b. The locking jaws 852a and 852b may include a right locking jaw 852a disposed on the right side of the motor assembly 810 and a left locking jaw 852b disposed on the left side of the motor assembly 810.

The right locking jaw 852a may be disposed between the right slider 860a and the second right bearing 830b. The second right spring 851a may be disposed between the right slider 860a and the second right bearing 830b. One end of the second right spring 851a may contact or be separated from the right slider 860a, and other end of the second right spring 851a may contact or be separated from the right locking jaw 852a.

When the second arm 912a lies completely on the base 31, a distance between the right slider 860a and the right locking jaw 852a may be denoted by RD4. The second right spring 851a may have a length greater than the distance RD4 in a non-compressed or non-tensioned state. Thus, when the second arm 912a lies completely on the base 31, the second right spring 851a may be compressed between the right slider 860a and the right locking jaw 852a. Further, the second right spring 851a may provide a restoring force of the +x-axis direction to the right slider 860a.

When the second arm 912a changes from a state of lying completely on the base 31 to a state of standing up with respect to the base 31, the restoring force provided by the second right spring 851a may assist the second arm 912a to stand up. The second right spring 851a assists the second arm 912a to stand up, and thus the load of the motor assembly 810 can be reduced.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, the second right spring 851a assists the second arm 912a to stand up and thus can reduce the load of the motor assembly 810 and reduce the load on the motor assembly 810 in order to stand up the second arm 912a.

Alternatively, when the second arm 912a changes from a state of standing up with respect to the base 31 to a state of lying completely on the base 31, the restoring force provided by the second right spring 851a can alleviate an impact generated when the second arm 912a lies on the base 31. That is, the second right spring 851a may serve as a damper when the second arm 912a lies on the base 31. The second right spring 851a serves as the damper, and thus the load of the motor assembly 810 can be reduced.

A structure formed by the second left spring 851b, the left locking jaw 852b, the left slider 860b, the left guides 850c and 850d, and the second arm 912a may be symmetrical to the above-described structure formed by the second right spring 851a, the right locking jaw 852a, the right slider 860a, the right guides 850a and 850b, and the second arm 912a. In this instance, a symmetry axis may be the symmetry axis ys of the motor assembly 810.

Referring to FIGS. 55 to 57, the second arm 912a may receive the restoring force from the first right spring 841a and the second right spring 851a and may stand up.

An angle formed by the second arm 912a and the base 31 may be denoted by OS. An angle formed by the right rod 870a and the base 31 may be denoted by OT. A force required for the motor assembly 810 to move the right slider 860a in the +x-axis direction may be denoted by FA. A force that the first right spring 841a applies to the right slider 860a may be denoted by FB. A force that the second right spring 851a applies to the right slider 860a may be denoted by FC. A force that the right rod 870a transfers to the second arm 912a may be denoted by FT.

When the second arm 912a lies completely on the base 31, the angles θS and θT may have a minimum value. When the second arm 912a changes from a state of lying completely on the base 31 to a state of standing up with respect to the base 31, the angles θS and θT may gradually increase.

When the second arm 912a lies completely on the base 31, the first right spring 841a may be compressed. The compressed first right spring 841a may provide a restoring force FB to the right slider 860a. The restoring force FB may act in the +x-axis direction. When the second arm 912a lies completely on the base 31, a compression displacement amount of the first right spring 841a may have a maximum value, and a magnitude of the restoring force FB may have a maximum value. When the second arm 912a changes from a state of lying completely on the base 31 to a state of standing up with respect to the base 31, the compression displacement amount of the first right spring 841a may gradually decrease, and the magnitude of the restoring force FB may gradually decrease.

When the second arm 912a lies completely on the base 31, the second right spring 851a may be compressed. The compressed second right spring 851a may provide a restoring force FC to the right slider 860a. The restoring force FC may act in the +x-axis direction. When the second arm 912a lies completely on the base 31, a compression displacement amount of the second right spring 851a may have a maximum value, and a magnitude of the restoring force FC may have a maximum value. When the second arm 912a changes from a state of lying completely on the base 31 to a state of standing up with respect to the base 31, the compression displacement amount of the second right spring 851a may gradually decrease, and the magnitude of the restoring force FC may gradually decrease.

The force FT that the right rod 870a transfers to the second arm 912a may be a sum of the force FA required for the motor assembly 810 to move the right slider 860a in the +x-axis direction, the restoring force FB of the first right spring 841a, and the restoring force FC of the second right spring 851a.

When the second arm 912a starts to stand up with respect to the base 31 in the state of lying completely on the base 31, the load of the motor assembly 810 may be a maximum load. In this instance, the restoring force FB provided by the first right spring 841a may have a maximum magnitude, and the restoring force FC provided by the second springs 851a and 851b may have a maximum magnitude.

When the second arm 912a changes from the state of lying completely on the base 31 to the state of standing up with respect to the base 31, the restoring forces provided by the first right spring 841a and the second right spring 851a may assist the second arm 912a to stand up. The first right spring 841a and the second right spring 851a assist the second arm 912a to stand up, and thus the load of the motor assembly 810 can be reduced.

The first right spring 841a and the second right spring 851a may simultaneously provide a restoring force (a sum of the restoring force FB and the restoring force FC) to the right slider 860a. The restoring force (a sum of the restoring force FB and the restoring force FC) may be provided to the right slider 860a until a distance RD5 between the right slider 860a and the right locking jaw 852a is equal to a length of the second right spring 851a.

When the distance RD5 between the right slider 860a and the right locking jaw 852a is equal to the length of the second right spring 851a, the compression displacement amount of the second right spring 851a may be zero. When the compression displacement amount of the second right spring 851a is zero, the restoring force FC that the second right spring 851a provides to the right slider 860a may be zero.

When the distance RD5 between the right slider 860a and the right locking jaw 852a is greater than the length of the second right spring 851a, only the first right spring 841a may provide the restoring force FB to the right slider 860a. The restoring force FB may be provided to the right slider 860a until a distance RD6 between the right slider 860a and the second right bearing 830b is equal to a length of the first right spring 841a.

When the distance RD6 between the right slider 860a and the second right bearing 830b is equal to the length of the first right spring 841a, the compression displacement amount of the first right spring 841a may be zero. When the compression displacement amount of the first right spring 841*a* is zero, the restoring force FB that the first right spring 841*a* provides to the right slider 860*a* may be zero.

When the distance RD6 between the right slider 860*a* and the second right bearing 830*b* is greater than the length of the first right spring 841*a*, the motor assembly 810 does not receive the restoring force from the first right spring 841*a* or the second right spring 851*a* and can stand up the second arm 912*a*.

A structure formed by the first left spring 841*b*, the second left spring 851*b*, the left locking jaw 852*b*, the left slider 860*b*, the left guides 850*c* and 850*d*, the left lead screw 840*b*, the left rod 870*b*, and the second arm 912*a* may be symmetrical to the above-described structure formed by the first right spring 841*a*, the second right spring 851*a*, the right locking jaw 852*a*, the right slider 860*a*, the right guides 850*a* and 850*b*, the right lead screw 840*a*, the right rod 870*a*, and the second arm 912*a*. In this instance, a symmetry axis may be the symmetry axis ys of the motor assembly 810.

Referring to FIG. 58, a lock magnet 930 may be disposed between the link brackets 951*a* and 951*b* and the link mounts 920*a* and 920*b*. The link brackets 951*a* and 951*b* and the link mounts 920*a* and 920*b* may be attached to or separated from each other by a magnetic force of the lock magnet 930.

The lock magnet 930 may include a first lock magnet 930*a* and a second lock magnet 930*b*. The first lock magnet 930*a* may be connected to the link brackets 951*a* and 951*b*. The first lock magnet 930*a* may include a right first lock magnet 931*a* disposed on the right side of the motor assembly 810 and a left first lock magnet 931*b* disposed on the left side of the motor assembly 810. The right first lock magnet 931*a* may be mounted on the lower right side of the right link brackets 951*a* and 951*b*. The left first lock magnet 931*b* may be mounted on the lower left side of the left link brackets 951*a* and 951*b*.

The first lock magnet 930*a* may include a magnetic material.

The second lock magnet 930*b* may be connected to the link mounts 920*a* and 920*b*. The second lock magnet 930*b* may be connected to the link mounts 920*a* and 920*b* to be disposed at a position corresponding to the first lock magnet 930*a*.

The second lock magnet 930*b* may include a right second lock magnet 932*a* disposed on the right side of the motor assembly 810 and a left second lock magnet 932*b* disposed on the left side of the motor assembly 810. The right second lock magnet 932*a* may be mounted on the right link mount 920*a*. The left second lock magnet 932*b* may be mounted on the left link mount 920*b*.

The second lock magnet 930*b* may include an electromagnet. A lock processor (not shown) may control the second lock magnet 930*b*. The lock processor (not shown) may be electrically connected to the second lock magnet 930*b*. The lock processor (not shown) may receive a control signal from a driving circuit capable of driving the display device and control an operation of the second lock magnet 930*b*. The second lock magnet 930*b* may or may not generate magnetism under the control of the lock processor (not shown). This is described in detail later.

The link mounts 920*a* and 920*b* may form an accommodation space A. The accommodation space A may accommodate the lock processor (not shown). The accommodation space A may be referred to as an inner space A.

The second lock magnet 930*b* may be positioned on the link mounts 920*a* and 920*b*, and the lock processor (not shown) may be accommodated in the accommodation space A of the link mounts 920*a* and 920*b*.

The second lock magnet 930*b* and the first lock magnet 930*a* are disposed on the same line of the vertical direction so that an upper surface of the second lock magnet 930*b* is in contact with a lower surface of the first lock magnet 930*a*. The first lock magnet 930*a* and the second lock magnet 930*b* may be positioned perpendicular to the base 31.

Referring to FIGS. 59 to 61, the right link 910*a* may receive a repulsive force between the right first lock magnet 931*a* and the right second lock magnet 932*a* to stand up. A description focusing on the right link 910*a* is given.

An angle between the second arm 912*a* and the base 31 may be denoted by an angle θS. A force transmitted by the right rod 870*a* to the second arm 912*a* may be denoted by FT. A force transmitted by the right first lock magnet 931*a* and the right second lock magnet 932*a* to the right link bracket 951*a* may be denoted by FP.

Referring to FIG. 59, when the second arm 912*a* is lying completely on the base 31, the angle θS may have a minimum value. The right first lock magnet 931*a* and the right second lock magnet 932*a* may maintain contact with each other.

The right second lock magnet 932*a* may be in a non-magnetic state under the control of the lock processor (not shown). The right first lock magnet 931*a* and the right second lock magnet 932*a* may maintain contact with each other due to the magnetism of the right first lock magnet 931*a*.

Referring to FIG. 60, when the second arm 912*a* changes from a state of lying completely on the base 31 to a state of standing up with respect to the base 31, the angle θS may gradually increase.

The right second lock magnet 932*a* may be converted into a magnetic state under the control of the lock processor (not shown). The lock processor (not shown) controls so that the same magnetism or polarity as the right first lock magnet 931*a* is generated in the right second lock magnet 932*a*, and thus can generate the repulsive force FP that allows the right first lock magnet 931*a* and the right second lock magnet 932*a* to move away from each other. The right first lock magnet 931*a* and the right second lock magnet 932*a* may transmit the repulsive force FP to the right link bracket 951*a*. The repulsive force FP may act in the +y-axis direction.

The motor assembly 810 may operate so that the second arm 912*a* changes from a state of lying completely on the base 31 to a state of standing up with respect to the base 31. In this instance, a large load may be generated in the initially driven motor assembly 810. When the right first lock magnet 931*a* and the right second lock magnet 932*a* are in contact with each other, the repulsive force FP is applied to the right first lock magnet 931*a* and the right second lock magnet 932*a* during a period to be separated, thereby assisting the second arm 912*a* to stand up and reducing the load of the motor assembly 810.

The lock processor (not shown) may sense current supplied to the right second lock magnet 932*a* and change the magnetism or polarity of the right second lock magnet 932*a* based on the sensed current. For example, the lock processor (not shown) may control so that the same magnetism or polarity as the right first lock magnet 931*a* is generated in the right second lock magnet 932*a*, and then control so that a different polarity from the right first lock magnet 931*a* is generated in the right second lock magnet 932*a* based on the sensed current. The lock processor (not shown) can prevent the right first lock magnet 931*a* and the right second lock magnet 932*a* from being rapidly separated from each other by controlling so that a different magnetism or polarity from the right first lock magnet 931a is generated in the right second lock magnet 932a.

That is, the lock processor (not shown) can prevent the right link mount 920a and the right link bracket 951a from being rapidly separated from each other all at once by generating an attractive force for a short time between the right first lock magnet 931a and the right second lock magnet 932a to be separated. Hence, the second arm 912a may gradually stand up in a natural motion.

Referring to FIG. 61, when the standing of the second arm 912a with respect to the base 31 proceeds, the right first lock magnet 931a and the right second lock magnet 932a may be separated from each other. That is, the right link mount 920a and the right link bracket 951a may be separated from each other.

Afterwards, the second arm 912a may continue to stand up by the motor assembly 810.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, the load on the motor assembly 810 may excessively increase to stand up the second arms 912a and 912b. In this instance, the repulsive force FP is generated between the right first lock magnet 931a and the right second lock magnet 932a, and thus can assist the second arm 912a to stand up. As a result, the load of the motor assembly 810 can be reduced.

Alternatively, when the second arm 912a changes from a state of standing up with respect to the base 31 to a state of lying completely on the base 31, the repulsive force FP generated between the right first lock magnet 931a and the right second lock magnet 932a can alleviate an impact generated when the link 910a lies on the base 31. That is, the repulsive force FP may serve as a damper when the link 910a lies on the base 31. The right first lock magnet 931a and the right second lock magnet 932a serve as the damper, and thus the load of the motor assembly 810 can be reduced.

A structure formed by the left first lock magnet 931b, the left second lock magnet 932b, the left link bracket 951b, the left link mount 920b, and the left rod 870b may be symmetrical to the above-described structure formed by the right first lock magnet 931a, the right second lock magnet 932a, the right link bracket 951a, the right link mount 920a, and the right rod 870a. In this instance, a symmetry axis may be the symmetry axis of the motor assembly 810.

Referring to FIGS. 62 to 65, the operation of the first lock magnet 930a and the second lock magnet 930b may include a roll-up operation or a roll-down operation.

When the display device 100 is turned off, the lock processor (not shown) may block the current supplied to the second lock magnet 930b. That is, the right second lock magnet 932a may be in a non-magnetic state under the control of the lock processor (not shown). The right first lock magnet 931a and the right second lock magnet 932a may maintain contact with each other due to the magnetism of the right first lock magnet 931a.

That is, in the display device 100 according to the present disclosure, the attractive force between the first lock magnet 930a and the second lock magnet 930b by the magnetic force of the first lock magnet 930a can prevent the display panel 10 from being rolled up.

Referring to FIGS. 62 and 63, when the display device 100 is turned on, the second lock magnet 930b may operate.

When the second arm 912a changes from a state of lying completely on the base 31 to a state of standing up with respect to the base 31, the lock processor (not shown) may control a polarity of the right second lock magnet 932a so that the same polarity as the right first lock magnet 931a is generated. Hence, the repulsive force is generated between the right first lock magnet 931a and the right second lock magnet 932a, and thus the right first lock magnet 931a and the right second lock magnet 932a that have been in contact with each other can be separated from each other.

Referring to FIG. 63, when the standing of the second arm 912a with respect to the base 31 proceeds, the lock processor (not shown) may control the polarity of the right second lock magnet 932a so that a polarity opposite to the right first lock magnet 931a is generated.

Hence, the attractive force is generated between the right first lock magnet 931a and the right second lock magnet 932a, and thus the right first lock magnet 931a and the right second lock magnet 932a that have been separated from each other can instantly attract each other. As a result, the right first lock magnet 931a and the right second lock magnet 932a can be prevented from being rapidly separated from each other.

As described above, the lock processor (not shown) can gradually separate the right first lock magnet 931a from the right second lock magnet 932a from the contact state at a predetermined interval, by controlling so that the same polarity or the opposite polarity of the right first lock magnet 931a is generated in the right second lock magnet 932a.

As described above, the present disclosure can generate an induced current at the moment at which the right first lock magnet 931a and the right second lock magnet 932a are separated from each other, by controlling the polarity of the right second lock magnet 932a that is an electromagnet and applying a step current to the right second lock magnet 932a. The present disclosure can prevent the display panel 10 from being rolled up by changing the polarity of the right second lock magnet 932a at the moment at which the current (of the right first lock magnet 931a and the right second lock magnet 932a) decreases while sensing the current flowing in the right second lock magnet 932a.

Referring to FIG. 64, when the state of the second arm 912a proceeds from a state of standing up with respect to the base 31 to a state of lying on the base 31, the lock processor (not shown) may control a polarity of the right second lock magnet 932a so that the same polarity as the right first lock magnet 931a is generated.

Hence, the repulsive force can be generated between the right first lock magnet 931a and the right second lock magnet 932a, and thus the right first lock magnet 931a and the right second lock magnet 932a that have attracted each other can instantly repel each other. As a result, the right first lock magnet 931a and the right second lock magnet 932a can be prevented from colliding with each other.

Referring to FIG. 65, when the second arm 912a is in a state of lying completely on the base 31, the lock processor (not shown) may control the polarity of the right second lock magnet 932a so that a polarity opposite to the right first lock magnet 931a is generated. Hence, the attractive force can be generated between the right first lock magnet 931a and the right second lock magnet 932a, and the right first lock magnet 931a and the right second lock magnet 932a can contact each other.

As described above, the lock processor (not shown) can gradually bring the right first lock magnet 931a into contact with the right second lock magnet 932a from the separated state at a predetermined interval, by controlling so that the same polarity or the opposite polarity of the right first lock magnet 931a is generated in the right second lock magnet 932a.

As described above, the present disclosure can generate an induced current at the moment at which the right first lock magnet 931a and the right second lock magnet 932a approach each other, by controlling the polarity of the right second lock magnet 932a that is an electromagnet and applying the current to the right second lock magnet 932a. The present disclosure can prevent the right first lock magnet 931a and the right second lock magnet 932a from contacting each other at a time by reducing the current applied to the right second lock magnet 932a at the moment at which the current increases while sensing the current flowing in the right second lock magnet 932a.

Referring to FIGS. 66 to 68, the panel roller 143 may be installed on the base 31. The panel roller 143 may be installed in front of the lead screws 840a and 840b. Alternatively, the panel roller 143 may be disposed parallel to the longitudinal direction of the lead screws 840a and 840b. Alternatively, the panel roller 143 may be spaced apart from the lead screws 840a and 840b.

The display unit 20 may include the display panel 10 and the module cover 15. The lower side of the display unit 20 may be connected to the panel roller 143, and the upper side of the display unit 20 may be connected to the upper bar 75. The display unit 20 may be rolled or unrolled from the panel roller 143.

A distance from the symmetry axis ys of the motor assembly 810 to the right slider 860a may be denoted by RD. A distance from the symmetry axis ys of the motor assembly 810 to the left slider 860b may be denoted by LD. A distance between the right slider 860a and the left slider 860b may be denoted by SD. The distance SD may be a sum of the distance RD and the distance LD. A distance from the base 31 to the upper end of the display unit 20 may be denoted by HD.

Referring to FIG. 66, when the second arms 912a and 912b lie completely on the base 31, the distance SD between the right slider 860a and the left slider 860b may have a minimum value. The distance RD from the symmetry axis ys of the motor assembly 810 to the right slider 860a and the distance LD from the symmetry axis ys of the motor assembly 810 to the left slider 860b may be equal to each other.

When the second arms 912a and 912b lie completely on the base 31, the distance HD from the base 31 to the upper end of the display unit 20 may have a minimum value.

When the second arms 912a and 912b lie completely on the base 31, the first springs 841a and 841b may contact the sliders 860a and 860b. Further, the second springs 851a and 851b may contact the sliders 860a and 860b. The first lock magnet 930a mounted on the link brackets 951a and 951b and the second lock magnet 930b mounted on the link mounts 920a and 920b may contact each other.

When the second arms 912a and 912b lie completely on the base 31, an amount of compression of the first springs 841a and 841b may have a maximum value, and a magnitude of a restoring force that the first springs 841a and 841b provide to the sliders 860a and 860b may have a maximum value.

When the second arms 912a and 912b lie completely on the base 31, an amount of compression of the second springs 851a and 851b may have a maximum value, and a magnitude of a restoring force that the second springs 851a and 851b provide to the sliders 860a and 860b may have a maximum value.

When the second arms 912a and 912b start to stand up with respect to the base 31, the second arms 912a and 912b may receive the restoring force from the first springs 841a and 841b, the second springs 851a and 851b, and the repulsive force generated between the first lock magnet 930a and the second lock magnet 930b to stand up. Hence, the load on the motor assembly 810 can be reduced.

Referring to FIG. 67, as the standing up of the second arms 912a and 912b with respect to the base 31 is performed, the distance SD between the right slider 860a and the left slider 860b may gradually increase. Even if the distance SD increases, the distance RD and the distance LD may be equal to each other. That is, the right slider 860a and the left slider 860b may be positioned to be symmetrical to each other with respect to the symmetry axis ys of the motor assembly 810. Further, a degree to which the second arms 912a and 912b of the right link 910a stand up with respect to the base 31 and a degree to which the second arms 912a and 912b of the left link 910b stand up with respect to the base 31 may be the same as each other.

As the standing up of the second arms 912a and 912b with respect to the base 31 is performed, the distance HD from the base 31 to the upper end of the display unit 20 may gradually increase. The display unit 20 may be unrolled from the panel roller 143. Alternatively, the display unit 20 may be deployed from the panel roller 143.

When the second arms 912a and 912b sufficiently stand up with respect to the base 31, the first springs 841a and 841b may be separated from the sliders 860a and 860b. Further, when the second arms 912a and 912b sufficiently stand up with respect to the base 31, the second springs 851a and 851b may be separated from the sliders 860a and 860b. Further, when the second arms 912a and 912b sufficiently stand up with respect to the base 31, the first lock magnet 930a and the second lock magnet 930b may be separated from each other.

The separation of the first springs 841a and 841b from the sliders 860a and 860b, the separation of the second springs 851a and 851b from the sliders 860a and 860b, and the separation of the first lock magnet 930a and the second lock magnet 930b may be performed independently of each other. That is, the order of the separation of the first springs 841a and 841b from the sliders 860a and 860b, the separation of the second springs 851a and 851b from the sliders 860a and 860b, and the separation of the first lock magnet 930a and the second lock magnet 930b may be mutually variable.

An angle formed by an axis xs1 parallel to the base 31 and the second arm 912a may be denoted by θR. An angle formed by the axis xs1 parallel to the base 31 and the first arm 911a may be denoted by θR'. The axis xs1 may be parallel to the x-axis.

When the second arm 912a lies completely on the base 31, or while the second arm 912a stands up with respect to the base 31, or when the standing up of the second arm 912a with respect to the base 31 is completed, the angle θR and the angle θR' may be maintained to be the same.

An angle formed by an axis xs2 parallel to the base 31 and the second arm 912b may be denoted by θL. An angle formed by the axis xs2 parallel to the base 31 and the first arm 911b may be denoted by θL'. The axis xs2 may be parallel to the x-axis.

When the second arm 912b lies completely on the base 31, or while the second arm 912b stands up with respect to the base 31, or when the standing up of the second arm 912b with respect to the base 31 is completed, the angle θL and the angle θL' may be maintained to be the same.

The axis xs1 and the axis xs2 may be the same axis.

Referring to FIG. 68, when the second arms 912a and 912b completely stand up with respect to the base 31, the distance SD between the right slider 860a and the left slider 860b may have a maximum value. Even if the distance SD has the maximum value, the distance RD and the distance LD may be equal to each other.

When the second arms 912a and 912b completely stand up with respect to the base 31, the distance HD from the base 31 to the upper end of the display unit 20 may have a maximum value.

With reference to FIG. 69, the structure of the display device in which the display unit is rolled up from the inside of the housing is described.

First, the display device may be powered on, in S10.

When the power to the display device is turned on, the driving circuit may provide a control signal to the lock processor. The lock processor may receive the control signal to control the magnetism of the second lock magnet. The second lock magnet may generate the same polarity as the first lock magnet under the control of the lock processor. Accordingly, an attractive force may be generated between the first lock magnet and the second lock magnet, in S20.

Thereafter, the driving circuit may check a position of an upper bar using a zero sensor, in S30. The driving circuit may check whether the upper bar is positioned at a rollable zero point using the zero sensor.

When the upper bar is out of an error range of the rollable zero point, the driving circuit may adjust the upper bar to be positioned within the error range of the rollable zero point, in S40.

When the upper bar is within the error range of the rollable zero point, the lock processor may apply a step current to the second lock magnet, in S50.

When the step current is applied to the second lock magnet, the second lock magnet may have magnetism under the control of the lock processor. Since the second lock magnet has the same polarity as the first lock magnet, a repulsive force may be generated between the first lock magnet and the second lock magnet, in S60.

At the moment at which the first lock magnet and the second lock magnet repel each other by the repulsive force, the second lock magnet may be converted to a polarity opposite to the first lock magnet to generate the attractive force, in S70. The second lock magnet is switched from the same polarity as that of the first lock magnet to the opposite polarity to that of the first lock magnet under the control of the lock processor and thus can prevent excessive movement thereof.

When the display panel operates normally, the lock processor may turn off the magnetism of the second lock magnet by blocking the current applied to the second lock magnet, in 80.

When the display panel completely stands up, the display device may display the display panel, in S90.

Embodiments of the present disclosure described above are not mutually exclusive or distinct from each other. Configurations or functions of embodiments of the present disclosure described above may be used together or combined with each other.

The drawings of the present disclosure described and illustrated the structure of the display device in which the display unit is rolled up from the inside of the housing, but are not limited thereto. The drawings of the present disclosure can be applied to a structure of the display device in which the display unit is rolled down from the inside of the housing.

The above detailed description is merely an example and is not to be considered as limiting the present disclosure. The scope of the present disclosure should be determined by rational interpretation of the appended claims, and all variations within the equivalent scope of the present disclosure are included in the scope of the present disclosure.

The invention claimed is:

1. A display device comprising:
  a housing;
  a roller disposed inside the housing;
  a display unit rolled around the roller;
  a link comprising a first arm and a second arm, wherein the first arm is rotatably mounted on the display unit, and the second arm is rotatably connected to the first arm and is rotatably mounted on the housing;
  a lead screw disposed inside the housing;
  a slider configured to move on the lead screw based on a rotation of the lead screw;
  a rod comprising one side connected to the slider and another side connected to the second arm;
  an upper bar coupled to an upper side of the display unit;
  a first lock magnet positioned at a lower side of the upper bar;
  a second lock magnet corresponding to the first lock magnet and positioned at an upper side of a bottom surface of the housing,
  wherein the first lock magnet is a permanent magnet, and the second lock magnet is an electromagnet having a polarity that is controllable based on sensing a current flowing in the second lock magnet,
  wherein a repulsive force generated between the first lock magnet and the second lock magnet is transmitted to the second arm, and
  wherein, when a standing of the second arm with respect to the housing proceeds, the polarity of the second lock magnet is controlled to be same as a polarity of the first lock magnet, and, upon the current being sensed as flowing in the second lock magnet, and the polarity of the second lock magnet is controlled to be opposite to the polarity of the first lock magnet at the moment the current flowing in the second lock magnet is sensed to have decreased.

2. The display device of claim 1, wherein the lead screw comprises:
  a first lead screw; and
  a second lead screw spaced apart from the first lead screw in a longitudinal direction of the first lead screw,
  wherein the display device further comprises a motor assembly disposed between the first lead screw and the second lead screw and configured to drive the first lead screw and the second lead screw.

3. The display device of claim 2, wherein the slider comprises:
  a first slider configured to move on the first lead screw; and
  a second slider configured to move on the second lead screw,
  wherein a pitch of the first lead screw and a pitch of the second lead screw are the same as each other.

4. The display device of claim 3, further comprising:
  a first bearing configured to support one side of the first lead screw; and
  a second bearing configured to support another side of the first lead screw.

5. The display device of claim 4, further comprising:
  a first spring disposed between a first slider and the second bearing,
  wherein the first lead screw passes through the first spring.

6. The display device of claim 4, further comprising:
a guide disposed between the first bearing and the second bearing and extending along the first lead screw,
wherein a first slider comprises:
a body through which the first lead screw passes; and
a protrusion formed in the body and comprising a hole,
wherein the guide passes through the hole of the protrusion.

7. The display device of claim 6, further comprising:
a second spring disposed between the first slider and the second bearing,
wherein a guide passes through the second spring.

8. The display device of claim 2, further comprising:
a coupling configured to connect the motor assembly to the first lead screw.

9. The display device of claim 3, wherein the rod comprises:
a first rod connected to a first slider; and
a second rod connected to a second slider,
wherein the link comprises:
a first link connected to the first rod; and
a second link connected to the second rod,
wherein the upper bar connects a first arm of the first link to a first arm of the second link.

10. The display device of claim 9, further comprising:
a source PCB disposed on the upper bar;
a timing controller board disposed inside the roller; and
an FFC cable comprising an upper end electrically connected to the source PCB and a lower end electrically connected to the timing controller board,
wherein the FFC cable is rolled around the roller.

11. The display device of claim 10, wherein the roller comprises a through hole formed in an outer circumferential surface of the roller, and
wherein the FFC cable passes through the through hole of the roller.

12. The display device of claim 11, wherein the display unit is fixed to a front surface of the upper bar, and the source PCB is fixed to a rear surface of the upper bar,
wherein the display unit comprises:
a display panel; and
a module cover disposed at a rear of the display panel,
wherein the FFC cable comprises:
a first portion disposed between the display panel and the module cover;
a second portion connected to the first portion and configured to pass through the module cover; and
a third portion connected to the second portion, disposed at a rear of the module cover, and electrically connected to the source PCB.

13. The display device of claim 12, wherein the module cover comprises a plurality of segments,
wherein one segment of the plurality of segments comprises a connection hole facing a rear surface of the display panel, and
wherein the second portion passes through the connection hole.

14. The display device of claim 1, wherein the link faces a rear surface of the display unit,
wherein the link comprises a magnet, and
wherein the display unit includes a metal material.

* * * * *